(12) United States Patent
Amano

(10) Patent No.: US 11,296,112 B2
(45) Date of Patent: Apr. 5, 2022

(54) MULTI-LAYER BARRIER FOR CMOS UNDER ARRAY TYPE MEMORY DEVICE AND METHOD OF MAKING THEREOF

(71) Applicant: SANDISK TECHNOLOGIES LLC, Addison, TX (US)

(72) Inventor: Fumitaka Amano, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 52 days.

(21) Appl. No.: 16/860,358

(22) Filed: Apr. 28, 2020

(65) Prior Publication Data
US 2020/0258909 A1  Aug. 13, 2020

Related U.S. Application Data

(62) Division of application No. 15/593,916, filed on May 12, 2017, now abandoned.

(51) Int. Cl.
*H01L 27/11582* (2017.01)
*H01L 27/11556* (2017.01)
(Continued)

(52) U.S. Cl.
CPC .. *H01L 27/11582* (2013.01); *H01L 21/26513* (2013.01); *H01L 21/76846* (2013.01);
(Continued)

(58) Field of Classification Search
CPC ......... H01L 21/76846; H01L 21/76858; H01L 21/76864; H01L 21/76895; H01L 21/823418

See application file for complete search history.

(56) References Cited

U.S. PATENT DOCUMENTS 5,576,579 A  11/1996  Agnello et al.
5,847,463 A  12/1998  Trivedi et al.
(Continued)

FOREIGN PATENT DOCUMENTS

CN  105762105      7/2016
CN  105762105 A  *  7/2016
(Continued)

OTHER PUBLICATIONS

"Source" and "drain." in Semiconductor Glossary by Jerzy Ruzyllo. Copyright 2001-2016. Accessed online Aug. 14, 2021. (Year: 2016).*
(Continued)

*Primary Examiner* — Shih Tsun A Chou
*Assistant Examiner* — Peter M Albrecht
(74) *Attorney, Agent, or Firm* — The Marbury Law Group PLLC

(57) ABSTRACT

A semiconductor structure includes a doped semiconductor material portion, a metal-semiconductor alloy portion contacting the doped semiconductor material portion, a device contact via structure in direct contact with the metal-semiconductor alloy portion, and at least one dielectric material layer laterally surrounding the device contact via structure. The device contact via structure includes a barrier stack and a conductive fill material portion. The barrier stack includes at least two metal nitride layers and at least one nitrogen-containing material layer containing nitrogen and an element selected from silicon or boron.

7 Claims, 34 Drawing Sheets

(51) Int. Cl.
*H01L 29/167* (2006.01)
*H01L 27/11573* (2017.01)
*H01L 27/11526* (2017.01)
*H01L 27/11521* (2017.01)
*H01L 27/11568* (2017.01)
*H01L 21/768* (2006.01)
*H01L 21/265* (2006.01)
*H01L 23/485* (2006.01)
*H01L 29/45* (2006.01)
*H01L 23/532* (2006.01)

(52) U.S. Cl.
CPC .. *H01L 21/76855* (2013.01); *H01L 21/76856* (2013.01); *H01L 21/76858* (2013.01); *H01L 23/485* (2013.01); *H01L 27/11521* (2013.01); *H01L 27/11526* (2013.01); *H01L 27/11556* (2013.01); *H01L 27/11568* (2013.01); *H01L 27/11573* (2013.01); *H01L 29/167* (2013.01); *H01L 29/456* (2013.01); *H01L 23/53209* (2013.01); *H01L 23/53238* (2013.01); *H01L 23/53266* (2013.01)

(56) References Cited

U.S. PATENT DOCUMENTS

| | | |
|---|---|---|
| 5,874,353 A | 2/1999 | Lin et al. |
| 5,915,167 A | 6/1999 | Leedy |
| 5,942,799 A | 8/1999 | Danek et al. |
| 5,945,350 A | 8/1999 | Violette et al. |
| 6,169,019 B1 | 1/2001 | Takagi |
| 6,229,211 B1 | 5/2001 | Kawanoue et al. |
| 6,268,299 B1 | 7/2001 | Jammy et al. |
| 9,748,174 B1 | 8/2017 | Amano |
| 10,262,945 B2 | 4/2019 | Makala et al. |
| 10,269,620 B2 | 4/2019 | Yu et al. |
| 10,355,139 B2 | 7/2019 | Sharangpani et al. |
| 10,361,213 B2 | 7/2019 | Sharangpani et al. |
| 2002/0140103 A1 | 10/2002 | Kloster et al. |
| 2003/0025206 A1 | 2/2003 | Derraa et al. |
| 2003/0190497 A1 | 10/2003 | Yang et al. |
| 2006/0006542 A1* | 1/2006 | Lee ............ H01L 21/76856 257/761 |
| 2006/0084247 A1 | 4/2006 | Liu |
| 2009/0001577 A1* | 1/2009 | Kim ............ H01L 21/76843 257/751 |
| 2015/0138862 A1 | 5/2015 | Park et al. |
| 2016/0351709 A1 | 12/2016 | Nishikawa et al. |
| 2017/0133398 A1* | 5/2017 | Son ............ G11C 16/26 |
| 2017/0236746 A1 | 8/2017 | Yu et al. |
| 2017/0373079 A1 | 12/2017 | Sharangpani et al. |
| 2018/0040476 A1 | 2/2018 | Wolf et al. |
| 2018/0151497 A1 | 5/2018 | Makala et al. |
| 2018/0245215 A1 | 8/2018 | Lei et al. |
| 2018/0331118 A1 | 11/2018 | Amano |

FOREIGN PATENT DOCUMENTS

| | | |
|---|---|---|
| EP | 0 697 729 A2 | 2/1996 |
| JP | H06-120479 | 4/1994 |
| KR | 100464651 B1 | 1/2005 |
| KR | 20090075498 A * | 7/2009 |
| KR | 100924555 B1 | 11/2009 |

OTHER PUBLICATIONS

"Interface." in the American Heritage(R) Dictionary of the English Language, edited by Editors of the American Heritage Dictionaries. 6th ed. Houghton Mifflin, 2016. Accessed online Aug. 14, 2021. (Year: 2016).*

International Search Report and Written Opinion of the International Search Authority for International Patent Application No. PCT/US2018/019177, dated May 24, 2018, 14 pages.

* cited by examiner

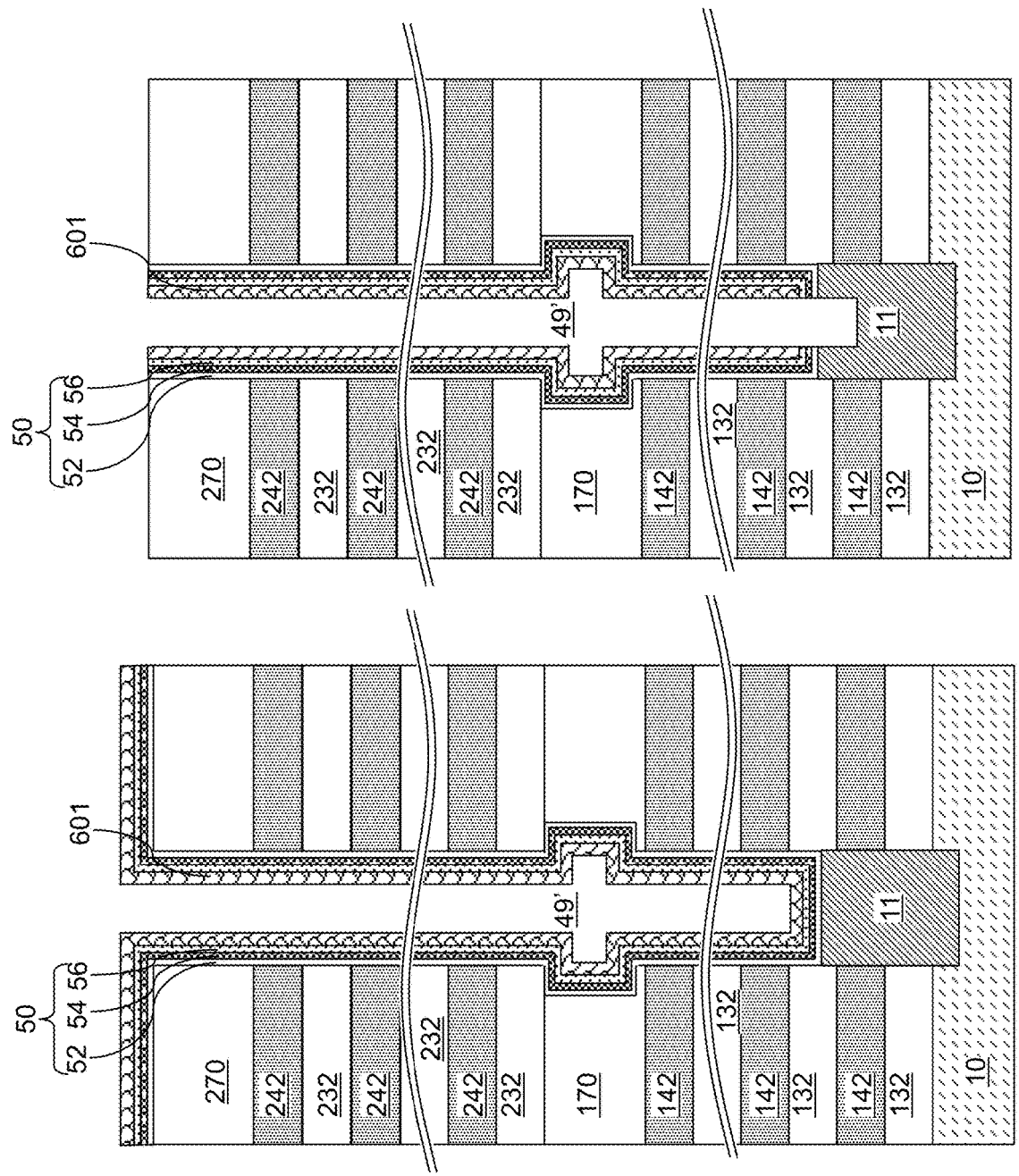

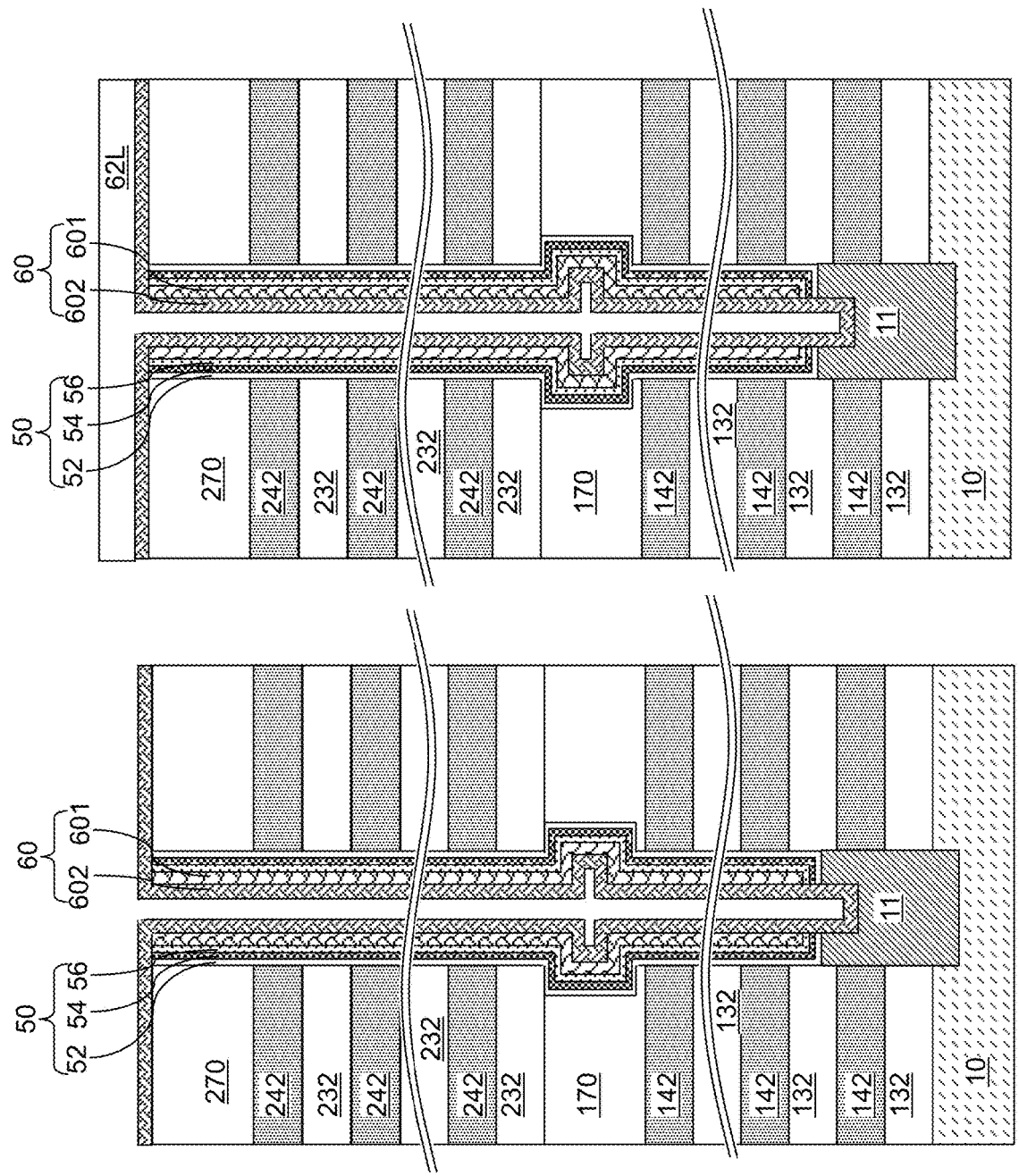

MULTI-LAYER BARRIER FOR CMOS UNDER ARRAY TYPE MEMORY DEVICE AND METHOD OF MAKING THEREOF

FIELD

The present disclosure relates generally to the field of semiconductor devices and specifically to a three-dimensional memory device containing multi-layer conductive barriers field effect transistors underneath a three-dimensional array of memory cells, and methods of making the same.

BACKGROUND

Recently, ultra high density storage devices have been proposed using a three-dimensional (3D) stacked memory stack structure sometimes referred to as Bit Cost Scalable (BiCS) architecture. For example, a 3D NAND stacked memory device can be formed from an array of an alternating stack of insulating materials and spacer material layers that are formed as electrically conductive layer or replaced with electrically conductive layers. Memory openings are formed through the alternating stack, and are filled with memory stack structures, each of which includes a vertical stack of memory elements and a vertical semiconductor channel. A memory-level assembly including the alternating stack and the memory stack structures is formed over a substrate. The electrically conductive layers can function as word lines of a 3D NAND stacked memory device, and bit lines overlying an array of memory stack structures can be connected to drain-side ends of the vertical semiconductor channels.

SUMMARY

According to an aspect of the present disclosure, a semiconductor structure includes a doped semiconductor material portion, a metal-semiconductor alloy portion contacting the doped semiconductor material portion, a device contact via structure in direct contact with the metal-semiconductor alloy portion, and at least one dielectric material layer laterally surrounding the device contact via structure. The device contact via structure includes a barrier stack and a conductive fill material portion. The barrier stack includes at least two metal nitride layers and at least one nitrogen-containing material layer containing nitrogen and an element selected from silicon or boron.

According to another aspect of the present disclosure, a method of forming a semiconductor structure comprises forming a doped semiconductor material portion, forming a metal-semiconductor alloy portion on the doped semiconductor material portion, forming a dielectric material layer over the substrate semiconductor layer, forming a via cavity through the dielectric material layer, wherein a top surface of the metal-semiconductor alloy portion is physically exposed, forming a barrier stack in the via cavity, wherein the barrier stack includes at least two metal nitride layers and at least one silicon or boron layer formed between a pair of the metal nitride layers, and depositing a conductive fill material in a remaining volume of the via cavity.

10A. The zig-zag vertical plane A-A' corresponds to the plane of the vertical cross-sectional view of FIG. 10A.

Figure 11:
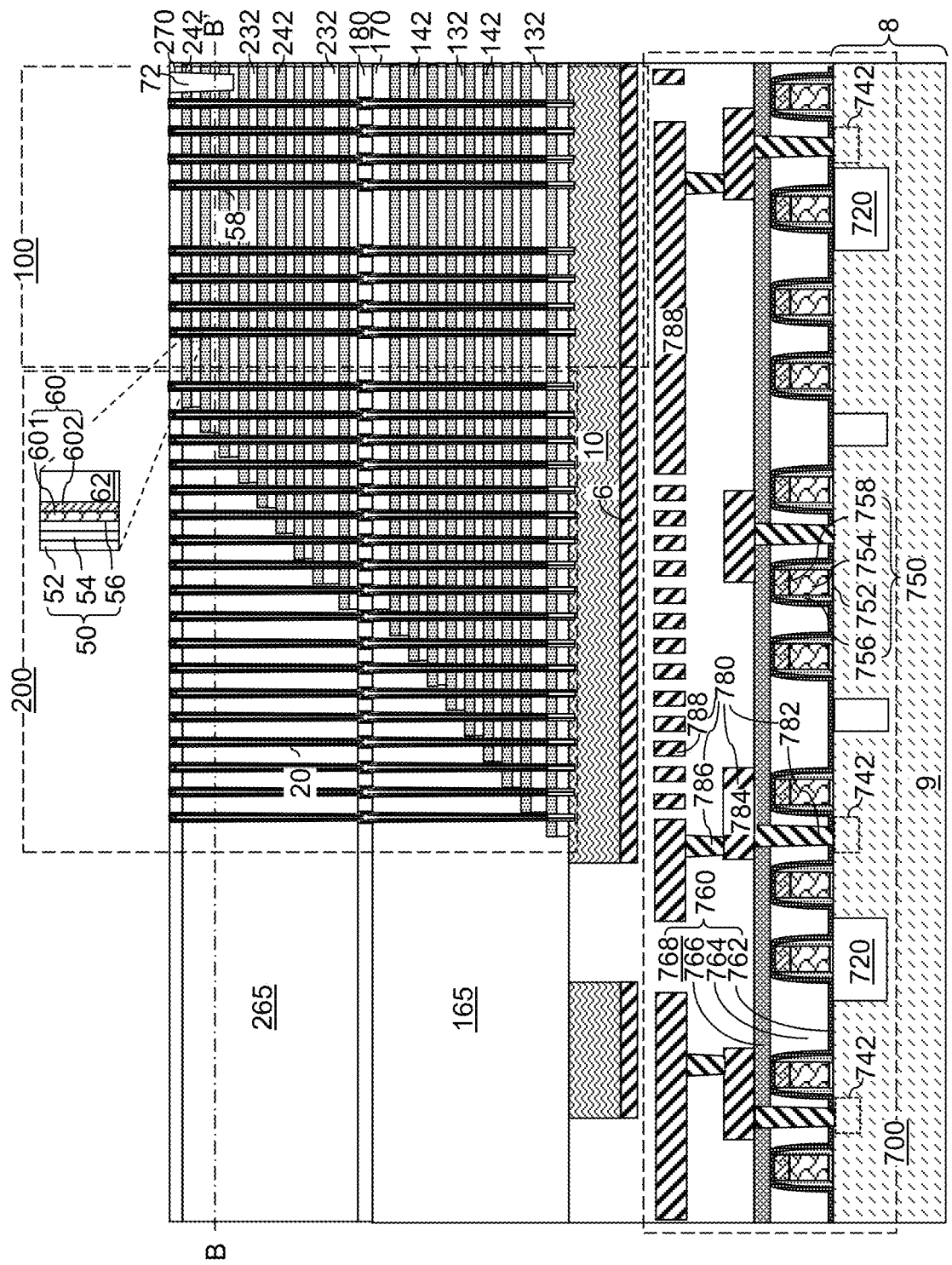

FIG. 11 is a vertical cross-sectional view of the exemplary structure after formation of memory stack structures according to an embodiment of the present disclosure.

FIGS. 12A-12H are sequential vertical cross-sectional views of an inter-tier memory opening during formation of a pillar channel portion, a memory stack structure, a dielectric core, and a drain region according to an embodiment of the present disclosure.

Figure 13A:
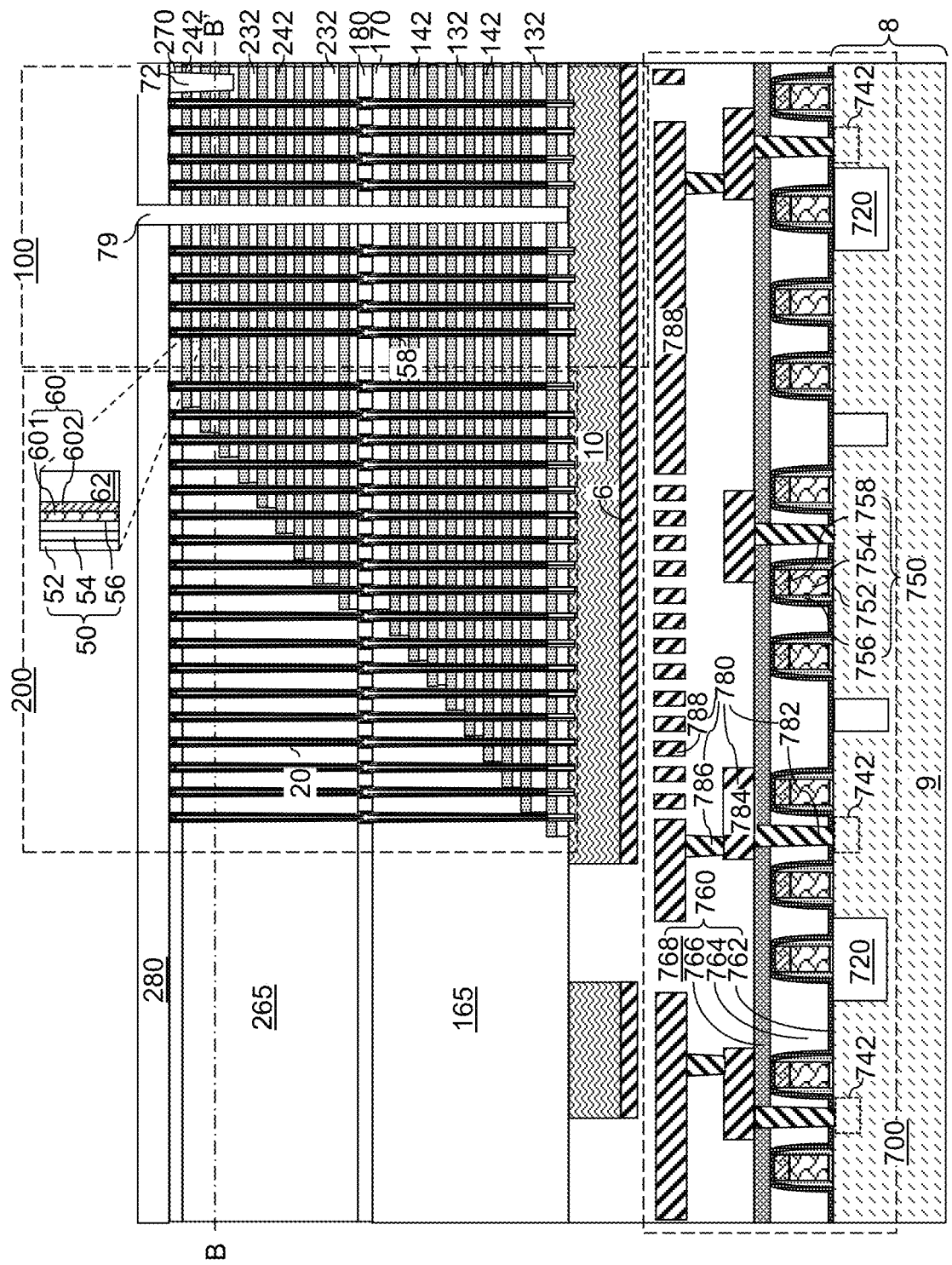

FIG. 13A is a vertical cross-sectional view of the exemplary structure after formation of a contact level dielectric layer backside contact trenches according to an embodiment of the present disclosure.

Figure 13B:
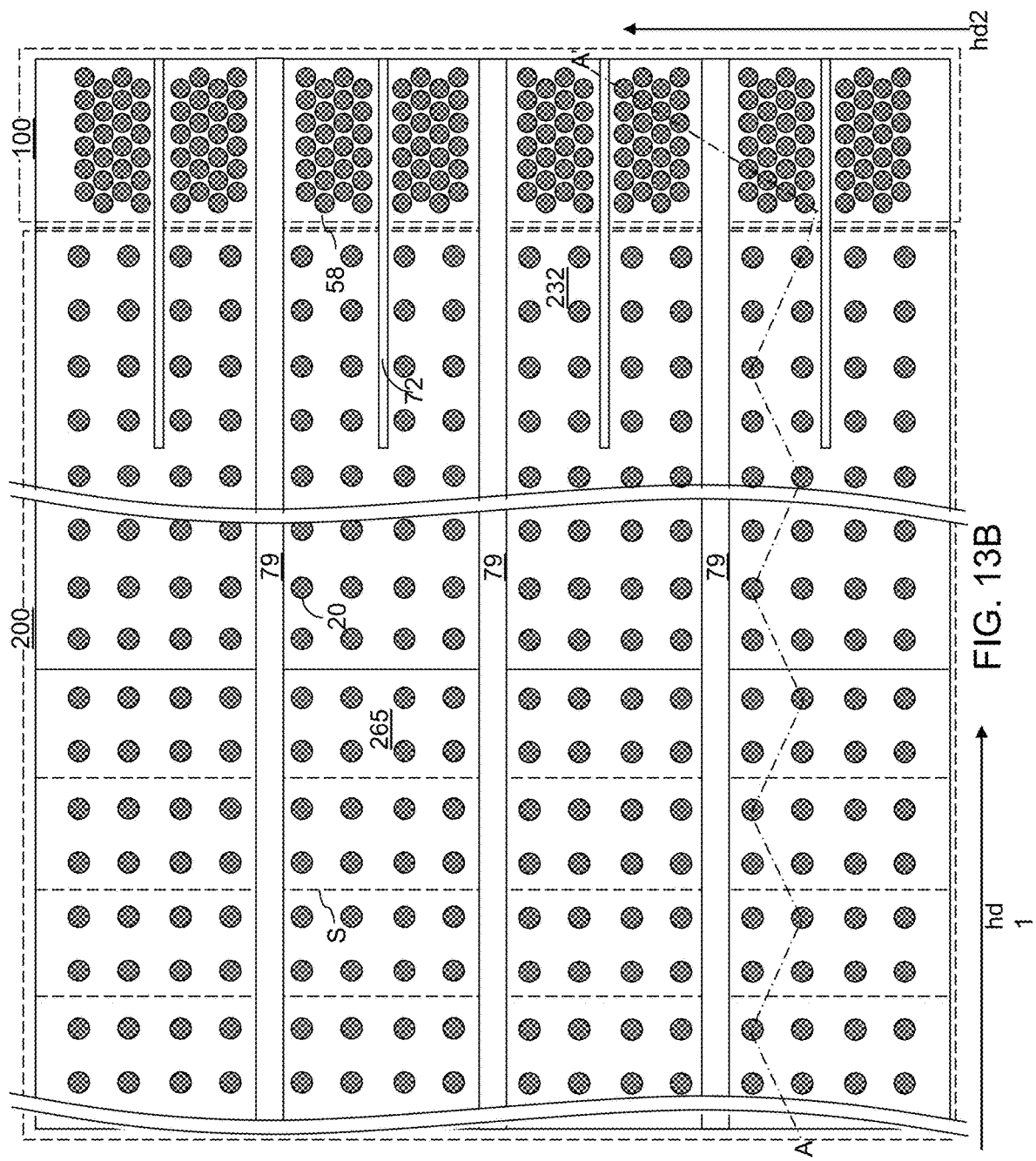

FIG. 13B is a horizontal cross-sectional view of the exemplary structure along the horizontal plane B-B' in FIG. 13A. The zig-zag vertical plane A-A' corresponds to the plane of the vertical cross-sectional view of FIG. 13A.

Figure 14:
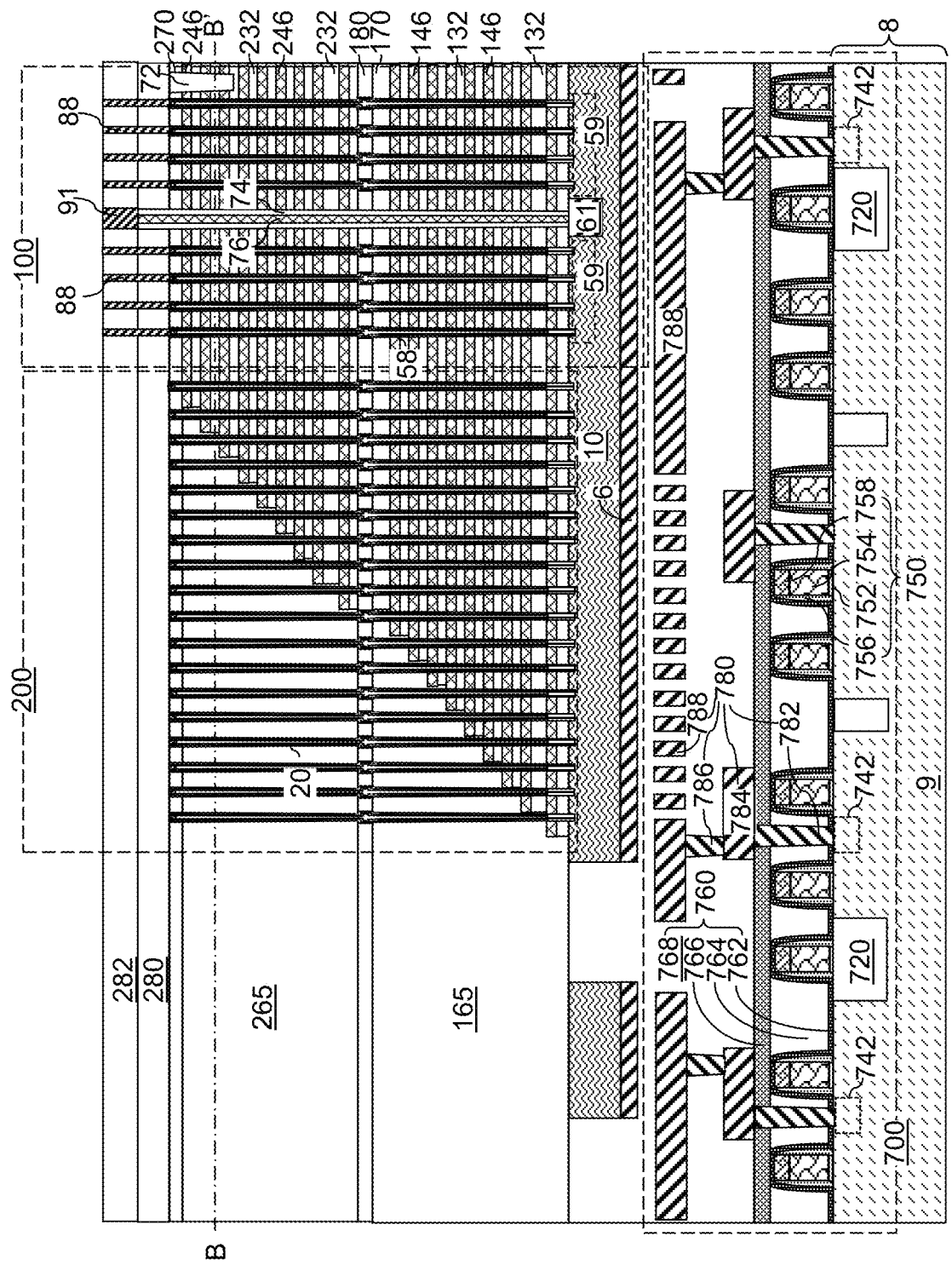

FIG. 14 is a vertical cross-sectional view of the exemplary structure after replacement of sacrificial material layers with electrically conductive layers and formation of insulating spacers, backside contact via structures, drain contact via structures, and source bias line structures according to an embodiment of the present disclosure.

Figure 15A:
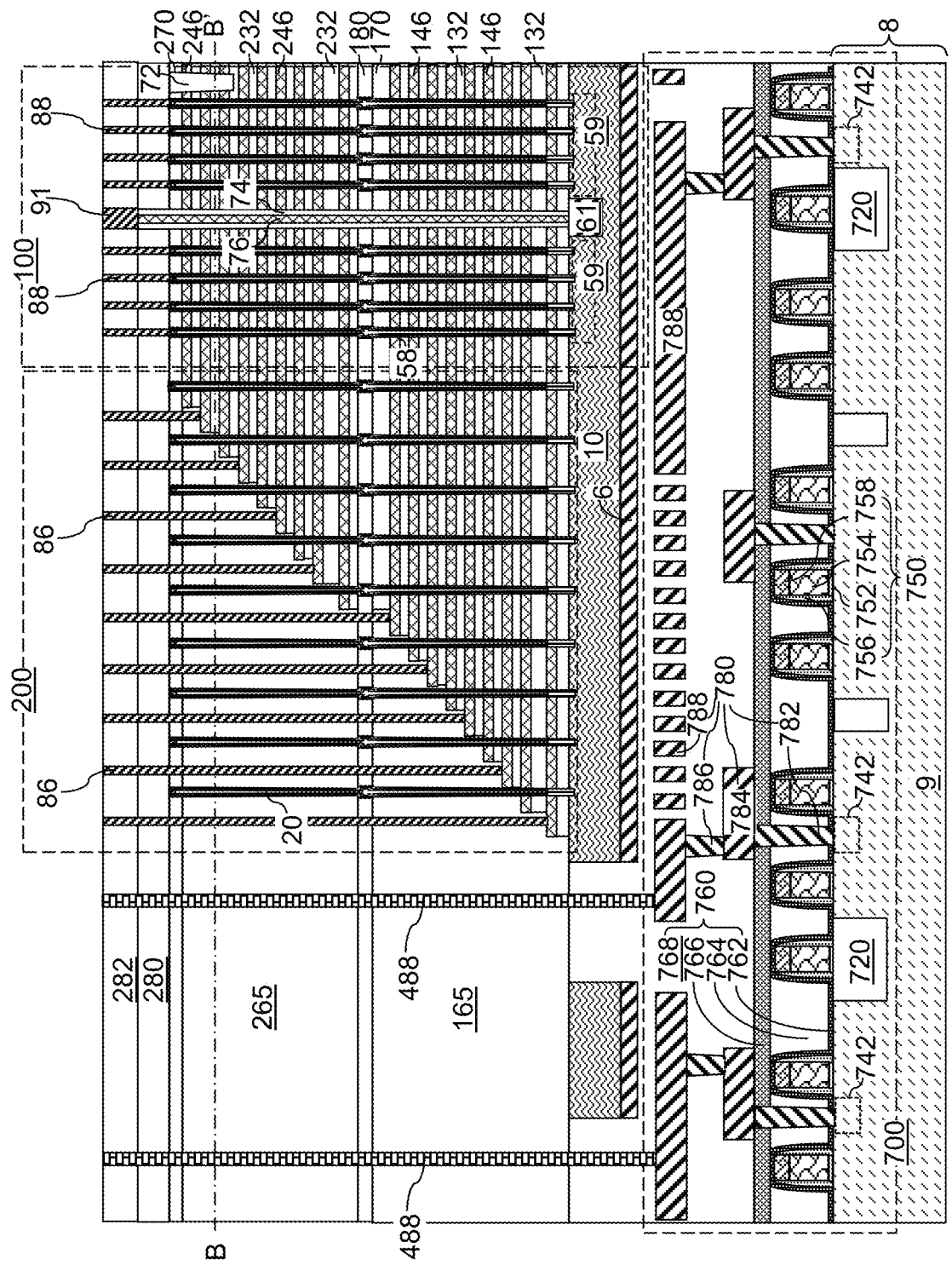

FIG. 15A is a vertical cross-sectional view of the exemplary structure after formation of through-memory-level via structures and word line contact via structures according to an embodiment of the present disclosure.

Figure 15B:
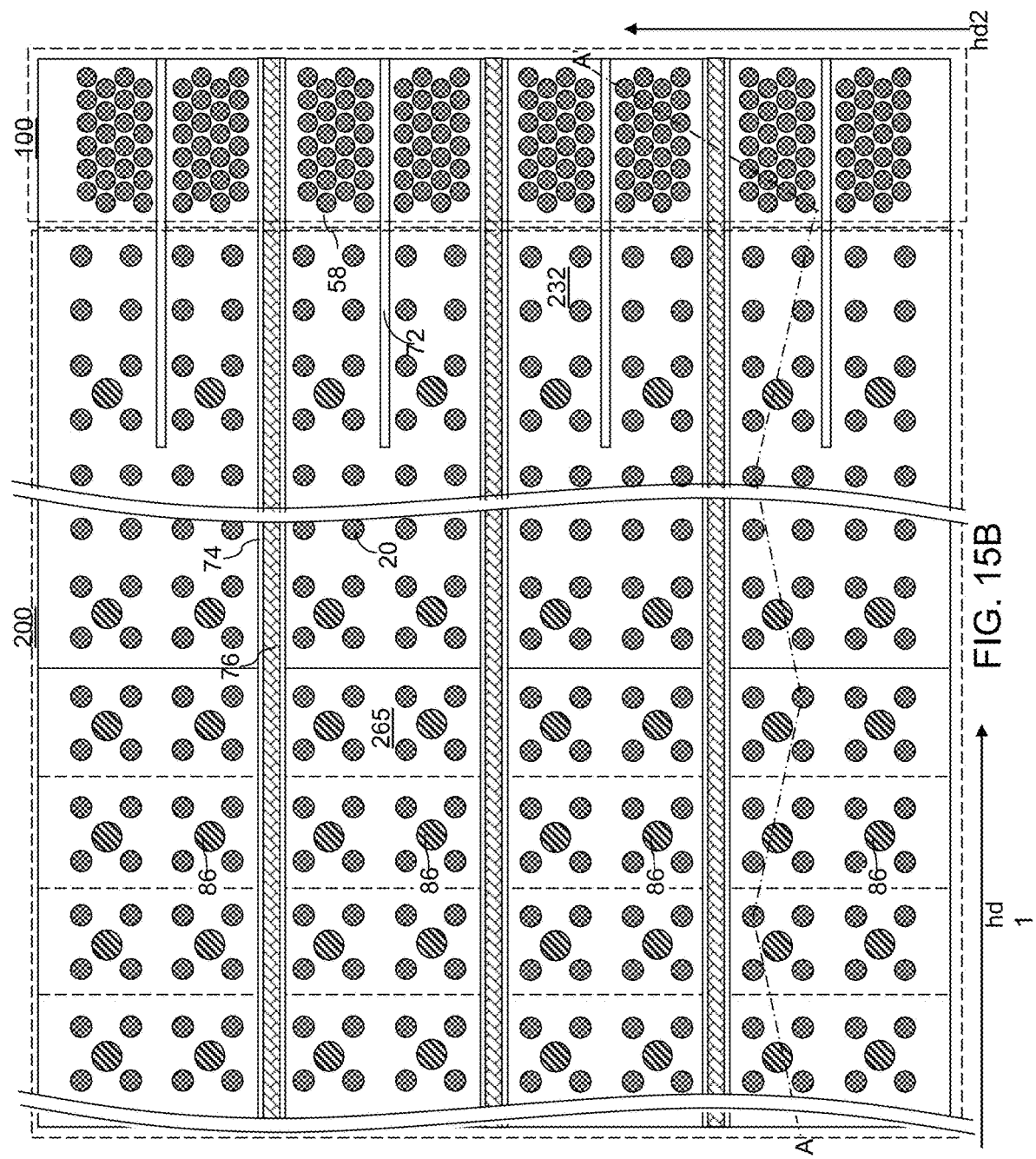

FIG. 15B is a horizontal cross-sectional view of the exemplary structure along the horizontal plane B-B' in FIG. 15A. The zig-zag vertical plane A-A' corresponds to the plane of the vertical cross-sectional view of FIG. 15A.

Figure 16:
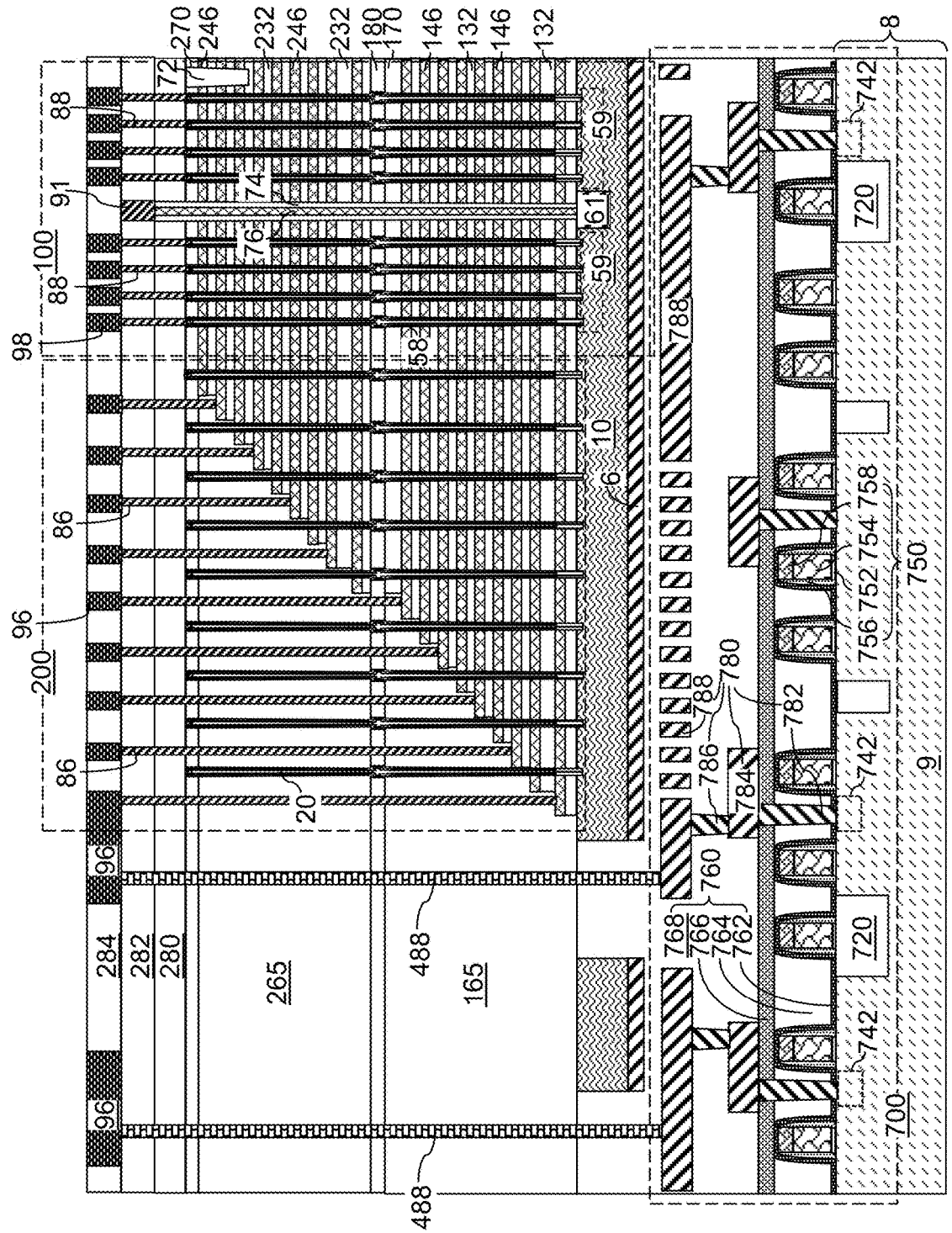

FIG. 16 is a vertical cross-sectional view of the exemplary structure after formation of upper level line structures according to an embodiment of the present disclosure.

Figure 17A:
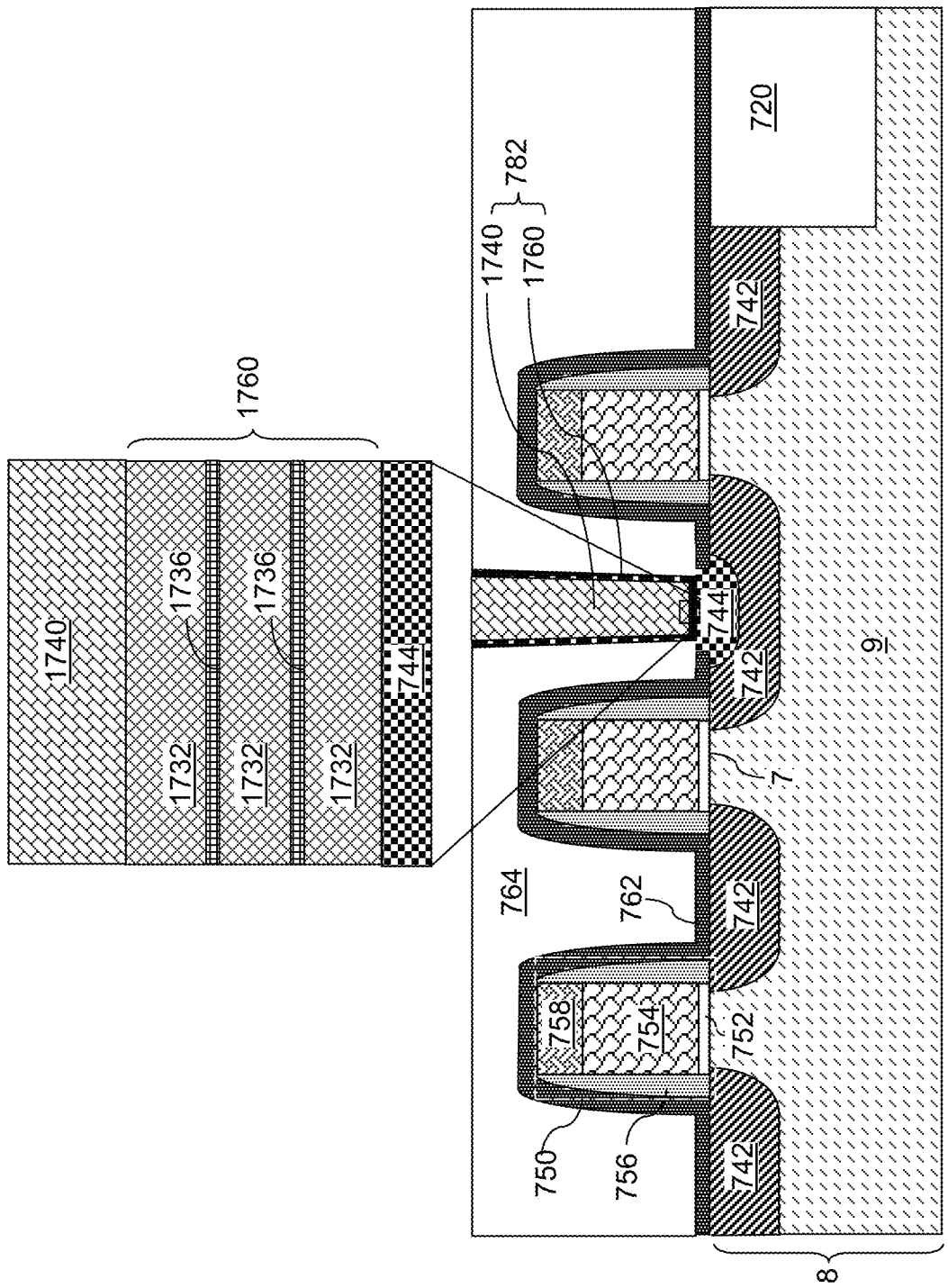

FIG. 17A is a vertical cross-sectional view of a region including a device contact via structure employing a first configuration of a second exemplary barrier stack including two boron layers according to an embodiment of the present disclosure.

Figure 17B:
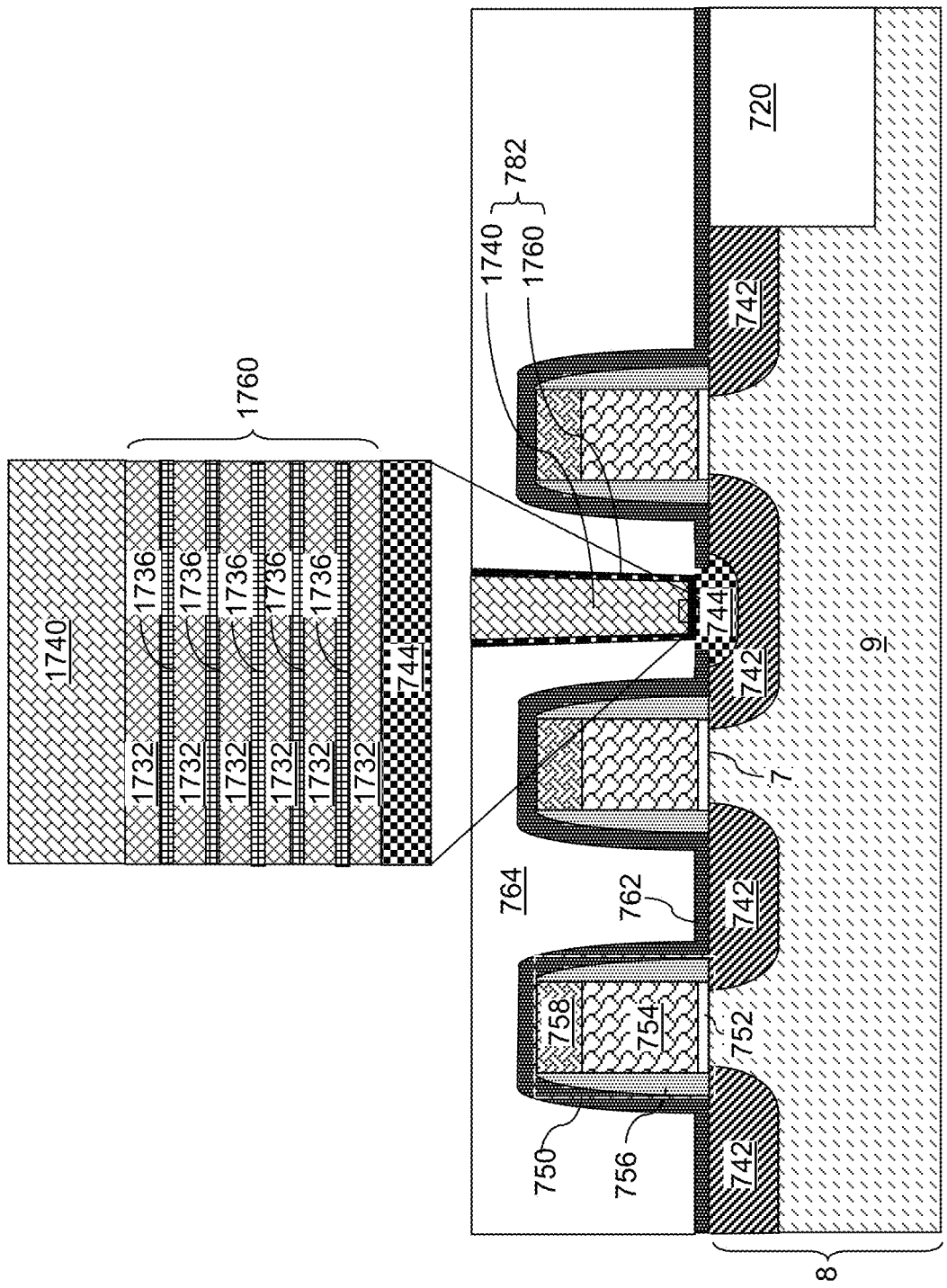

FIG. 17B is a vertical cross-sectional view of a region including a device contact via structure employing a second configuration of a second exemplary barrier stack including five boron layers according to an embodiment of the present disclosure.

Figure 18A:
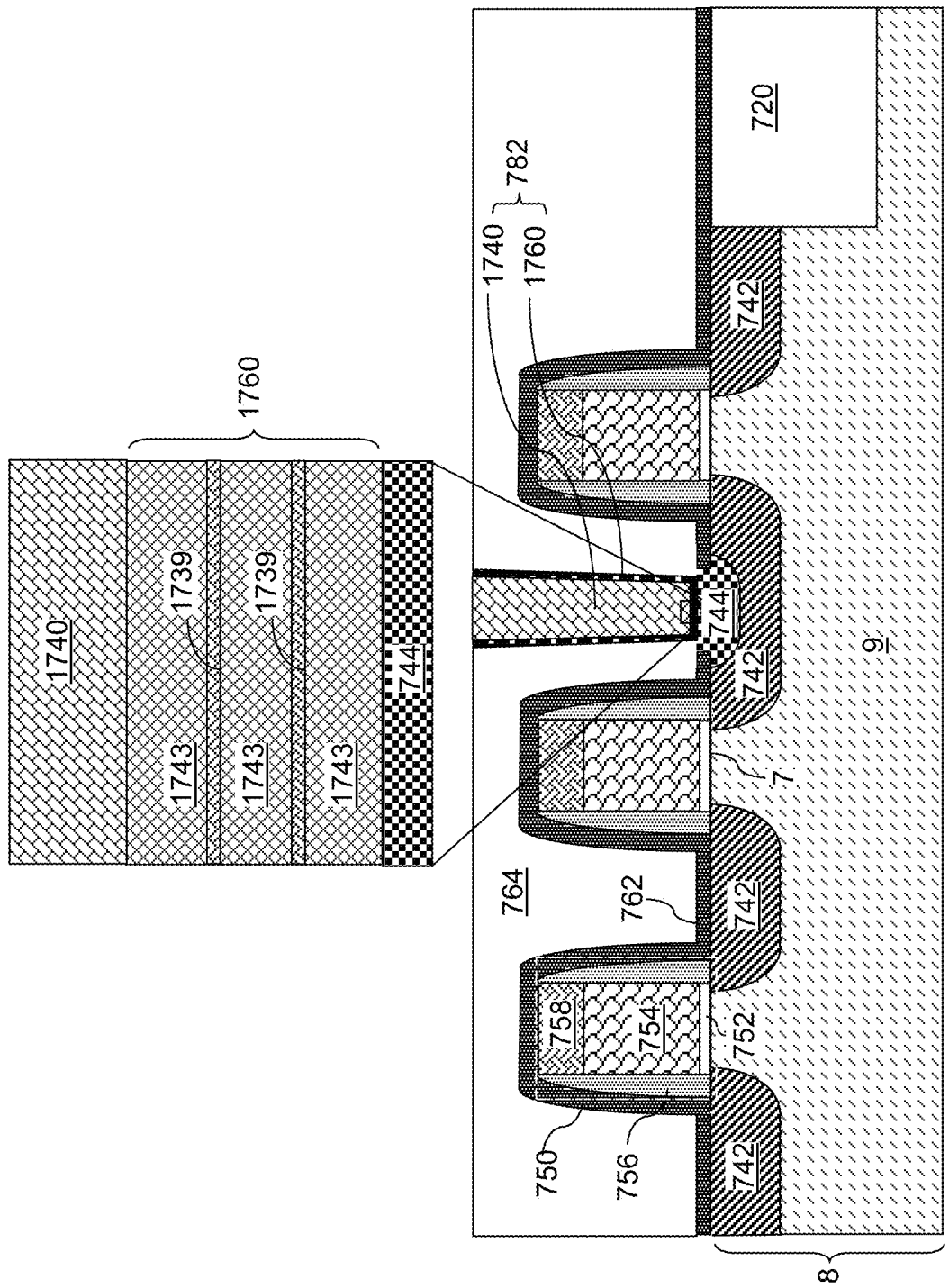

FIG. 18A is a vertical cross-sectional view of a region including a device contact via structure employing the first configuration of the second exemplary barrier stack after a high temperature anneal process according to an embodiment of the present disclosure.

Figure 18B:
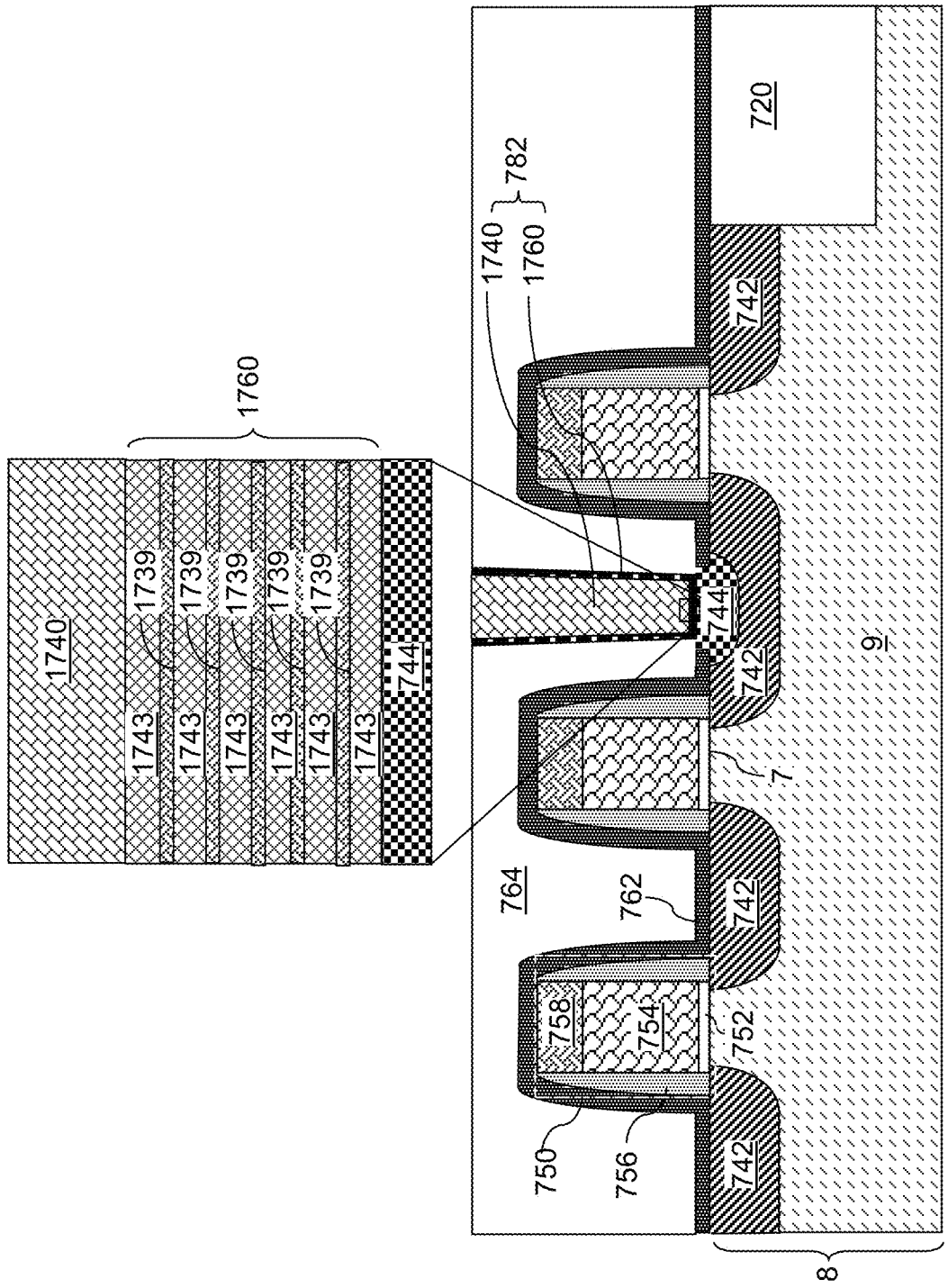

FIG. 18B is a vertical cross-sectional view of a region including a device contact via structure employing the second configuration of the second exemplary barrier stack after a high temperature anneal process according to an embodiment of the present disclosure.

Figure 19:
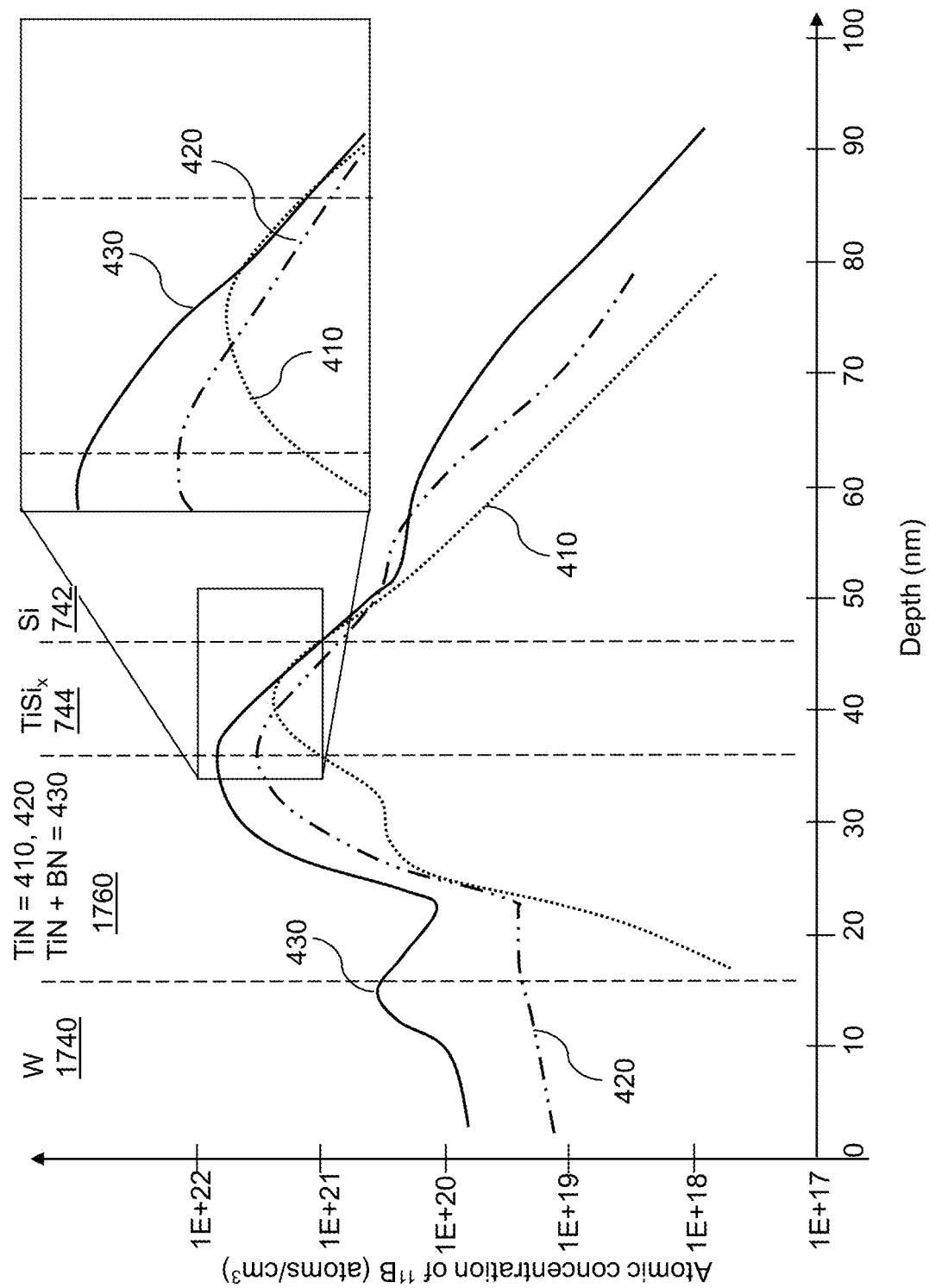

FIG. 19 illustrates plots secondary ion mass spectroscopy (SIMS) profiles of a sample including an exemplary barrier stack and a sample including a comparative exemplary metallic barrier layer before and after an anneal process.

DETAILED DESCRIPTION

As three-dimensional memory devices scale to smaller device dimensions, the device area for peripheral devices can take up a significant portion of the total chip area. Architecture employing a three-dimensional array of memory structures formed over underlying peripheral devices can be used to reduce overall device area while providing high memory density. However, high temperature thermal cycling required to activate dopants within the three-dimensional array of memory structures has a deleterious effect on performance of the peripheral devices. Particularly, electrical contact between a doped semiconductor region of a peripheral device and an overlying metallic via structure can be degraded significantly due to subsequent thermal cycling. Such degradation can cause loss of electrical dopants from doped semiconductor regions. The embodiments of the present disclosure can reduce or eliminate such degradation of electrical contact is desired.

As discussed above, the present disclosure is directed to a three-dimensional memory device employing field effect transistors underneath a three-dimensional array of memory cells, and methods of making the same, the various aspects of which are described below. The embodiments of the disclosure can be employed to form various semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise.

Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between or at a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-memory-level" element refers to an element that vertically extends through a memory level.

As used herein, a "semiconducting material" refers to a material having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulating material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The substrate may include integrated circuits fabricated thereon, such as driver circuits for a memory device The various three dimensional memory devices of the present disclosure include a monolithic three-dimensional NAND string memory device, and can be fabricated employing the various embodiments described herein. The monolithic three dimensional NAND string is located in a monolithic, three dimensional array of NAND strings located over the substrate. At least one memory cell in the first device level of the three dimensional array of NAND strings is located over another memory cell in the second device level of the three dimensional array of NAND strings.

Figure 1:
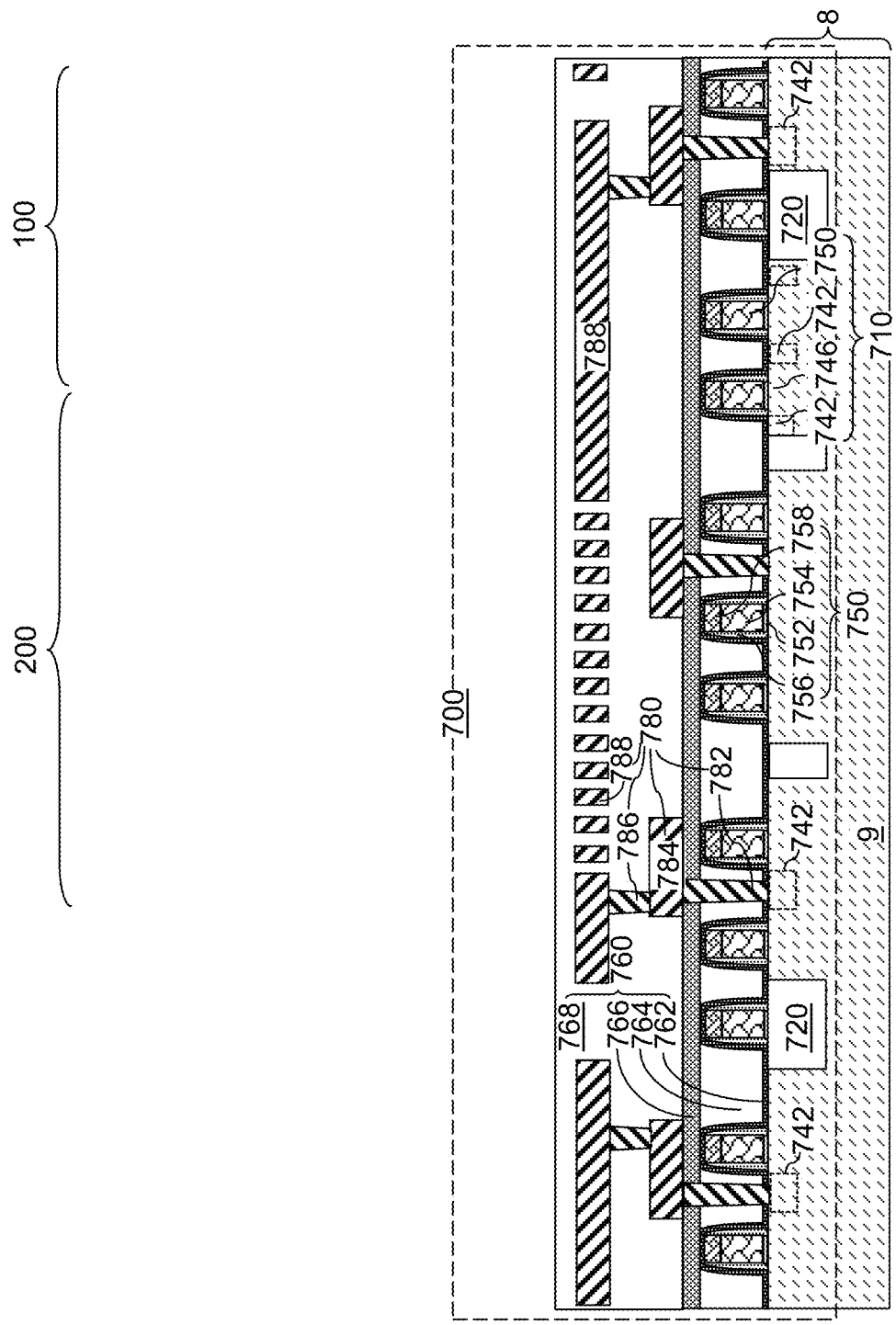
FIG. 1 is a vertical cross-sectional view of an exemplary structure after formation of semiconductor devices, at least one lower level dielectric layer, and lower level metal interconnect structures on a semiconductor substrate according to a first embodiment of the present disclosure.

Referring to FIG. 1, an exemplary structure according to a first embodiment of the present disclosure is illustrated. The exemplary structure includes a semiconductor substrate 8, and semiconductor devices 710 formed thereupon. The semiconductor substrate 8 includes a substrate semiconductor layer 9 at least at an upper portion thereof. Shallow trench isolation structures 720 can be formed in an upper portion of the substrate semiconductor layer 9 to provide electrical isolation among the semiconductor devices. The semiconductor devices 710 can include, for example, field effect transistors including respective transistor active regions 742 (i.e., source regions and drain regions), channel regions 746 and gate structures 750. The field effect transistors may be arranged in a CMOS configuration. Each gate structure 750 can include, for example, a gate dielectric 752, a gate electrode 754, a dielectric gate spacer 756 and a gate cap dielectric 758. The semiconductor devices can include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

At least one dielectric layer is formed over the semiconductor devices, which is herein referred to as at least one lower level dielectric layer 760. The at least one lower level dielectric layer 760 can include, for example, a dielectric liner 762 such as a silicon nitride liner that blocks diffusion of mobile ions and/or apply appropriate stress to underlying structures, a planarization dielectric layer 764 that is employed to provide a planar surface that is coplanar with the topmost surface of the dielectric liner 762 or the topmost surfaces of the gate structures 750, an optional planar liner 766, and at least one lower level interconnect dielectric layer 768 that collectively functions as a matrix for lower level metal interconnect structures 780 that provide electrical wiring among the various nodes of the semiconductor devices and landing pads for through-memory-level via structures to be subsequently formed. The lower level metal interconnect structures 780 can include various device contact via structures 782 (e.g., source and drain electrodes which contact the respective source and drain nodes of the device or gate electrode contacts), lower level metal lines 784, lower level via structures 786, and lower level topmost metal structures 788 that are configured to function as landing pads for through-memory-level via structures to be subsequently formed. The region of the semiconductor devices and the combination of the at least one lower level dielectric layer 760 and the lower level metal interconnect structures 780 is herein referred to an underlying peripheral device region 700, which is located underneath a memory-level assembly to be subsequently formed and includes peripheral devices for the memory-level assembly. The lower level metal interconnect structures 780 are embedded in the at least one lower level dielectric layer 760. In one embodiment, the topmost surfaces of the lower level topmost metal structures 788 may be located at or below a horizontal plane including the topmost surface of the at least one lower level dielectric layer 760.

The lower level metal interconnect structures 780 can be electrically shorted to active nodes (e.g., transistor active regions 742 or gate electrodes 750) of the semiconductor devices 710 (e.g., CMOS devices), and are located at the level of the at least one lower level dielectric layer 760. Only a subset of the active nodes is illustrated in FIG. 1 for clarity. Through-memory-level via structures (not shown in FIG. 1) can be subsequently formed directly on the lower level metal interconnect structures 780 to provide electrical connection to memory devices to be subsequently formed. In one embodiment, the pattern of the lower level metal interconnect structures 780 can be selected such that the lower level topmost metal structures 788 (which are a subset of the lower level metal interconnect structures 780 located at the topmost portion of the lower level metal interconnect structures 780) can provide landing pad structures for the through-memory-level via structures to be subsequently formed.

Figure 2A:
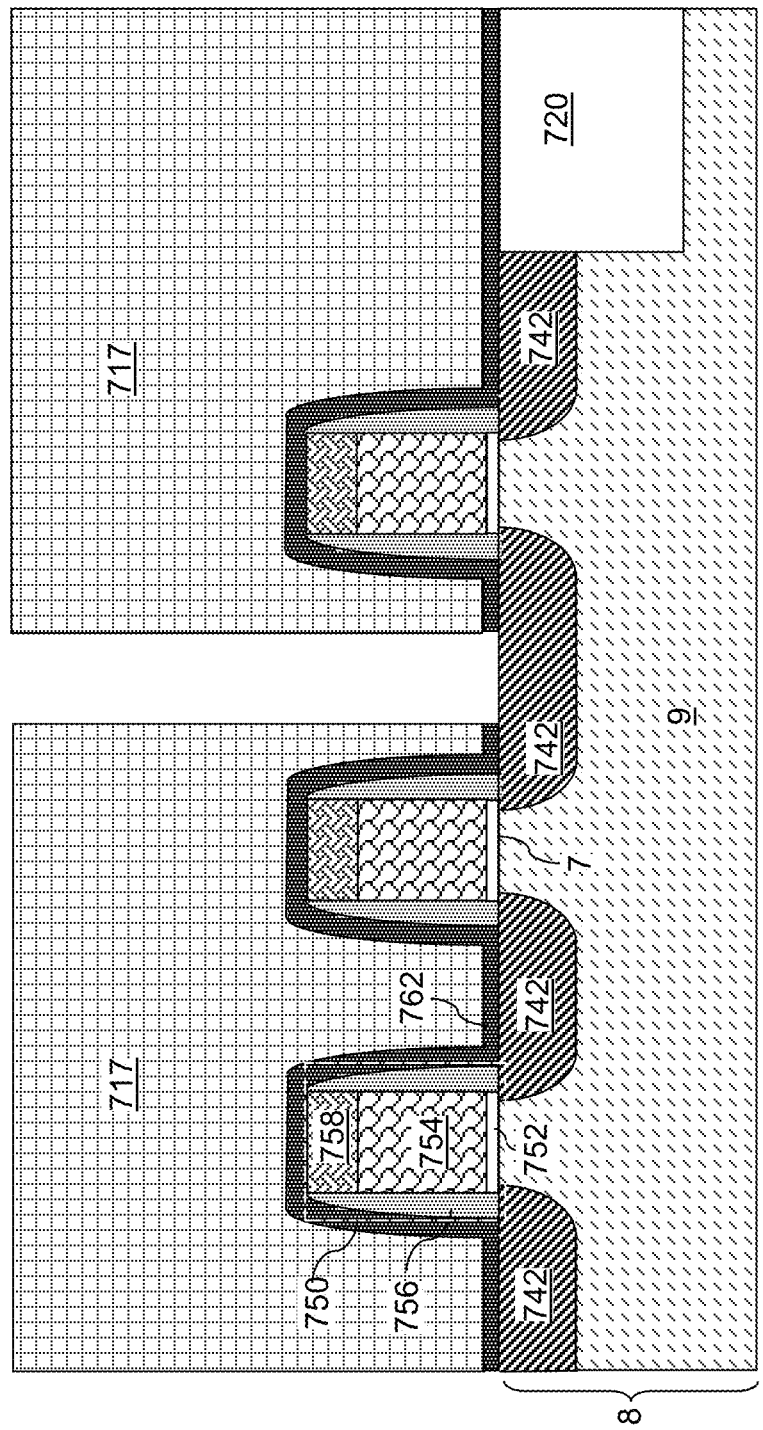
FIGS. 2A-2C are sequential vertical cross-sectional view of a region of the exemplary structure during formation of a contact via cavity according to an embodiment of the present disclosure.

Referring to FIG. 2A, a region of the exemplary structure of FIG. 1 is shown prior to formation of device contact via structures 782. The semiconductor substrate 8 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The semiconductor substrate 8 can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface. In one embodiment, the semiconductor substrate 8 includes single crystalline silicon. In one embodiment, the substrate semiconductor layer 9 can be doped with electrical dopants, which may be p-type dopants or n-type dopants. The conductivity type of the doping of the substrate semiconductor layer 9 is herein referred to as a first conductivity type. The dopant concentration in the substrate semiconductor layer 9 can be in a range from $1.0 \times 10^{14}/cm^3$ to $1.0 \times 10^{17}/cm^3$, although lesser and greater dopant concentrations can also be employed.

The shallow trench isolation structures 720 can be formed by patterning shallow trenches on the top surface of the substrate semiconductor layer 9, and by filling the shallow trenches 720 with a dielectric material such as silicon oxide. A gate level layer stack including a gate dielectric layer, at least one gate conductor layer, and a gate cap dielectric layer is deposited over the top surface of the substrate semiconductor layer 9. A photoresist layer is applied over the gate level layer stack, and is lithographically patterned to cover areas in which gate electrodes 754 are to be subsequently formed. An anisotropic etch is performed to pattern the gate level layer stack including the patterned photoresist layer as an etch mask. Each patterned portion of the gate dielectric layer can be a gate dielectric 752, each patterned portion of the gate electrode layer can be a gate electrode 754, and each patterned portion of the gate cap dielectric layer can be a gate cap dielectric 758.

Source extension regions and drain extension regions, which are subsequently incorporated into transistor active regions 742 and not separately shown in FIG. 2A, can be formed by implantation of ions of the opposite conductivity type than the conductivity type of the substrate semiconductor layer 9. The conductivity type of the dopants implanted to form the source extension regions and the drain extension regions is herein referred to as a second conductivity type. For example, if the first conductivity type is p-type, the second conductivity type is n-type, and vice versa. A dielectric gate spacer 756 can be formed around each patterned gate stack (752, 754, 758) by conformal formation of at least one dielectric spacer layer and at least one anisotropic etch. Conformal deposition of a dielectric material and/or thermal or plasma conversion of semiconductor materials into a dielectric material can be employed to form all, or a component, of the at least one dielectric spacer layer. Each contiguous set of a patterned gate stack (752, 754, 758) and a dielectric gate spacer 756 is collectively referred to as a gate structure 750.

Additional dopants of the second conductivity type can be implanted into upper portions of the substrate semiconductor layer 9 that are not covered by the gate structures 750. Dopants that can be implanted into the unmasked portions of the substrate semiconductor layer 9 include p-type dopants such as boron or gallium, and n-type dopants such as phosphorus, arsenic, or antimony. Implanted upper portions of the substrate semiconductor layer 9 are doped semiconductor material portions. The doped semiconductor material portions can include transistor active regions 742, each of which may be a source region or a drain region depending on the mode of operation of a respective field effect transistor.

Each transistor active region 742 is a doped semiconductor material portion embedded in the remaining portion of the substrate semiconductor layer 9. The transistor active regions 742 are doped semiconductor material portions having a doping of a respective conductivity type. At least of a subset of the transistor active region 742 includes a doped semiconductor material including electrical dopants of the second conductivity type. In one embodiment, the second conductivity type can be p-type and the electrical dopants in the transistor active regions 742 can be boron atoms. In this case, the subset of the transistor active regions 742 includes a boron-doped silicon-containing material such as boron-doped silicon. The dopant concentration in the transistor active regions 742 can be in a range from $1.0 \times 10^{18}/cm^3$ to $2.0 \times 10^{21}/cm^3$, such as from $5.0 \times 10^{19}/cm^3$ to $1.0 \times 10^{21}/cm^3$, although lesser and greater dopant concentrations can also be employed. The thickness of the transistor active regions 742 may range from 30 nm to 600 nm, although lesser and greater thicknesses can also be employed.

A dielectric liner 762 can be deposited on the gate structures 750, the transistor active regions 742, and the shallow trench isolation structures 720. The dielectric liner 762 includes a dielectric material such as silicon nitride, silicon oxide, or a dielectric metal oxide. In one embodiment, the dielectric liner 762 can include a diffusion barrier material such as silicon nitride. Alterative or additionally, the dielectric liner 762 may include a stress-inducing material that imparts stress to underlying material portions. In this case, the stress imparted by the dielectric liner 762 to underlying structures may be tensile stress or compressive stress. The dielectric liner 762 may include a single layer or multiple layers. Further, different dielectric liners 762 may be employed for different semiconductor devices. For example, a tensile-stress-generating dielectric liner may be formed over n-type field effect transistors and a compressive-stress-generating dielectric liner may be formed over p-type field effect transistors. The dielectric liner 762 can be deposited by plasma enhanced chemical vapor deposition, low pressure chemical vapor deposition, or atomic layer deposition. The thickness of the dielectric liner 762 can be in a range from 2 nm to 40 nm, although lesser and greater thicknesses can also be employed.

A photoresist layer 717 can be applied over the dielectric liner 762, and can be lithographically patterned to form openings in areas in which contact via structures are to be subsequently formed. The unmasked portions of the dielectric liner 762 can be etched by an isotropic etch process or an anisotropic etch process to form openings 763 in the dielectric liner 762. Top surfaces of the transistor active regions 742 are physically exposed within the areas of the opening in the photoresist layer. The photoresist layer 717 can be subsequently removed, for example, by ashing.

Figure 2B:
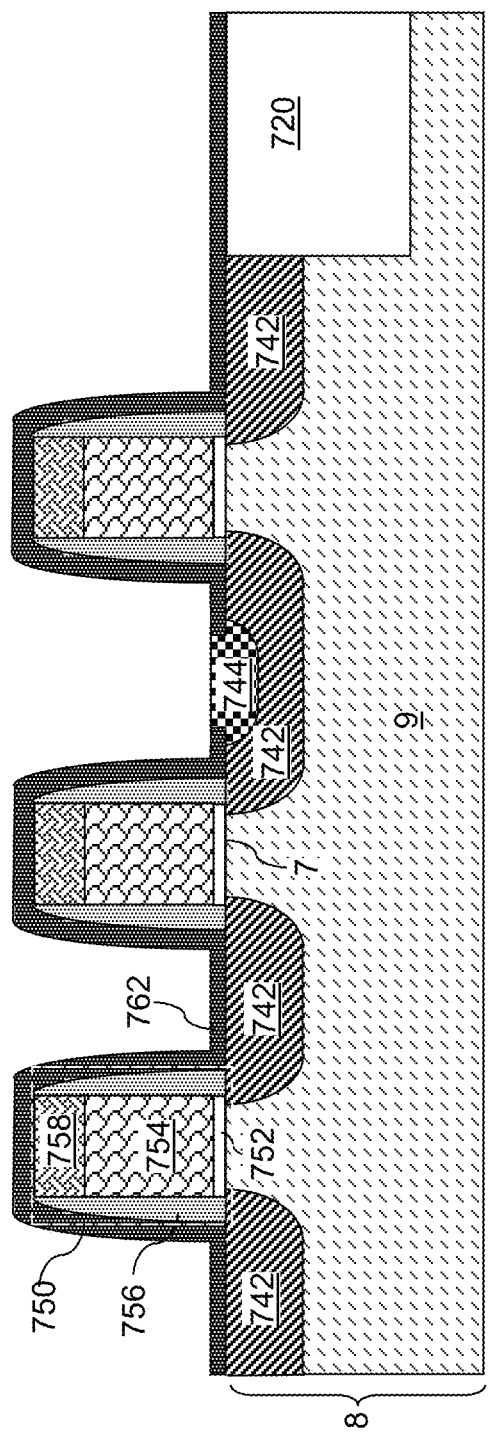

Referring to FIG. 2B, a metal layer (not shown) can be deposited on the physically exposed surfaces of the transistor active regions 742 and on the outer surfaces of the dielectric liner 762. The metal layer includes an elemental metal or an intermetallic alloy of at least two elemental metals that form a metal-semiconductor alloy with the semiconductor material of the substrate semiconductor layer 9, which is the same as the semiconductor material of the transistor active regions 742 except for differences in electrical (p-type or n-type) dopant species and electrical dopant concentration. For example, if the substrate semiconductor layer 9 includes silicon or a silicon-containing semiconductor material, the metal layer includes at least one elemental metal that forms a metal silicide upon reaction with silicon.

In an illustrated example, the metal layer can include tantalum, cobalt, tungsten, or titanium. In one embodiment, the metal layer can consist essentially of at least one metal selected from tantalum, cobalt, tungsten, and titanium. In one embodiment, the metal layer can consist essentially of titanium, tantalum, cobalt, tungsten, or an alloy thereof. The metal layer can be deposited by a directional or non-directional deposition method. In one embodiment, the metal layer can be deposited by physical vapor deposition or chemical vapor deposition. The thickness of the metal layer can be selected such that sufficient amount of at least one elemental metal for forming a metal-semiconductor alloy material of a target thickness is provided by the metal layer. For example, the thickness of the metal layer can be in a range from 5 nm to 50 nm, although lesser and greater thicknesses can also be employed.

In an alternative embodiment, the metal layer can include a stack of multiple layers including, from bottom to top, a titanium layer and a titanium nitride layer. The titanium nitride layer can impede diffusion of boron toward an upper portion of a metal-semiconductor alloy material (e.g., a titanium silicide material) to be subsequently formed.

The exemplary structure is annealed at an elevated temperature to induce reaction between the semiconductor material of the transistor active regions 742 and the material of the metal layer. The temperature of the anneal process is dependent on the material of the metal layer and the semiconductor material of the transistor active regions 742. In case the transistor active regions 742 include silicon and the metal layer consists essentially of titanium, tantalum, cobalt, tungsten, or an alloy thereof, anneal temperatures in the range from 400 degrees to 900 degrees. A multi-step anneal process can be employed to anneal the exemplary structure at different anneal temperatures to induce formation of a low resistance phase metal-semiconductor alloy material formed by metallization of the semiconductor material of the transistor active regions 742.

A metal-semiconductor alloy portion 744 is formed by reaction of a surface portion of each transistor active region 742 that contacts the metal layer. If transistor active region 742 comprises a silicon active region, then the metal-semiconductor alloy portion 744 comprises a metal silicide, such as titanium, tantalum, cobalt or tungsten silicide. Each portion of the metal layer that contacts an underlying semiconductor material portion of a respective transistor active region 742 is consumed to form a metal-semiconductor alloy material of the metal-semiconductor alloy portions 744. Unreacted portions of the metal layer is removed by an etch process that removes the elemental metal or the intermetallic alloy of the metal layer selective to the metal-semiconductor alloy of the metal-semiconductor alloy portions 744. For example, a wet etch process can be employed to etch the metal of the metal layer selective to the metal-semiconductor alloy material. Each metal-semiconductor alloy portion 744 can be formed directly on an underlying doped semiconductor material portion such as a transistor active region 742.

Figure 2C:
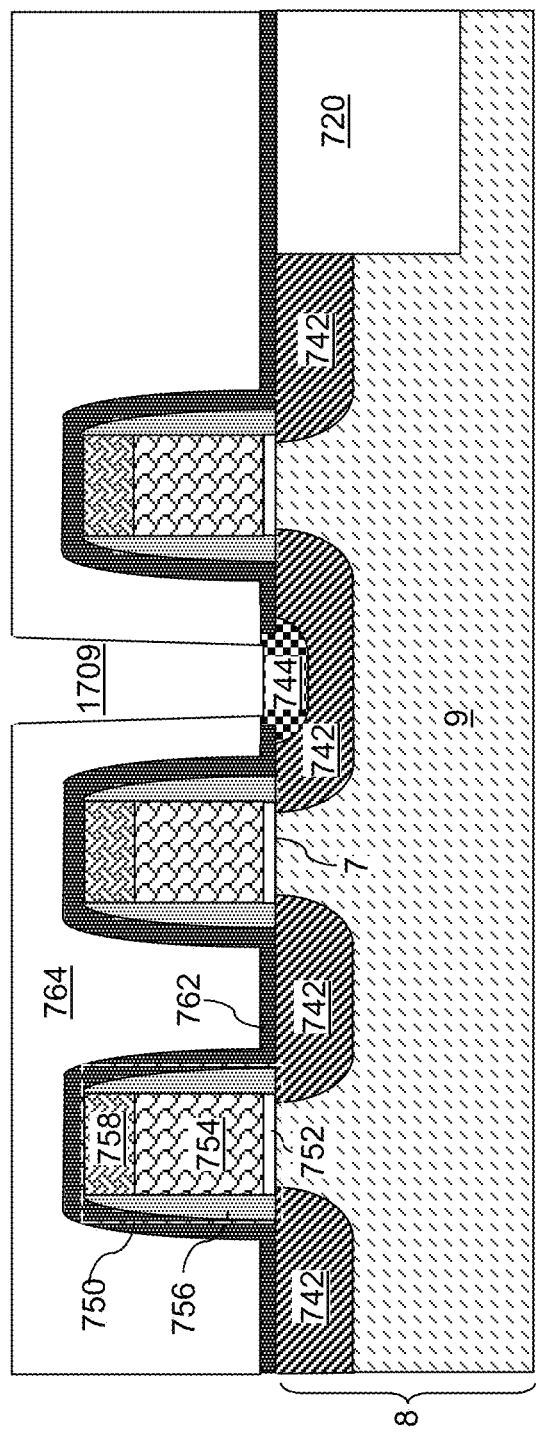

Referring to FIG. 2C, the planarization dielectric layer 764 can be formed over the dielectric liner 762 and the metal-semiconductor alloy portions 744. The planarization dielectric layer 764 includes a dielectric material that can be planarized, for example, by chemical mechanical planarization. For example, the planarization dielectric layer 764 can include undoped silicate glass (USG) (e.g., silicon oxide), borosilicate glass (BSG), phosphosilicate glass (PSG), borophosphosilicate glass (BPSG), fluorosilicate glass (FSG), or a combination thereof. A planar top surface is provided on the planarization dielectric layer 764 after the planarization process.

A photoresist layer (not shown) can be applied over the top surface of the planarization dielectric layer, and can be lithographically patterned to form openings in areas in which contact via cavities 1709 are to be subsequently formed. An anisotropic etch can be performed to transfer the pattern of the photoresist layer through the planarization dielectric layer 764. A top surface of a respective metal-semiconductor alloy portion 744 can be physically exposed at the bottom of each contact via cavity 1709. The photoresist layer can be removed, for example, by ashing.

Figure 3A:
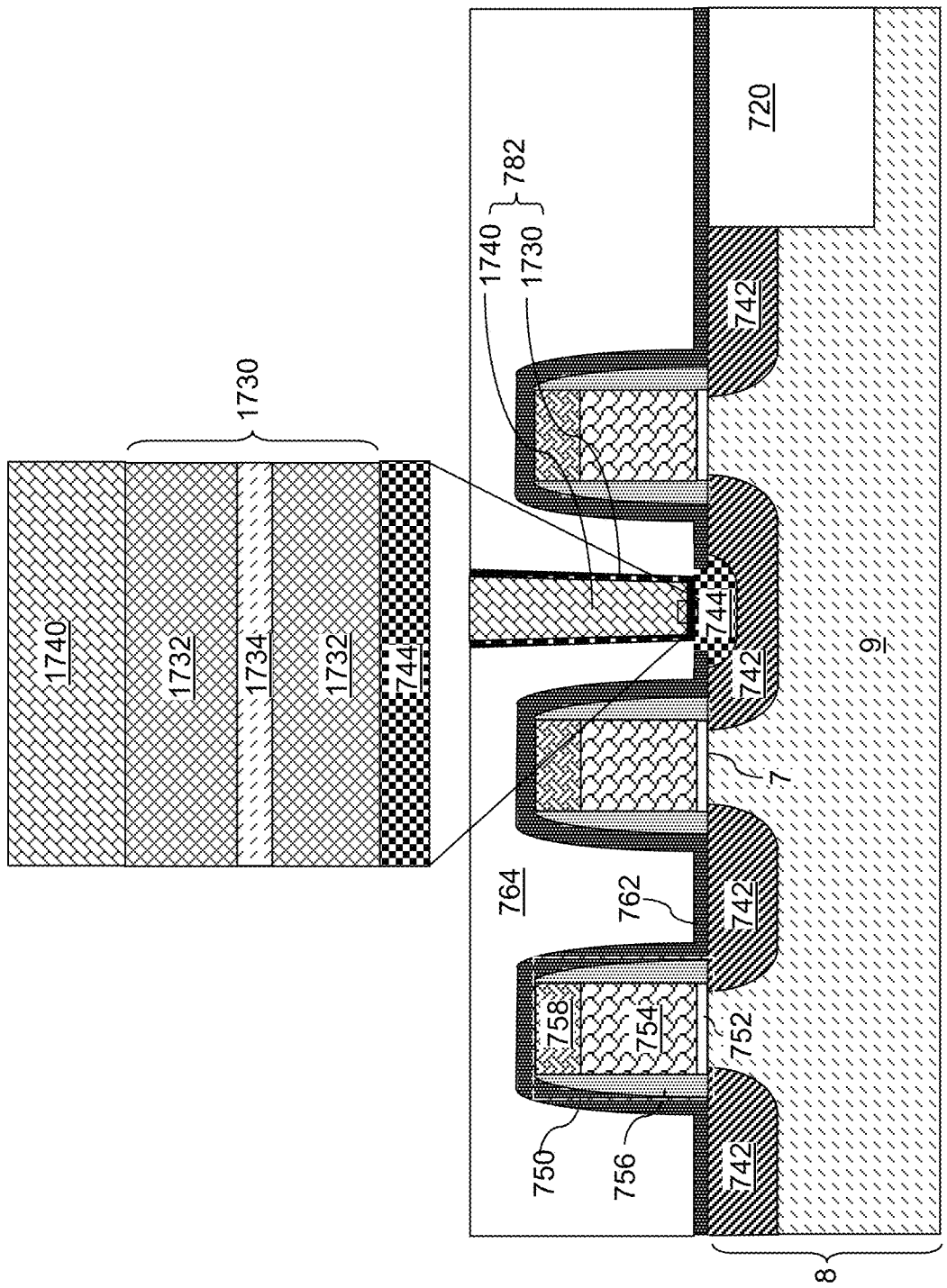
FIG. 3A is a vertical cross-sectional view of a region of the exemplary structure including a device contact via structure employing a first configuration of a first exemplary barrier stack according to an embodiment of the present disclosure.

Referring to FIG. 3A, a device contact via structure 782 can be formed within each contact via cavity 1709 by deposition of metallic and non-metallic materials in the contact via cavities 1709. The barrier stack 1730 includes at least two metal nitride layers 1732 comprising a conductive nitride of at least one transition metal element and at least one non-metal element layer 1734 including an element selected from silicon and boron. Each of the at least non-metal element layer 1734 can be formed between a pair of metal nitride layers 1732. In one embodiment, each of the at least one non-metal element layers can have a thickness in a range from 0.1 nm to 2.0 nm, and the barrier stack 1730 can have a total thickness in a range from 3.0 nm to 25 nm.

In the first embodiment, the non-metal element selected from silicon and boron comprises silicon. In this case, each barrier stack 1730, as deposited and after incorporation into a respective device contact via structure 782, includes at least one silicon layer 1734 which in embodiment can consist essentially of silicon right after deposition.

Each of the at least two metal nitride layers 1732 includes a conductive metal nitride material, and can consist essentially of the conductive metal nitride material. The conductive metal nitride material of the at least two metal nitride layers 1732 can be, for example, titanium nitride, tantalum nitride, or tungsten nitride. A suitable metal target (in case of physical vapor deposition) or a suitable precursor gas (in case of chemical vapor deposition or atomic layer deposition) may be employed. For example, if titanium nitride is deposited for each metal nitride layer 1732 by chemical vapor deposition, a precursor gas such as $TiCl_4$, TDMAT, or TEMATi may be employed in combination with a nitrogen containing (e.g., ammonia or nitrogen) source gas. Alternatively, an as-deposited metal layer can be nitride by exposure to a nitrogen containing atmosphere (e.g., nitrogen plasma) at an elevated temperature to convert the metal (e.g., titanium) to a metal nitride (e.g., titanium nitride) after deposition. During formation of the barrier stack 1730, the conductive metal nitride material of the at least two metal nitride layers 1732 can be deposited by a conformal deposition process (such as chemical vapor deposition or atomic layer deposition), or can be deposited by a non-conformal deposition process (such as physical vapor deposition). The thickness of each of the at least two metal nitride layers 1732, as measured at a horizontal portion adjacent to an underlying metal-semiconductor alloy portion 744, can be in a range from 1 nm to 15 nm, such as from 2 nm to 10 nm, although lesser and greater thicknesses can also be employed. Unless otherwise specified, the thickness of the barrier stack 1730 or any of the component layers therein refer to the thickness of a respective horizontal portion that is adjacent to an underlying metal-semiconductor alloy portion 744.

Each of the at least one silicon layer 1734 can be deposited by a conformal deposition process such as atomic layer deposition or chemical vapor deposition. The thickness of each silicon layer 1734 can be in a range from 0.1 nm to 2.0 nm. Thus, each silicon layer 1734 may be less than, equal to, or more than, the thickness of one monolayer of silicon. The thickness of the silicon layer 1734 is calculated as the product of the thickness of one monolayer of silicon and the ratio of the total number of silicon atoms to the number of silicon atoms needed to form one monolayer of silicon.

In one embodiment, each silicon layer 1734 can be deposited by an atomic layer deposition process in which the exemplary structure is placed in an atomic layer deposition process chamber, and a silicon-containing reactant gas (such as $SiH_4$, $Si_2H_6$ or dichlorosilane) is flowed into the process chamber at a low pressure (such as from 0.1 mTorr to 100 mTorr) to induce adsorption of silicon atoms on the physically exposed surfaces of an underlying metal nitride layer 1732. This process can be self-limiting under suitable process conditions, and a monolayer of silicon can be formed on the top surface of the underlying metal nitride layer 1732 to form a silicon layer 1734. The next metal nitride layer 1732 can be deposited on the silicon layer 1734. Additional silicon layer(s) 1734 and additional metal nitride layer(s) 1732 can be deposited as needed. The barrier stack 1730 can have a total thickness in a range from 3.0 nm to 25 nm.

Figure 3B:
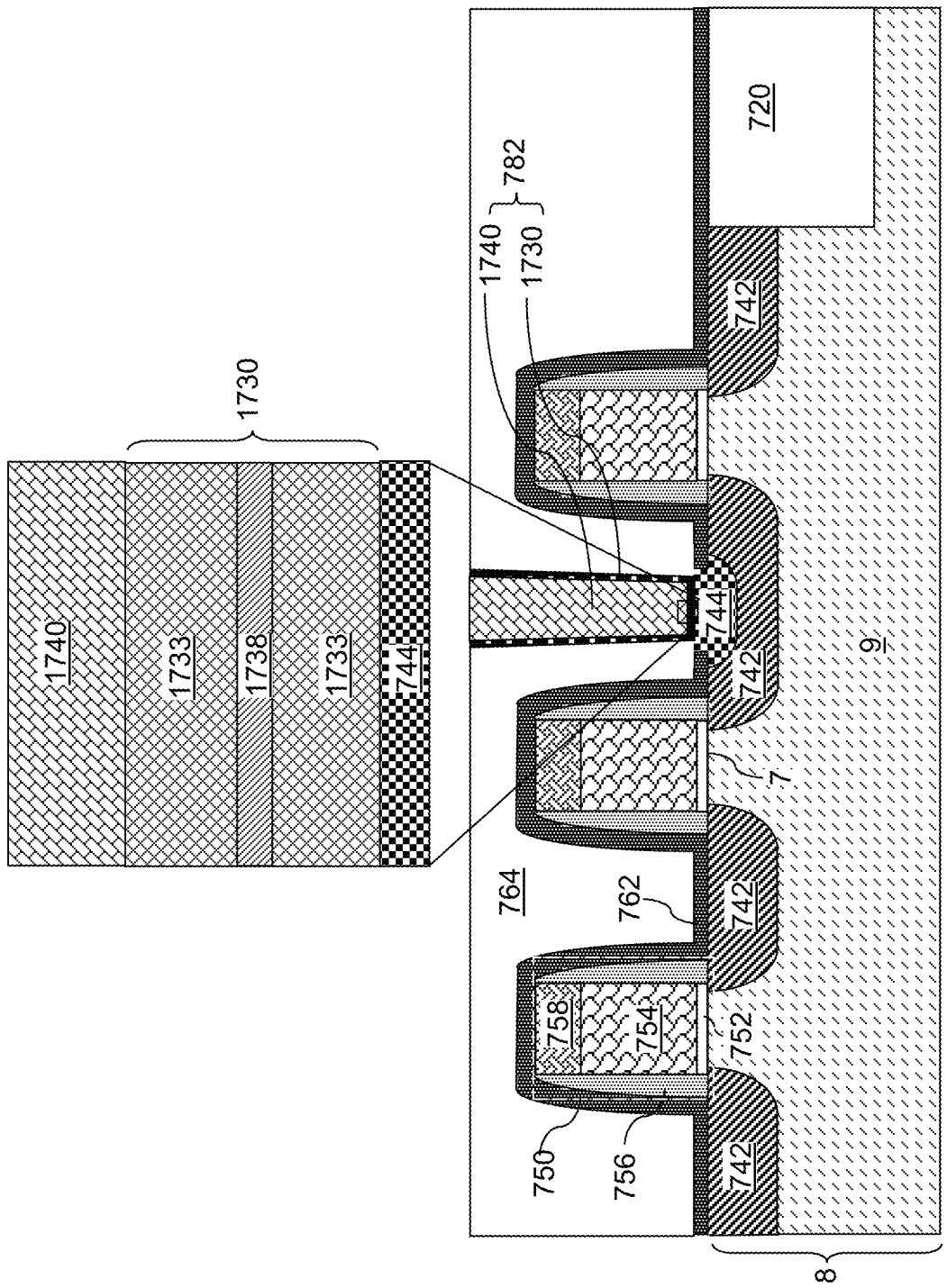
FIG. 3B is a vertical cross-sectional view of a region including a device contact via structure employing the first configuration of the first exemplary barrier stack of FIG. 3A after a high temperature anneal process according to an embodiment of the present disclosure.

Nitrogen and/or titanium may be incorporated into the silicon layer 1734 during the deposition of the overlying titanium nitride layer 1732 to convert the silicon layer 1734 into a silicon and nitrogen containing layer (i.e., silicon-nitrogen layer) 1738 shown in FIG. 3B. If desired, a nitridation process may be conducted after deposition of the silicon layer 1734 and prior to deposition of the overlying titanium nitride layer 1732 to convert the silicon layer 1734 into a silicon and nitrogen containing layer (i.e., silicon-nitrogen layer) 1738 shown in FIG. 3B. The nitridation may comprise either plasma or thermal nitridation of silicon in a nitrogen containing ambient (e.g., ammonia or nitrogen gas or plasma). The silicon and nitrogen containing layer 1738 may be a stoichiometric or non-stoichiometric (e.g., silicon rich or nitrogen rich) silicon nitride layer. Alternatively, the silicon layer 1734 is converted to the silicon and nitrogen containing layer 1738 during a subsequent high temperature process step, such as an anneal or a high temperature layer deposition step, as will be described in more detail below.

Subsequently, a conductive fill material is deposited in unfilled volumes of the contact via cavities 1709. The conductive fill material can include an elemental metal such as tungsten, cobalt, tantalum, titanium, copper, or aluminum, or an intermetallic alloy of at least two elemental metals. The conductive fill material can be deposited by a conformal deposition process such as chemical vapor deposition or atomic layer deposition, or by electroplating or electroless plating that allows superfill without formation of seams. The duration of the deposition process for depositing the conductive fill material can be selected such that the entire volume of each contact via cavity 1709 is filled within a combination of the barrier stack 1730 and the conductive fill material.

Subsequently, device contact via structures 782 can be formed by removing excess portions of the conductive fill material and the barrier stack 1730 from above the horizontal plane including the top surface of the planarization dielectric layer 764. A planarization process can be employed to remove the excess portions of the barrier stack 1730 and the deposited conductive fill material. The planarization process can employ chemical mechanical planarization (CMP) and/or a recess etch. Each contact via cavity 1709 is filled with a remaining portion of the barrier stack 1730 and a remaining portion of the conductive fill material (which is herein referred to as a conductive fill material portion 1740). Each adjoining pair of a barrier stack 1730 and a conductive fill material portion 1740 constitutes a device contact via structure 782.

Figure 4A:
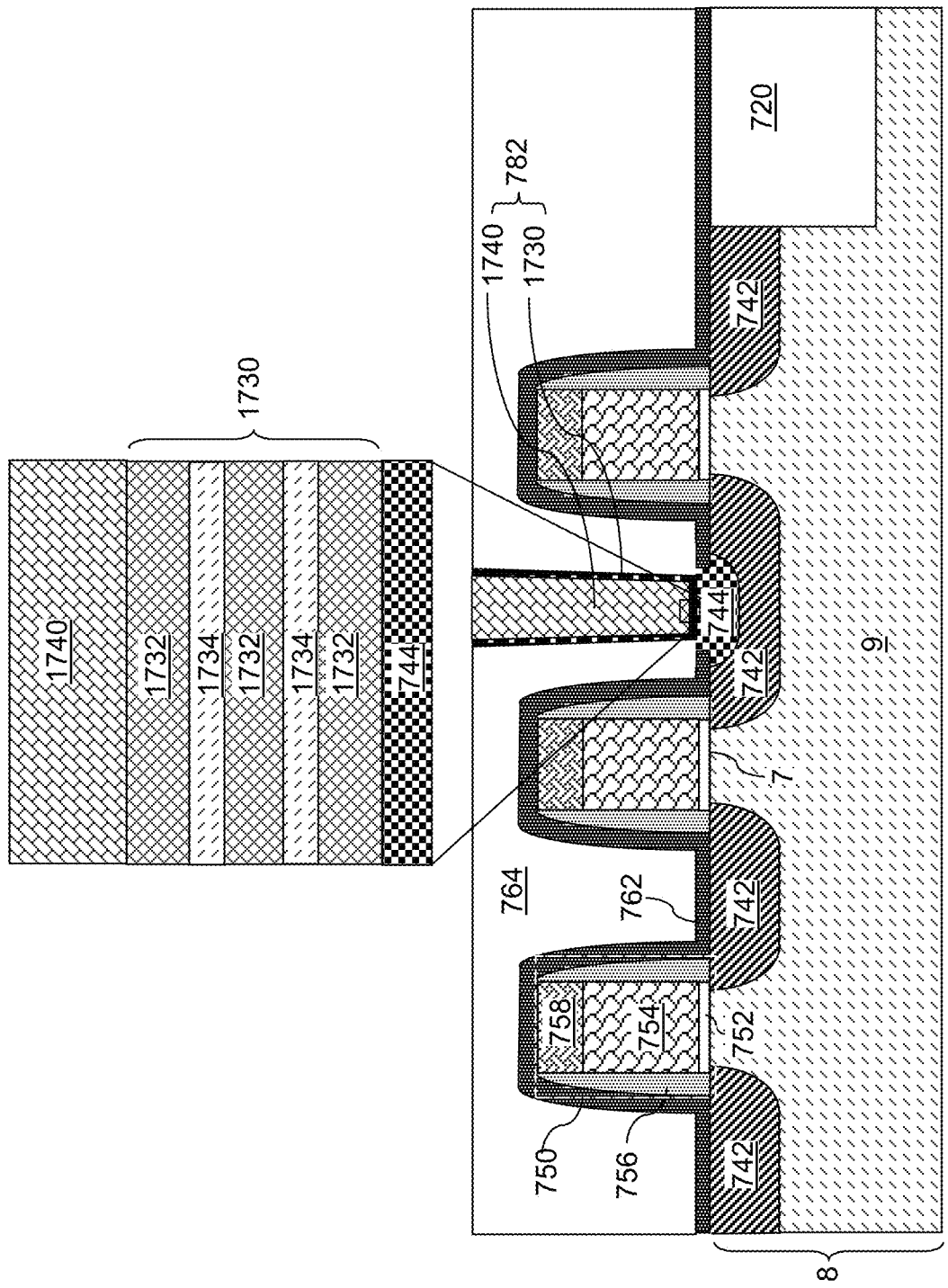
FIG. 4A is a vertical cross-sectional view of a region of the exemplary structure including a device contact via structure employing a second configuration of the first exemplary barrier stack according to an embodiment of the present disclosure.

The configuration of the first exemplary barrier stack 1730 of FIG. 3A includes two metal nitride layers 1732 and one silicon layer 1734. FIG. 4A illustrates another configuration for the first exemplary barrier stack 1730 that includes three metal nitride layers 1732 and two silicon layers 1734. Generally, n number of silicon layers 1734 and (n+1) number of metal nitride layers 1732 can be employed to form the barrier stack 1730. The range of the number n can be from (and including) 1 to (and including) 10. In some embodiment, the range of the number n can be from (and including) 1 to (and including) 4.

Subsequently, various processing steps can be performed to form additional components of the at least one lower level dielectric layer 760 and the lower level metal interconnect structures 78, and additional components of the underlying peripheral device region 700 of the exemplary structure illustrated in FIG. 1, and the formation of the three dimensional memory device which will be described in more detail with respect to FIGS. 5 to 16 below.

A high temperature activation anneal is typically performed after formation of various doped semiconductor regions (such as source and/or drain regions which will be described below) of the three-dimensional memory devices in order to electrically activate the electrical dopants (p-type dopants or n-type dopants) in doped semiconductor regions of the three-dimensional memory devices. The activation anneal induces electrical dopants at interstitial sites to move to substitutional sites in order to alter the band structure of the doped semiconductor regions to a desired state. The peak temperature of the activation anneal is above 900 degrees Celsius, and is typically above 1,000 degrees Celsius. Additionally, the three dimensional memory device may include high temperature layer deposition steps. The activation anneal and/or high temperature layer deposition steps may cause diffusion in the barrier layer stack 1730.

Figure 4B:
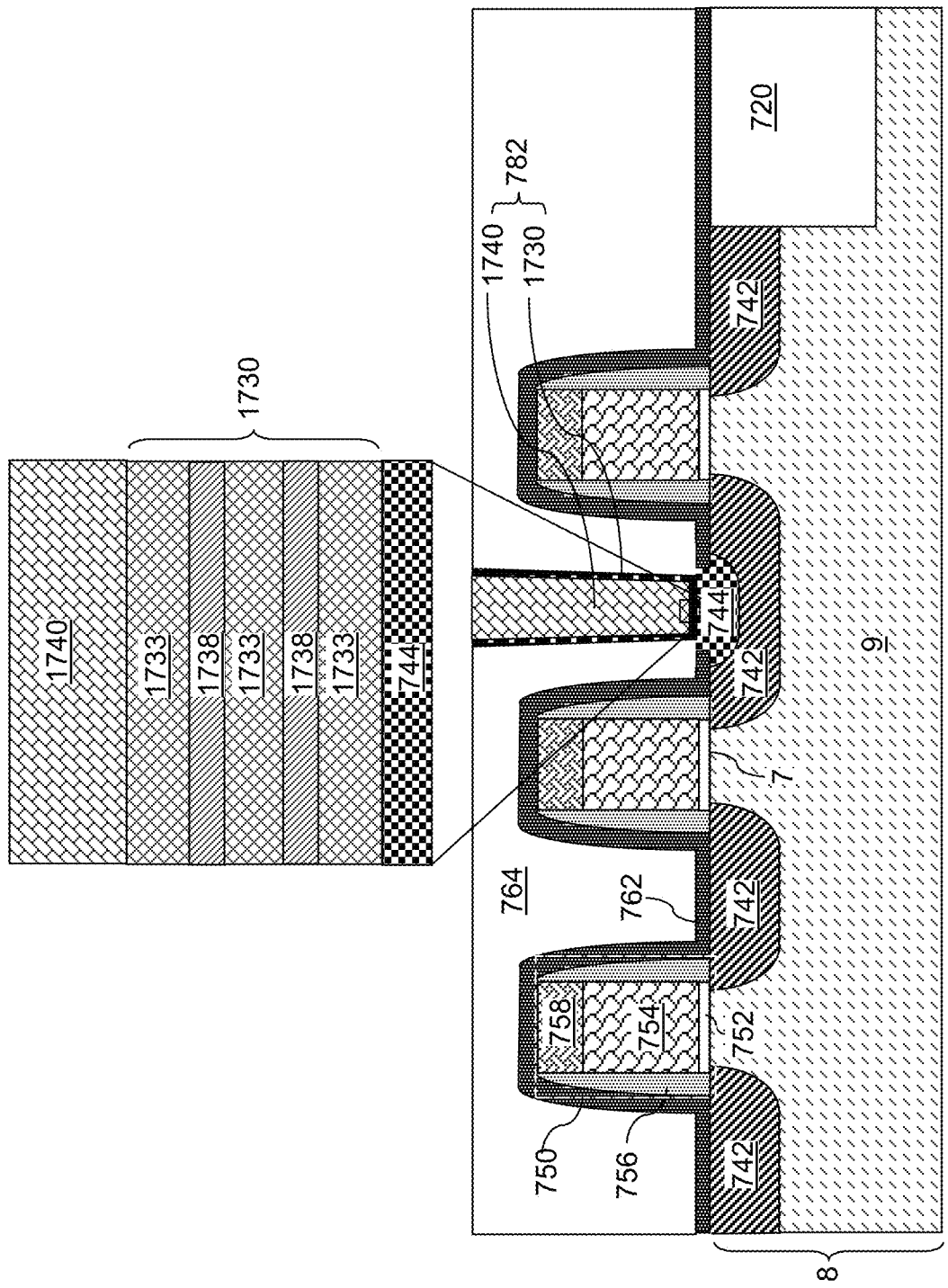
FIG. 4B is a vertical cross-sectional view of a region including a device contact via structure employing the second configuration of the first exemplary barrier stack of FIG. 4A after a high temperature anneal process according to an embodiment of the present disclosure.

Referring to FIGS. 3B and 4B, without wishing to be bound by a particular theory, the high temperature applied to the exemplary structure during the activation anneal and/or subsequent high temperature deposition steps may induce dissociation of a fraction of metal-nitrogen bonds within the metal nitride layers 1732 and may induce diffusion of nitrogen atoms into the at least one silicon layer 1734. Further, without wishing to be bound by a particular theory, the silicon atoms in each of the at least one silicon layer 1734 may diffuse into neighboring metal nitride layers 1732 to dope the at least two metal nitride layers 1732 with silicon, thereby converting the at least two metal nitride layers 1732 into at least two doped metal nitride layers 1733 (e.g., silicon doped titanium nitride layers). The nitrogen atoms from the at least two metal nitride layers 1732 diffuse into the at least one silicon layer 1734 to dope each silicon layer 1734 with nitrogen, thereby converting each silicon layer 1734 into a respective nitrogen-containing material layer, which can be a respective silicon-nitrogen material layer 1738. As used herein, a "silicon-nitrogen material" refers to a mixture, a compound, or a combination of mixture portions and compound portions of silicon and nitrogen in which atomic percentage of silicon is at least 5%, atomic percentage of nitrogen is at least 5%, and the sum of the atomic percentages of silicon and nitrogen is at least 85% with optional impurity atoms (which may be, for example, dopant atoms such as boron atoms that diffuse out from the doped semiconductor material portion 742). Thus, each of the at least one nitrogen-containing material layer (i.e., the at least one silicon-nitrogen material layer 1738) comprises nitrogen and silicon and/or boron. Each of the at least two doped metal nitride layers 1733 comprises a conductive nitride of at least one transition metal element (such as Ti, Ta, or W), and is doped with silicon.

After the activation anneal and/or high temperature layer deposition process, each of the at least one nitrogen-containing material layer (i.e., each silicon-nitrogen material layer 1738) is located between, and contacts, a respective pair of doped metal nitride layers 1733 among the at least two doped metal nitride layers 1733. Each barrier stack 1730 includes a horizontal portion located between the metal-semiconductor alloy portion 744 and the conductive fill material portion 1740, and a vertical portion that laterally surrounds the conductive fill material portion 1740 (in a cylindrical configuration) and is laterally surrounded by at least one dielectric material layer (such as the planarization dielectric layer 764).

In one embodiment, each of the at least one nitrogen-containing material layer (i.e., each silicon-nitrogen material layer 1738) can have a thickness in a range from 0.1 nm to 2.0 nm, and the barrier stack 1730 can have a total thickness in a range from 3.0 nm to 25 nm. In one embodiment, each of the at least one nitrogen-containing material layer (i.e., each silicon-nitrogen material layer 1738) may be a continuous material layer having a thickness of at least 0.4 nm. In one embodiment, at least one of the at least one nitrogen-containing material layer (i.e., each silicon-nitrogen material layer 1738) may have a thickness that is less than the thickness of a monolayer of silicon (e.g., 0.2 nm or less). The thickness of each silicon-nitrogen material layer 1738 is calculated as the product of the thickness of one monolayer of the silicon-nitrogen material and the ratio of the total number of silicon atoms and nitrogen atoms within the respective silicon-nitrogen material layer to the number of silicon atoms and nitrogen atoms within one monolayer of the silicon-nitrogen material. Thus, the thickness of each silicon-nitrogen material layer 1738 is independent of the area of the respective silicon-nitrogen material layer 1738. In one embodiment, an atomic ratio of silicon to nitrogen atoms in each nitrogen-containing material layer (i.e., each silicon-nitrogen material layer 1738) can be greater than 1.0.

In one embodiment, the doped metal nitride layers 1733 can include a conductive nitride of the at least one transition metal element (such as titanium, tantalum, and tungsten). The metal-semiconductor alloy portion 744 includes an alloy of the semiconductor material of the doped semiconductor material portion 742 and a transition metal element that may be the same as, or may be different from, the at least one transition metal element of the doped metal nitride layers 1733. The atomic concentration of silicon in the doped metal nitride layers 1733 may be in a range from 0.1% to 25%, such as from 1% to 10%, although lesser and greater atomic concentrations can also be employed.

The number of doped metal nitride layers 1733 can be the same as the number of metal nitride layers 1732 prior to the activation anneal. FIG. 3B illustrates a region including a device contact via structure 782 employing the first configuration of the first exemplary barrier stack 1730 after a high temperature anneal process (such as the activation anneal process). FIG. 4B illustrates a region including a device contact via structure 782 employing the second configuration of the first exemplary barrier stack 1730 after a high temperature anneal process (such as the activation anneal process). In the second configuration, the barrier stack 1730 includes at least three doped metal nitride layers 1733 and at least two nitrogen-containing material layers (i.e., the silicon-nitrogen material layer 1738). Each of the at least two nitrogen-containing material layer is located between, and contacts, a respective pair of doped metal nitride layers 1733 among the at least three doped metal nitride layers 1733. Alternatively, one or more of the metal nitride layers 1732 is not doped and undoped metal nitride layer(s) 1732 are present in the barrier stack 1730 instead of one or more of the doped metal nitride layer layers 1733.

Figure 3C:
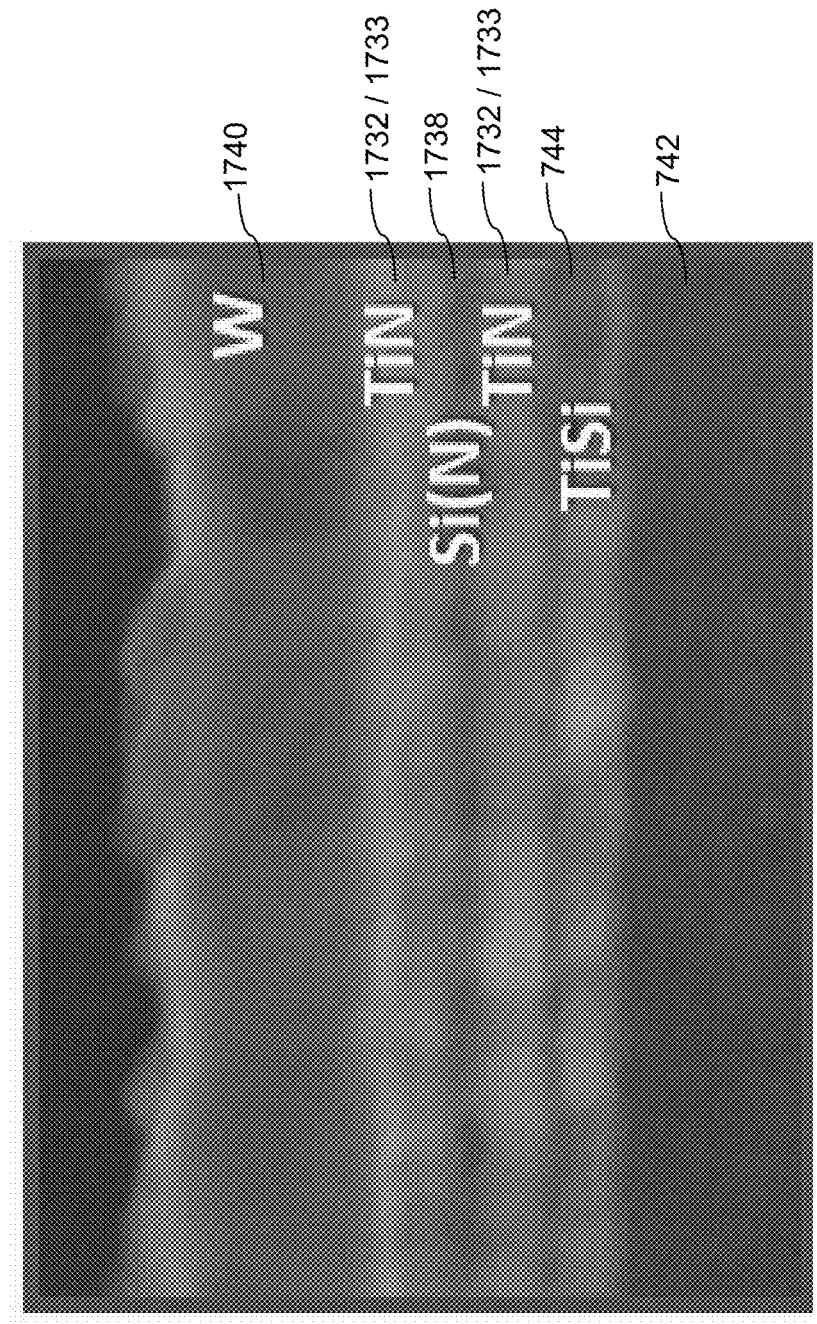
FIG. 3C is a scanning electron micrograph of a sample of the first exemplary structure that illustrates presence of a silicon-nitrogen layer as a distinct layer after an anneal.

FIG. 3C is a scanning electron micrograph of a sample of the first exemplary structure having the first configuration after an anneal process. FIG. 3C shows that the silicon-nitrogen material layer 1738 remains as a distinct layer even after the anneal process.

Figure 4C:
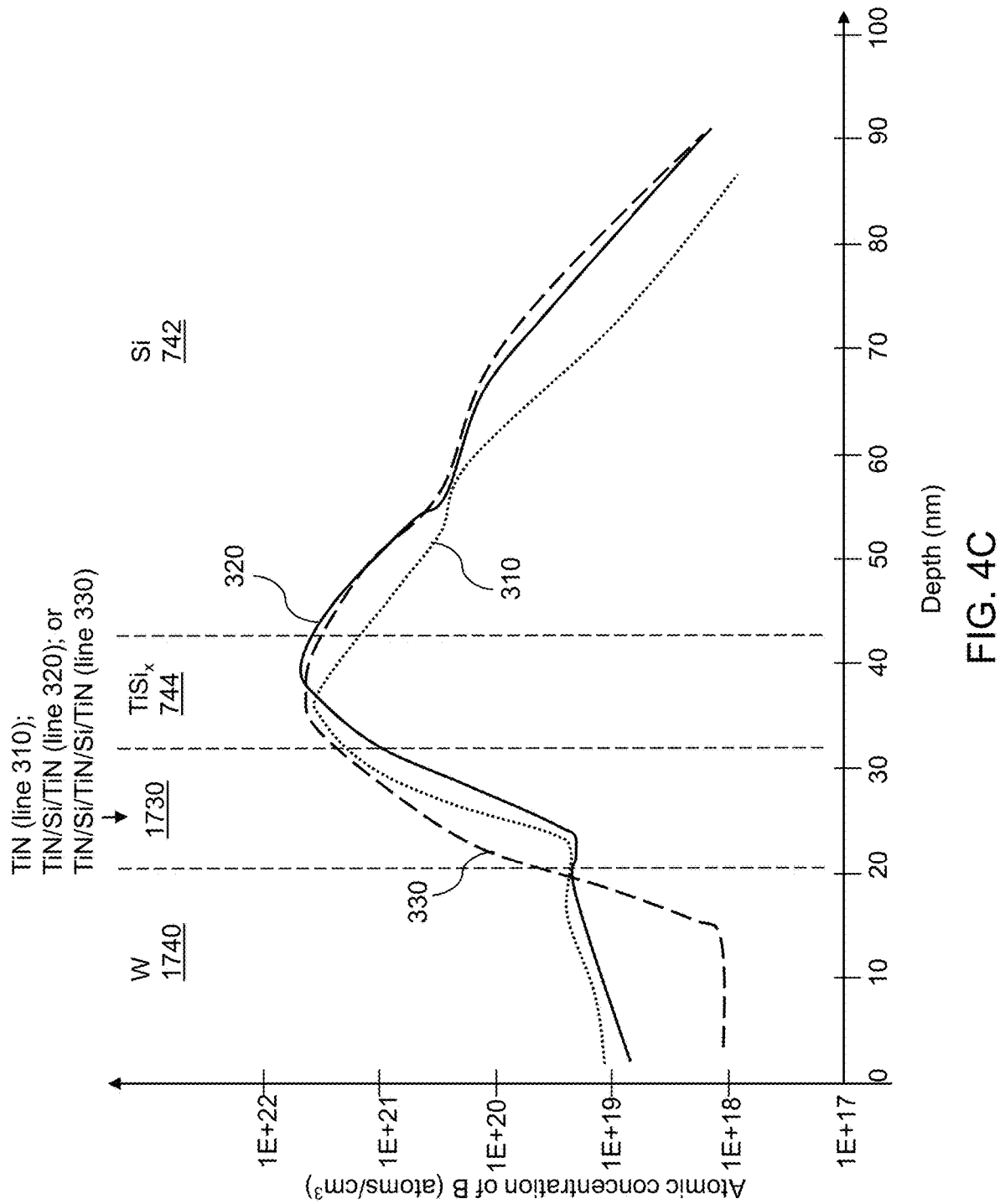
FIG. 4C illustrates plots of secondary ion mass spectroscopy (SIMS) profiles of two samples including the first exemplary barrier stack and a sample including a comparative exemplary metallic barrier layer after an anneal process.

FIG. 4C is secondary ion mass spectroscopy (SIMS) boron profiles of two samples including the first exemplary barrier stack 1730 and a sample including a comparative exemplary metallic barrier layer that consists of a single titanium nitride layer having the same thickness (i.e., 12 nm) as the two samples including the first exemplary barrier stack 1730 after an anneal process. All samples included a doped semiconductor material portion 732 including boron as a primary dopant, and a metal-semiconductor alloy portion 744 including titanium silicide. All samples included a tungsten portion as the conductive fill material portion 1740. A first curve 310 corresponds to the profile of atomic concentration of boron (within the depth resolution limit of the SIMS instrument) in the sample including the comparative exemplary metallic barrier layer. A second curve 320 corresponds to the profile of atomic concentration of boron (within the depth resolution limit of the SIMS instrument) in the sample including the first configuration of the first exemplary barrier stack 1730 illustrated in FIG. 3B. A third curve 330 corresponds to the profile of atomic concentration of boron (within the depth resolution limit of the SIMS instrument) in the sample including the second configuration of the first exemplary barrier stack 1730 illustrated in FIG. 4B.

The residual amount of boron atoms in the doped semiconductor material portion 742 and the amount of boron diffused into the tungsten portion 1740 is indicative of the effectiveness of the first exemplary barrier stack 1730 in the two samples, and of the effectiveness of the single titanium nitride barrier in the comparative exemplary sample in stopping outdiffusion of boron atoms from the respective doped semiconductor material portion 742. A lower amount of boron outdiffusion results in retaining more boron atoms in the respective doped semiconductor material portion 742 and maintaining the resistivity of the respective doped semiconductor material portion 724 low (i.e., more conductive). The residual boron concentration in the doped semiconductor material portion 742 is higher and boron concentration in the tungsten portion 1740 is lower for the second curve 320 compared to the first curve 310.

The residual boron concentration in the doped semiconductor material portion 742 is higher and boron concentration in the tungsten portion 1740 is lower for the third curve 330 compared to the first curve 310. The residual boron concentration in the doped semiconductor material portion 742 is about the same and boron concentration in the tungsten portion 1740 is lower for the third curve 330 compared to the second curve 320. Thus, use of three or more silicon-nitrogen material layers 1738 shown in FIG. 4B is expected to reduce the diffusion of boron atoms through the first barrier stack 1730 of the present disclosure even more because of capture of diffusing boron atoms within each silicon-nitrogen material layer 1738.

Figure 5:
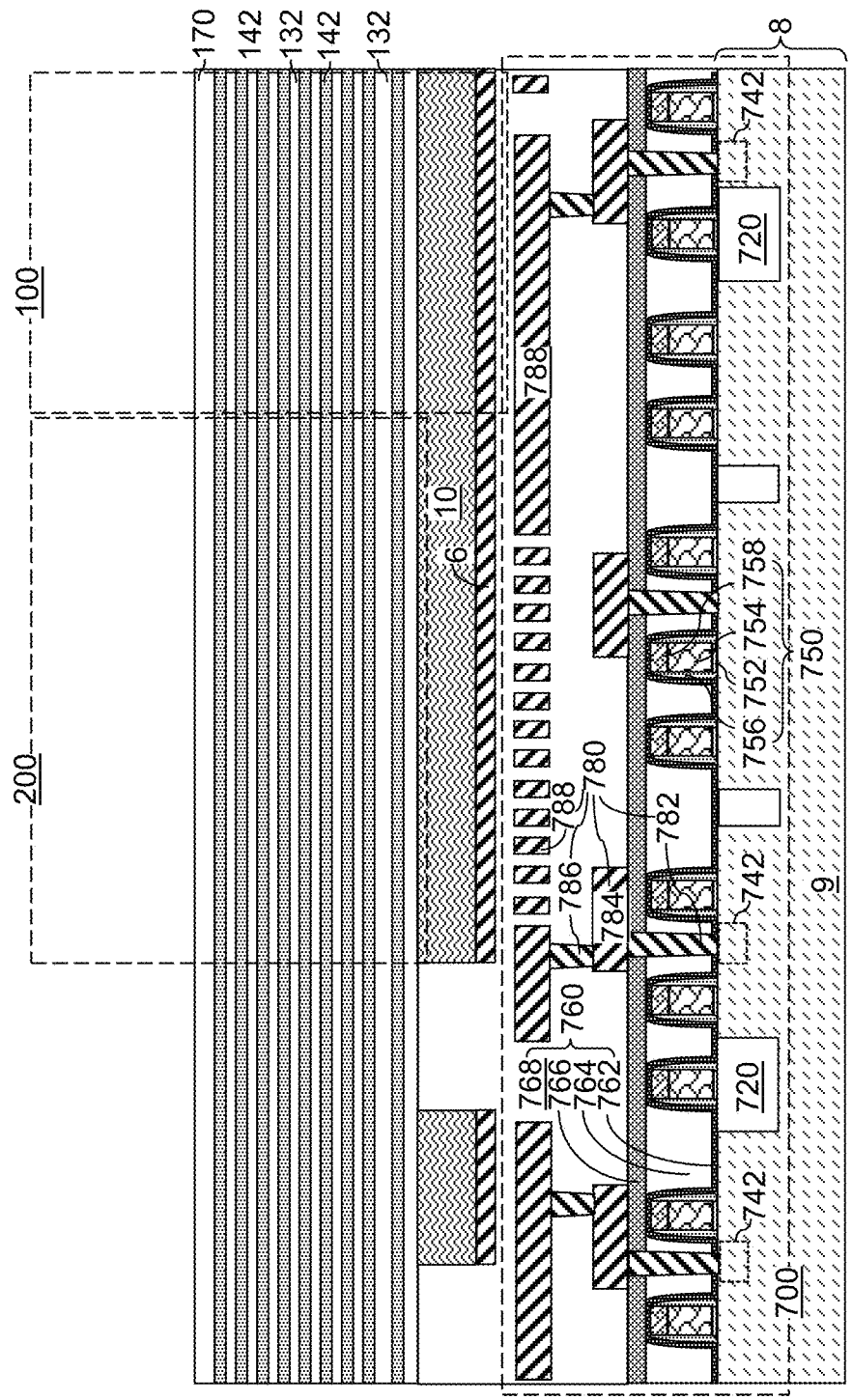
FIG. 5 is a vertical cross-sectional view of the exemplary structure after formation of a planar semiconductor material layer and a first-tier alternating stack of first insulting layers and first spacer material layers according to an embodiment of the present disclosure.

Referring to FIG. 5, an optional planar conductive material layer 6 and a planar semiconductor material layer 10 can be formed over the underlying peripheral device region 700. The optional planar conductive material layer 6 includes a conductive material such as a metal or a heavily doped semiconductor material. The optional planar conductive material layer 6, for example, may include a tungsten layer having a thickness in a range from 3 nm to 100 nm, although lesser and greater thicknesses can also be employed. A metal nitride layer (not shown) may be provided as a diffusion barrier layer on top of the planar conductive material layer 6. Layer 6 may function as a special source line in the completed device. Alternatively, layer 6 may comprise an etch stop layer and may comprise any suitable conductive, semiconductor or insulating layer.

The planar semiconductor material layer 10 can be formed over the at least one lower level dielectric layer 760. The planar semiconductor material layer 10 includes a semiconductor material, which can include at least one elemental semiconductor material, at least one III-V compound semiconductor material, at least one II-VI compound semiconductor material, at least one organic semiconductor material, and/or other semiconductor materials known in the art. In one embodiment, the planar semiconductor material layer 10 can include a polycrystalline semiconductor material (such as polysilicon), or an amorphous semiconductor material (such as amorphous silicon) that is converted into a polycrystalline semiconductor material in a subsequent processing step (such as an anneal step). The planar semiconductor material layer 10 can be formed directly above a subset of the semiconductor devices on the semiconductor substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 9). In one embodiment, the planar semiconductor material layer 10 or portions thereof can be doped with electrical dopants, which may be p-type dopants or n-type dopants. The conductivity type of the dopants in the planar semiconductor material layer 10 is herein referred to as a first conductivity type. A dielectric pad layer 52 can be formed on the top surface of the planar semiconductor material layer 10.

An alternating stack of first material layers and second material layers is subsequently formed. Each first material layer can include a first material, and each second material layer can include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack can include first insulting layers 132 as the first material layers, and first spacer material layers as the second material layers. In one embodiment, the first spacer material layers can be sacrificial material layers that are subsequently replaced with electrically conductive layers. In another embodiment, the first spacer material layers can be electrically conductive layers that are not subsequently replaced with other layers. While the present disclosure is described employing embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. An alternating plurality of first insulating layers 132 and first sacrificial material layers 142 is formed over the planar semiconductor material layer 10. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. In one embodiment, the first sacrificial material layers 142 can be material layers that comprise silicon nitride.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first-tier alternating stack (132, 142) can have a uniform thickness that is substantially invariant within each respective first sacrificial material layer 142.

A first insulating cap layer 170 is subsequently formed over the stack (132, 142). The first insulating cap layer 170 includes a dielectric material, which can be any dielectric material that can be employed for the first insulating layers 132. In one embodiment, the first insulating cap layer 170 includes the same dielectric material as the first insulating layers 132. The thickness of the insulating cap layer 170 can be in a range from 20 nm to 300 nm, although lesser and greater thicknesses can also be employed.

Figure 6:
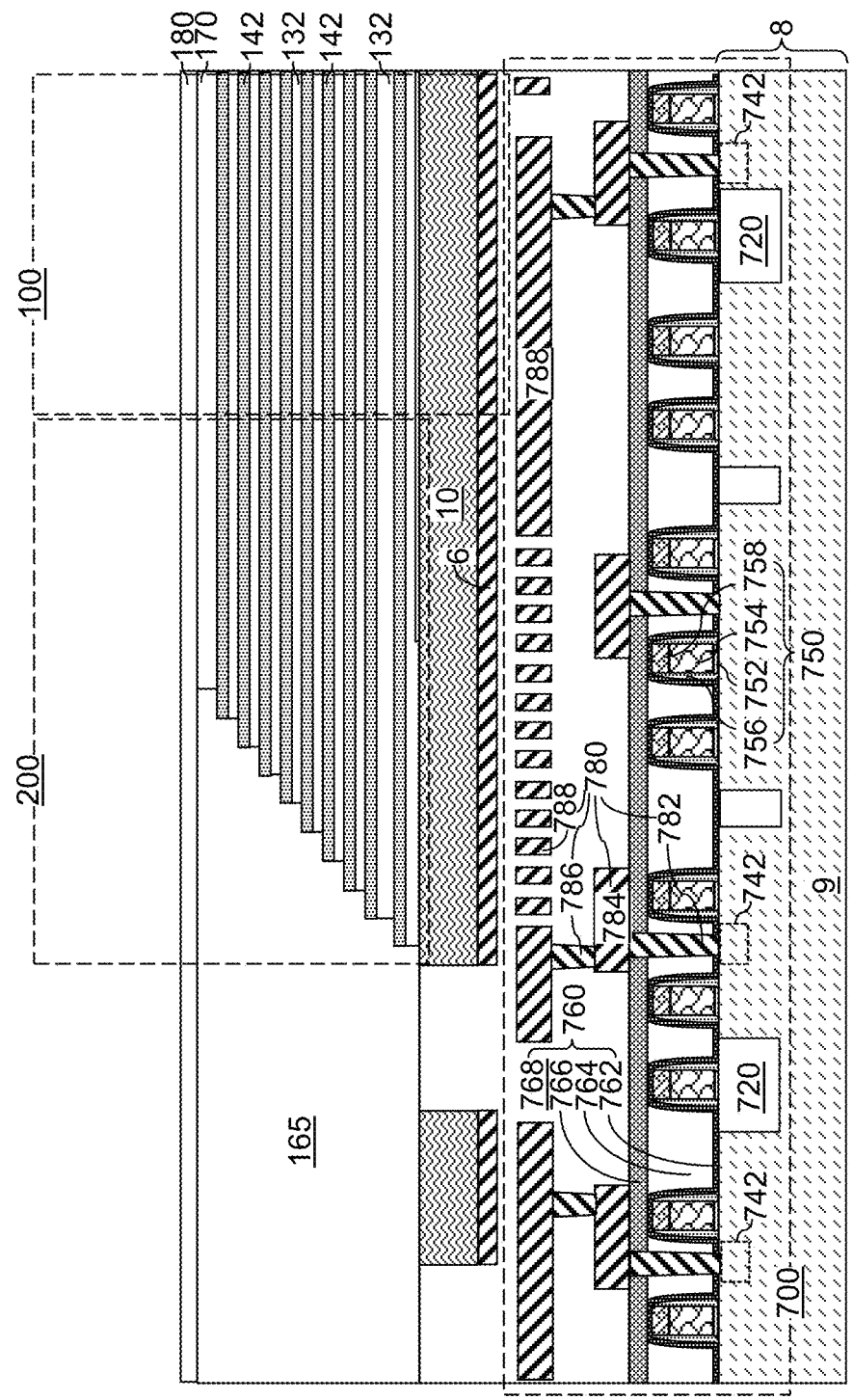
FIG. 6 is a vertical cross-sectional view of the exemplary structure after patterning first-tier staircase regions on the first-tier alternating stack and forming a first-tier retro-stepped dielectric material portion according to an embodiment of the present disclosure.

Referring to FIG. 6, the first insulating cap layer 170 and the first-tier alternating stack (132, 142) can be patterned to form first stepped surfaces in the word line contact via region 200. The word line contact via region 200 can include a respective first stepped area in which the first stepped surfaces are formed, and a second stepped area in which additional stepped surfaces are to be subsequently formed in a second tier structure (to be subsequently formed over a first tier structure) and/or additional tier structures. The first stepped surfaces can be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. A dielectric material can be deposited to fill the first stepped cavity to form a first-tier retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first-tier retro-stepped dielectric material portion 165 collectively constitute a first tier structure, which is an in-process structure that is subsequently modified.

Figure 7A:
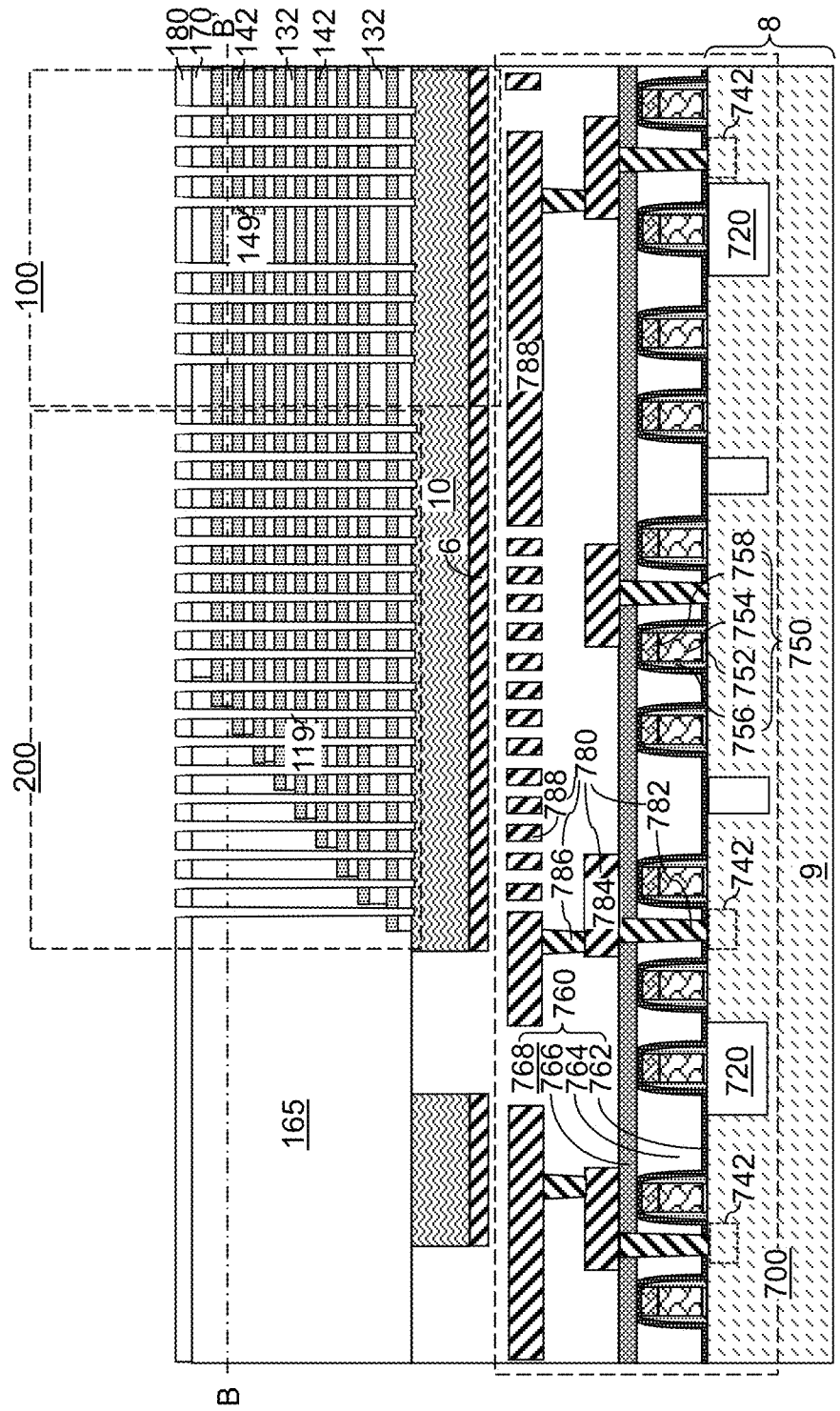
FIG. 7A is a vertical cross-sectional view of the exemplary structure after formation of first-tier memory openings and first tier support openings according to an embodiment of the present disclosure.
Figure 7B:
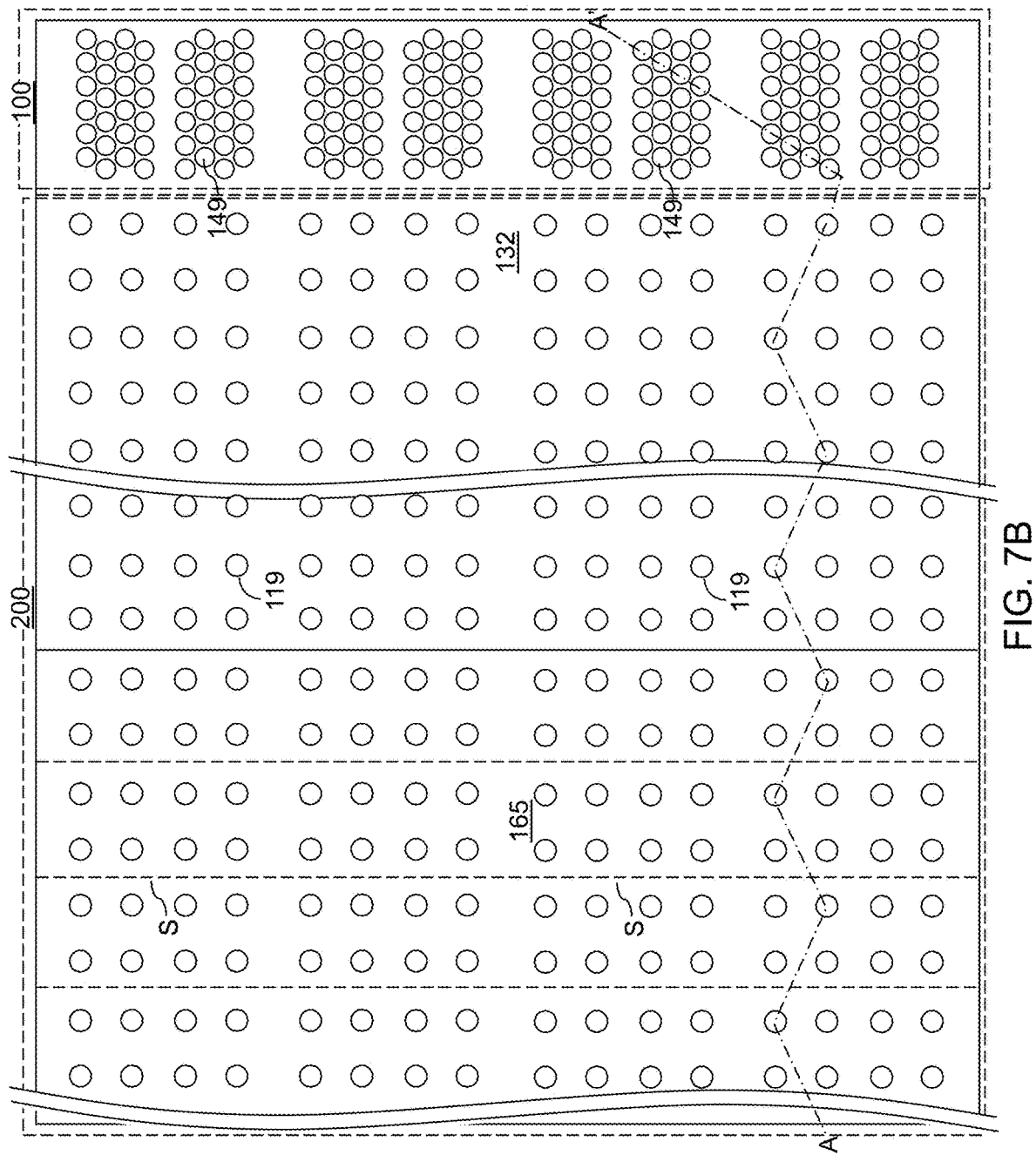
FIG. 7B is a horizontal cross-sectional view of the exemplary structure along the horizontal plane B-B' in FIG. 7A. The zig-zag vertical plane A-A' corresponds to the plane of the vertical cross-sectional view of FIG. 7A.

Referring to FIGS. 7A and 7B, an inter-tier dielectric layer 180 may be optionally deposited over the first tier structure (132, 142, 165, 170). The inter-tier dielectric layer 180 includes a dielectric material such as silicon oxide. The thickness of the inter-tier dielectric layer 180 can be in a range from 30 nm to 300 nm, although lesser and greater thicknesses can also be employed. Locations of steps S in the first-tier alternating stack (132, 142) are illustrated as dotted lines.

First-tier memory openings 149 and first tier support openings 119 can be formed. The first-tier memory openings 149 and the first-tier support openings 119 extend through the first-tier alternating stack (132, 142) at least to a top surface of the planar semiconductor material layer 10. The first-tier memory openings 149 can be formed in the memory array region 100 at locations at which memory stack structures including vertical stacks of memory elements are to be subsequently formed. The first-tier support openings 119 can be formed in the word line contact via region 200. For example, a lithographic material stack (not shown) including at least a photoresist layer can be formed over the first insulating cap layer 170 (and the optional inter-tier dielectric layer 180, if present), and can be lithographically patterned to form openings within the lithographic material stack. The pattern in the lithographic material stack can be transferred through the first insulating cap layer 170 (and the optional inter-tier dielectric layer 180), and through the entirety of the first-tier alternating stack (132, 142) by at least one anisotropic etch that employs the patterned lithographic material stack as an etch mask. Portions of the first insulating cap layer 170 (and the optional inter-tier dielectric layer 180), and the first-tier alternating stack (132, 142) underlying the openings in the patterned lithographic material stack are etched to form the first-tier memory openings 149 and the first-tier support openings 119. In other words, the transfer of the pattern in the patterned lithographic material stack through the first insulating cap layer 170 and the first-tier alternating stack (132, 142) forms the first-tier memory openings 149 and the first-tier support openings 119.

In one embodiment, the chemistry of the anisotropic etch process employed to etch through the materials of the first-tier alternating stack (132, 142) can alternate to optimize etching of the first and second materials in the first-tier alternating stack (132, 142). The anisotropic etch can be, for example, a series of reactive ion etches or a single etch (e.g., $CF_4/O_2/Ar$ etch). The sidewalls of the first-tier memory openings 149 and the support openings 119 can be substantially vertical, or can be tapered. Subsequently, the patterned lithographic material stack can be subsequently removed, for example, by ashing.

Optionally, the portions of the first-tier memory openings 149 and the first-tier support openings 119 at the level of the inter-tier dielectric layer 180 can be laterally expanded by an isotropic etch. For example, if the inter-tier dielectric layer 180 comprises a dielectric material (such as borosilicate glass) having a greater etch rate than the first insulating layers 132 (that can include undoped silicate glass), an isotropic etch (such as a wet etch employing HF) can be employed to expand the lateral dimensions of the first-tier memory openings at the level of the inter-tier dielectric layer 180. The portions of the first-tier memory openings 149 (and the first-tier support openings 119) located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 8:
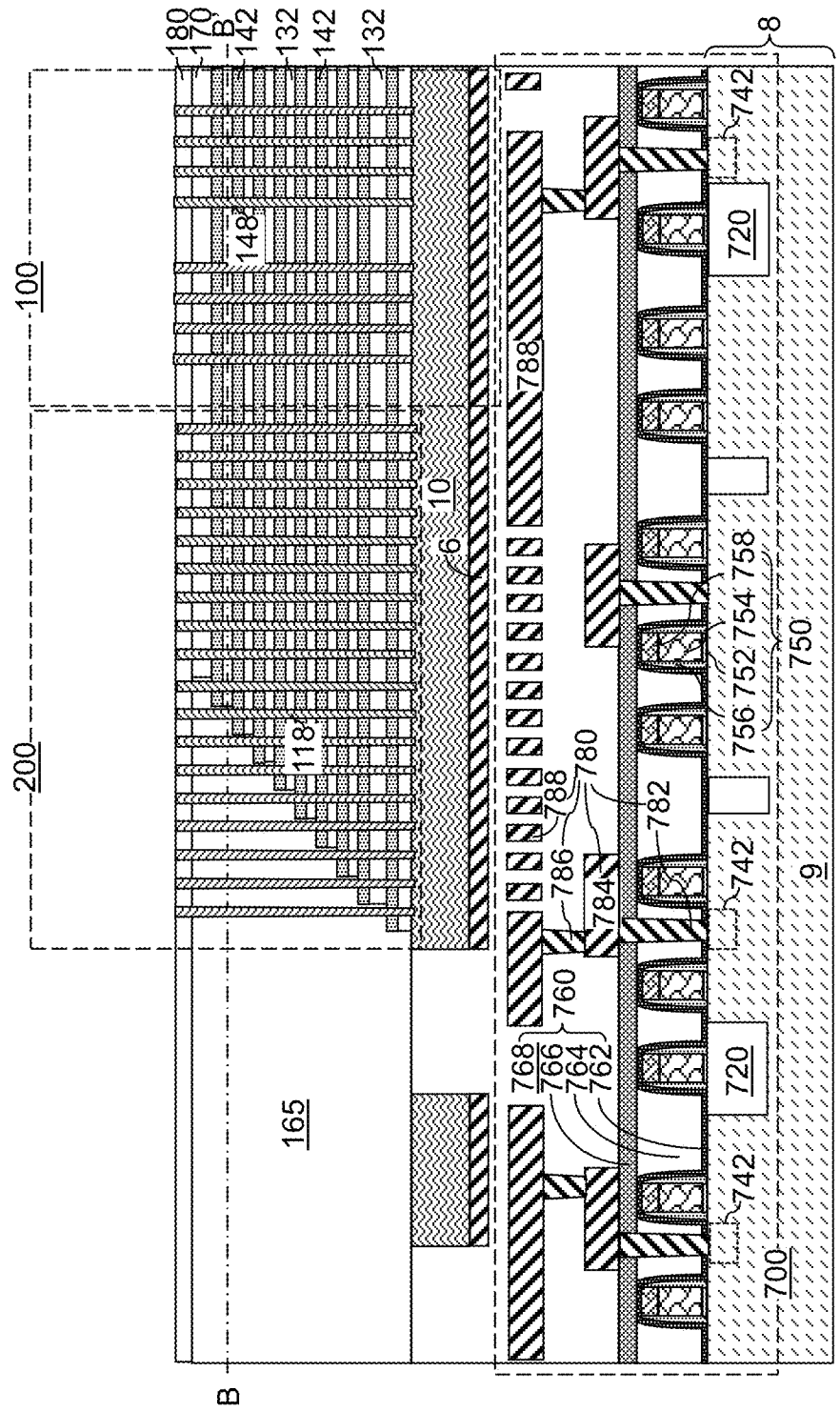
FIG. 8 is a vertical cross-sectional view of the exemplary structure after formation of sacrificial memory opening fill portions and sacrificial support opening fill portions according to an embodiment of the present disclosure.

Referring to FIG. 8, sacrificial memory opening fill portions 148 can be formed in the first-tier memory openings 149, and sacrificial support opening fill portions 118 can be formed in the first-tier support openings 119. For example, a sacrificial fill material layer is deposited in the first-tier memory openings 149 and the first-tier support openings 119. The sacrificial fill material layer includes a sacrificial material which can be subsequently removed selective to the materials of the first insulating layers 132 and the first sacrificial material layers 142. In one embodiment, the sacrificial fill material layer can include a semiconductor material such as silicon (e.g., a-Si or polysilicon), a silicon-germanium alloy, germanium, a III-V compound semiconductor material, or a combination thereof. Optionally, a thin etch stop layer (such as a silicon oxide layer having a thickness in a range from 1 nm to 3 nm) may be employed prior to depositing the sacrificial fill material layer. The sacrificial fill material layer may be formed by a non-conformal deposition or a conformal deposition method. In another embodiment, the sacrificial fill material layer can include amorphous silicon or a carbon-containing material (such as amorphous carbon or diamond-like carbon) that can be subsequently removed by ashing.

Portions of the deposited sacrificial material can be removed from above the first insulating cap layer 170 (and the optional inter-tier dielectric layer 180, if present). For example, the sacrificial fill material layer can be recessed to a top surface of the first insulating cap layer 170 (and the optional inter-tier dielectric layer 180) employing a planarization process. The planarization process can include a recess etch, chemical mechanical planarization (CMP), or a combination thereof. The top surface of the first insulating layer 170 (and optionally layer 180 if present) can be employed as an etch stop layer or a planarization stop layer. Each remaining portion of the sacrificial material in a first-tier memory opening 149 constitutes a sacrificial memory opening fill portion 148. Each remaining portion of the sacrificial material in a first-tier support opening 119 constitutes a sacrificial support opening fill portion 118. The top surfaces of the sacrificial memory opening fill portions 148 and the sacrificial support opening fill portions 118 can be coplanar with the top surface of the inter-tier dielectric layer 180 (or the first insulating cap layer 170 if the inter-tier dielectric layer 180 is not present). The sacrificial memory opening fill portion 148 and the sacrificial support opening fill portions 118 may, or may not, include cavities therein.

Figure 9:
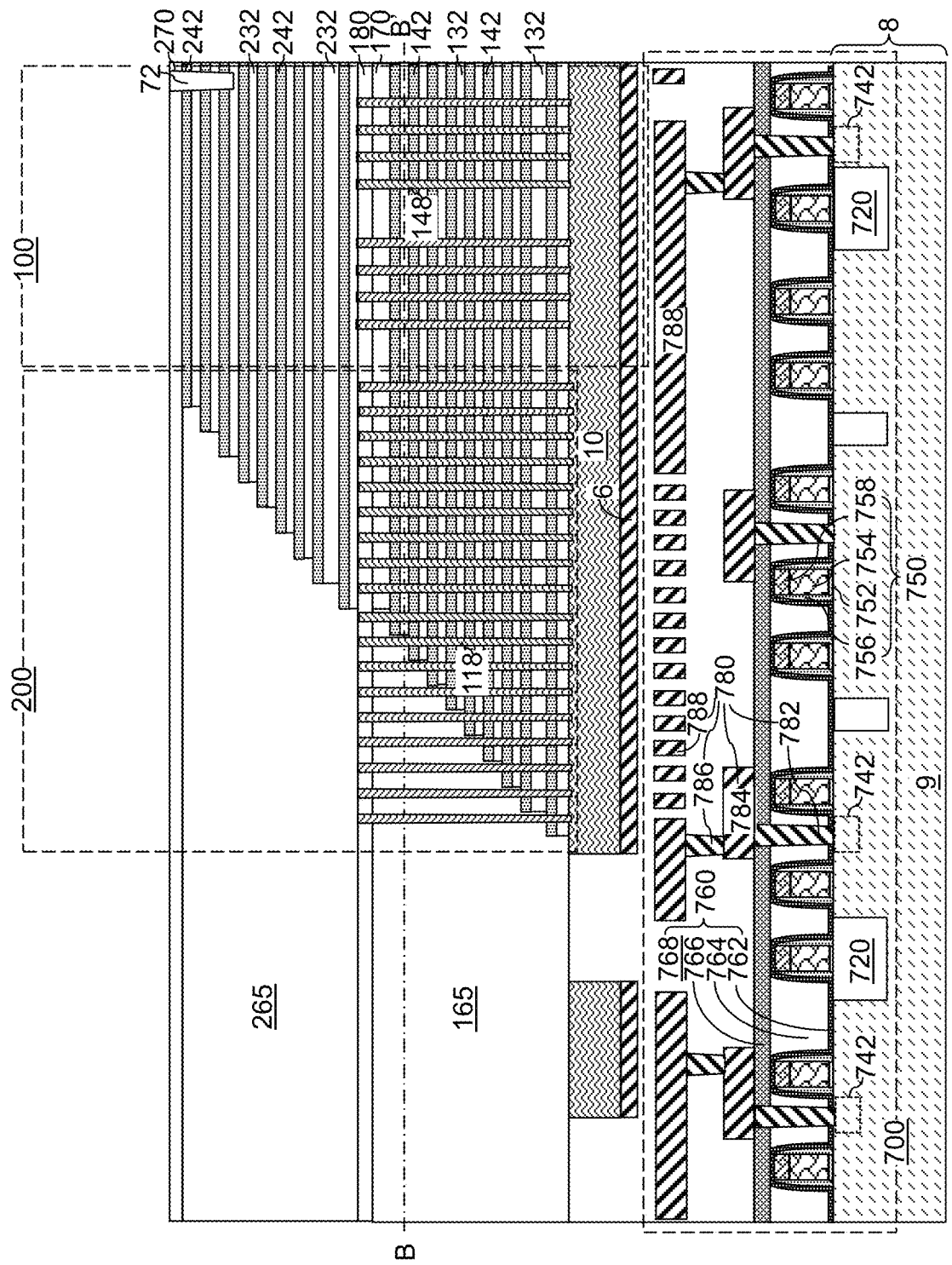
FIG. 9 is a vertical cross-sectional view of the exemplary structure after formation of a second-tier alternating stack of second insulating layers and second spacer material layers, a second-tier retro-stepped dielectric material portion, and a second insulating cap layer according to an embodiment of the present disclosure.

Referring to FIG. 9, a second tier structure can be formed over the first tier structure (132, 142, 170, 148, 118). The second tier structure can include an additional alternating stack of insulating layers and spacer material layers, which can be sacrificial material layers. For example, a second alternating stack (232, 242) of material layers can be subsequently formed on the top surface of the first alternating stack (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second stack (232, 242) can have a uniform thickness that is substantially invariant within each respective second sacrificial material layer 242.

Second stepped surfaces in the second stepped area can be formed in the word line contact via region 200 employing a same set of processing steps as the processing steps employed to form the first stepped surfaces in the first stepped area with suitable adjustment to the pattern of at least one masking layer. A second-tier retro-stepped dielectric material portion 265 can be formed over the second stepped surfaces in the word line contact via region 200.

A second insulating cap layer 270 can be subsequently formed over the second alternating stack (232, 242). The second insulating cap layer 270 includes a dielectric material that is different from the material of the second sacrificial material layers 242. In one embodiment, the second insulating cap layer 270 can include silicon oxide. In one embodiment, the first and second sacrificial material layers (142, 242) can comprise silicon nitride.

Generally speaking, at least one alternating stack of insulating layers (132, 232) and spacer material layers (such as sacrificial material layers (142, 242)) can be formed over the planar semiconductor material layer 10, and at least one retro-stepped dielectric material portion (165, 265) can be formed over the staircase regions on the at least one alternating stack (132, 142, 232, 242).

Optionally, drain-select-level shallow trench isolation structures 72 can be formed through a subset of layers in an upper portion of the second-tier alternating stack (232, 242). The second sacrificial material layers 242 that are cut by the select-drain-level shallow trench isolation structures 72 correspond to the levels in which drain-select-level electrically conductive layers are subsequently formed. The drain-select-level shallow trench isolation structures 72 include a dielectric material such as silicon oxide.

Figure 10A:
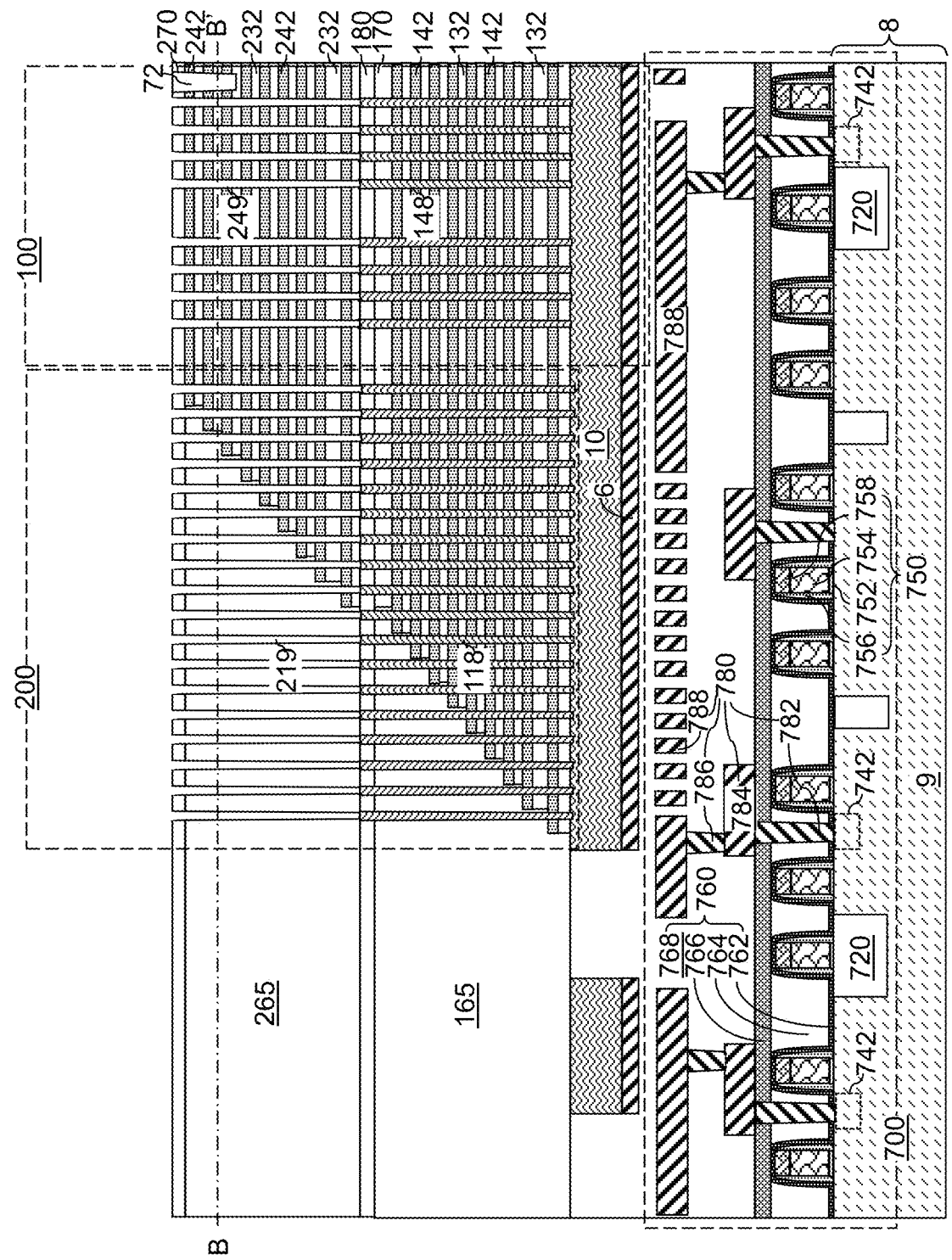
FIG. 10A is a vertical cross-sectional view of the exemplary structure after formation of inter-tier memory openings and inter-tier support openings according to an embodiment of the present disclosure.
Figure 10B:
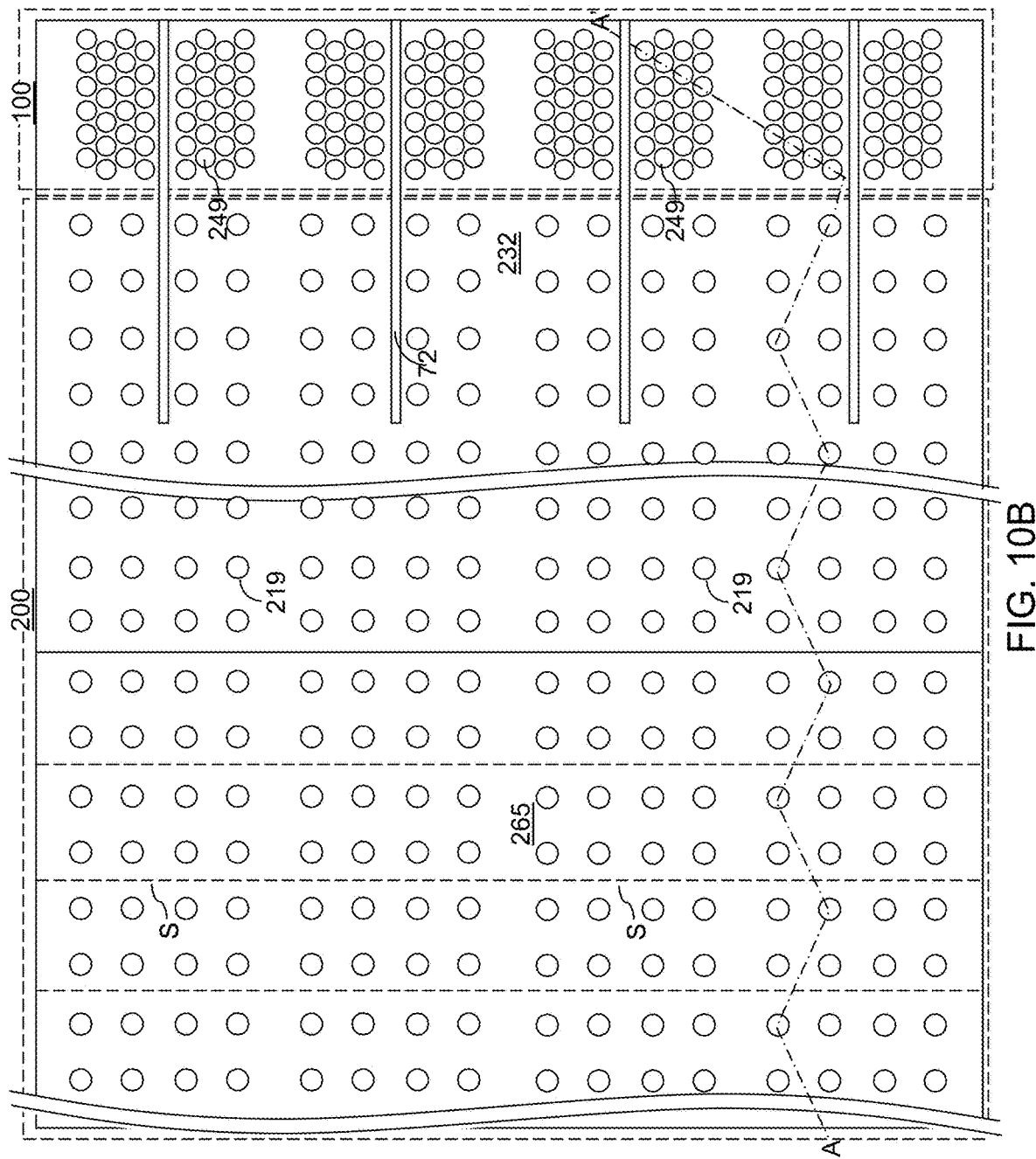
FIG. 10B is a horizontal cross-sectional view of the exemplary structure along the horizontal plane B-B' in FIG.

Referring to FIGS. 10A and 10B, second-tier memory openings 249 and second tier support openings 219 extending through the second tier structure (232, 242, 270, 265) are formed in areas overlying the sacrificial memory opening fill portions 148. A photoresist layer can be applied over the second tier structure (232, 242, 270, 265), and can be lithographically patterned to form a same pattern as the pattern of the sacrificial memory opening fill portions 148 and the sacrificial support opening fill portions 118, i.e., the pattern of the first-tier memory openings 149 and the first-tier support openings 119. Thus, the lithographic mask employed to pattern the first-tier memory openings 149 and the first-tier support openings 119 can be employed to pattern the second-tier memory openings 249 and the second-tier support openings 219. An anisotropic etch can be performed to transfer the pattern of the lithographically patterned photoresist layer through the second tier structure (232, 242, 270, 265). In one embodiment, the chemistry of the anisotropic etch process employed to etch through the materials of the second-tier alternating stack (232, 242) can alternate to optimize etching of the alternating material layers in the second-tier alternating stack (232, 242). The anisotropic etch can be, for example, a series of reactive ion etches. The patterned lithographic material stack can be removed, for example, by ashing after the anisotropic etch process.

A top surface of an underlying sacrificial memory opening fill portion 148 can be physically exposed at the bottom of each second-tier memory opening 249. A top surface of an underlying sacrificial support opening fill portion 118 can be physically exposed at the bottom of each second-tier support opening 219. After the top surfaces of the sacrificial memory opening fill portions 148 and the sacrificial support opening fill portions 118 are physically exposed, an etch process can be performed, which removes the sacrificial material of the sacrificial memory opening fill portions 148 and the sacrificial support opening fill portions 118 selective to the materials of the second-tier alternating stack (232, 242) and the first-tier alternating stack (132, 142) (e.g., $C_4F_8/O_2/Ar$ etch).

Upon removal of the sacrificial memory opening fill portions 148, each vertically adjoining pair of a second-tier memory opening 249 and a first-tier memory opening 149 forms a continuous cavity that extends through the first-tier alternating stack (132, 142) and the second-tier alternating stack (232, 242). Likewise, upon removal of the sacrificial support opening fill portions 118, each vertically adjoining pair of a second-tier support opening 219 and a first-tier support opening 119 forms a continuous cavity that extends through the first-tier alternating stack (132, 142) and the second-tier alternating stack (232, 242). The continuous cavities are herein referred to as memory openings (or inter-tier memory openings) and support openings (or inter-tier support openings), respectively. A top surface of the planar semiconductor material layer 10 can be physically exposed at the bottom of each memory opening and at the bottom of each support openings. Locations of steps S in the first-tier alternating stack (132, 142) and the second-tier alternating stack (232, 242) are illustrated as dotted lines.

Referring to FIG. 11, memory opening fill structures 58 are formed within each memory opening, and support pillar structures 20 are formed within each support opening. The memory opening fill structures 58 and the support pillar structures 20 can include a same set of components, and can be formed simultaneously.

FIGS. 12A-12H provide sequential cross-sectional views of a memory opening 49 or a support opening (119, 219) during formation of a memory opening fill structure 58 or a support pillar structure 20. While a structural change in a memory opening 49 is illustrated in FIGS. 12A-12H, it is understood that the same structural change occurs in each memory openings 49 and in each of the support openings (119, 219) during the same set of processing steps.

Figure 12A:
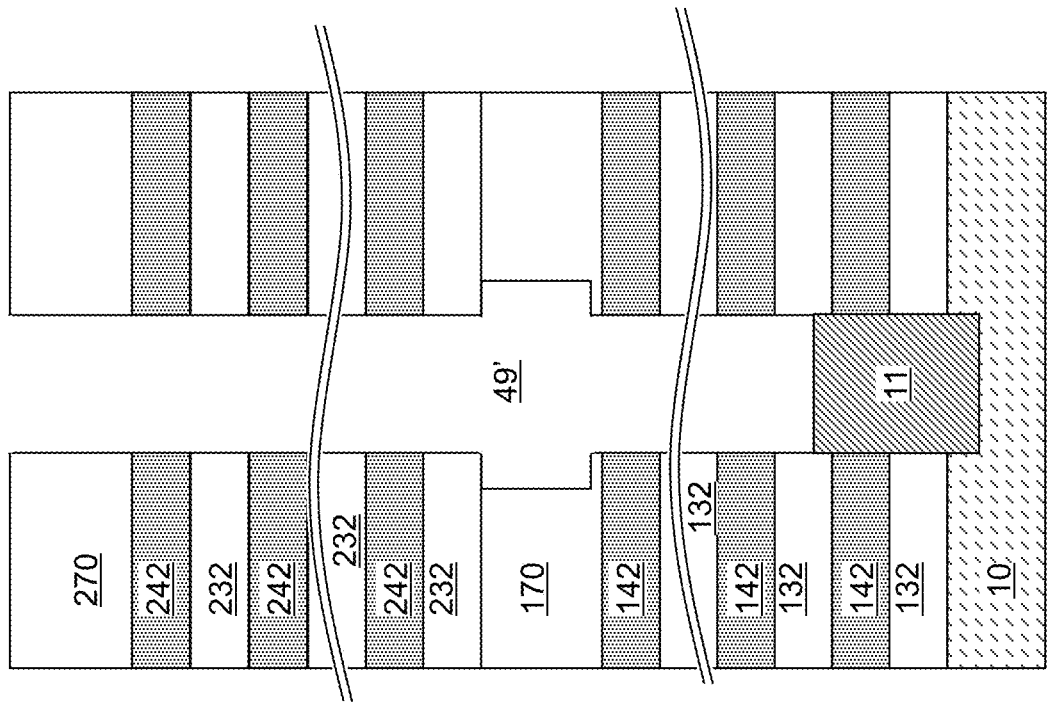

Referring to FIG. 12A, a memory opening 49 in the exemplary device structure of FIG. 11 is illustrated. The memory opening 49 extends through the first tier structure and the second tier structure. Likewise, each support opening (119, 219) extends through the first tier structure and the second tier structure.

Figure 12B:
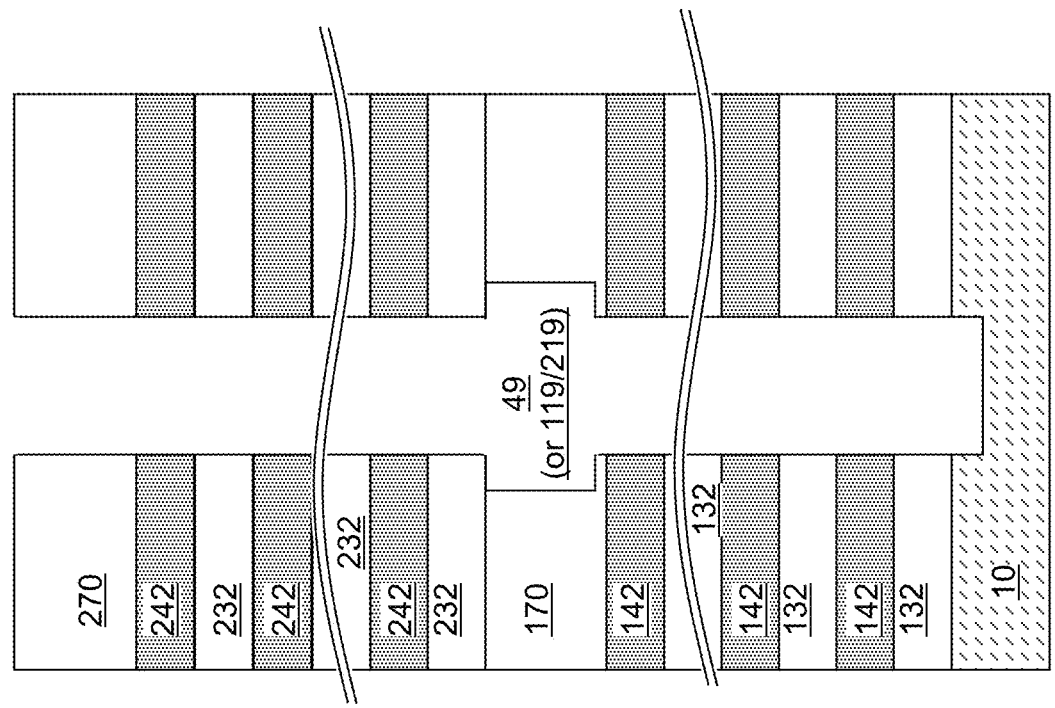

Referring to FIG. 12B, an optional pedestal channel portion (e.g., an epitaxial pedestal) 11 can be formed at the bottom portion of each memory opening 49 and each support openings (119, 219), for example, by a selective semiconductor deposition process. In one embodiment, the pedestal channel portion 11 can be doped with electrical dopants of the same conductivity type as the planar semiconductor material layer 10. In one embodiment, at least one source select gate electrode can be subsequently formed by replacing each sacrificial material layer 42 located below the horizontal plane including the top surfaces of the pedestal channel portions 11 with a respective conductive material layer. A cavity 49' is present in the unfilled portion of the memory opening 49 (or of the support opening) above the pedestal channel portion 11. In one embodiment, the pedestal channel portion 11 can comprise single crystalline silicon. In one embodiment, the pedestal channel portion 11 can have a doping of the same as the conductivity type of the planar semiconductor material layer 10.

Referring to FIG. 12C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) can have vertically coincident sidewalls, and the charge storage layer 54 can be formed as a single continuous layer.

In another embodiment, the sacrificial material layers (142, 242) can be laterally recessed with respect to the sidewalls of the insulating layers (132, 232), and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art.

In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A cavity 49' is formed in the volume of each memory opening 49 that is not filled with the deposited material layers (52, 54, 56, 601).

Referring to FIG. 12D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the second insulating cap layer 270 can be removed by the at least one anisotropic etch process. Further, the horizontal portions of the first semiconductor channel layer 601, the tunneling dielectric layer 56, the charge storage layer 54, and the blocking dielectric layer 52 at a bottom of each cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers (142, 242) constitutes a charge storage region.

A surface of the pedestal channel portion 11 (or a surface of the planar semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each cavity 49' can be vertically recessed so that the recessed semiconductor surface underneath the cavity 49' is vertically offset from the topmost surface of the pedestal channel portion 11 (or of the planar semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 12E, a second semiconductor channel layer 602 can be deposited directly on the semiconductor surface of the pedestal channel portion 11 or the semiconductor substrate layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 12F, in case the cavity 49' in each memory opening is not completely filled by the second semiconductor channel layer 602, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 12H:
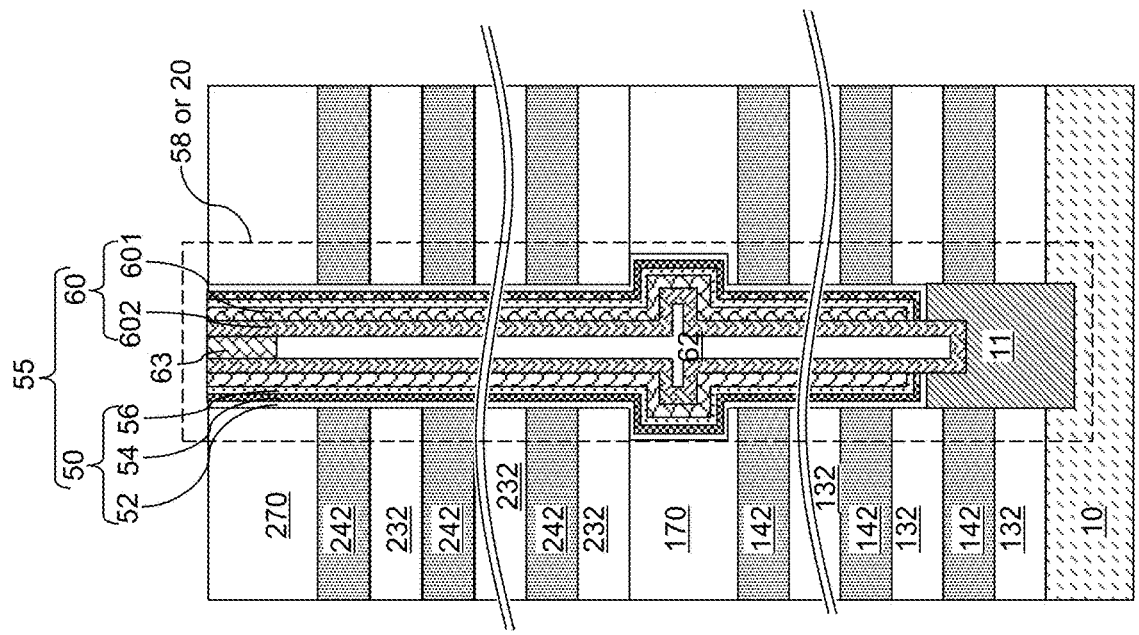
Figure 12G:
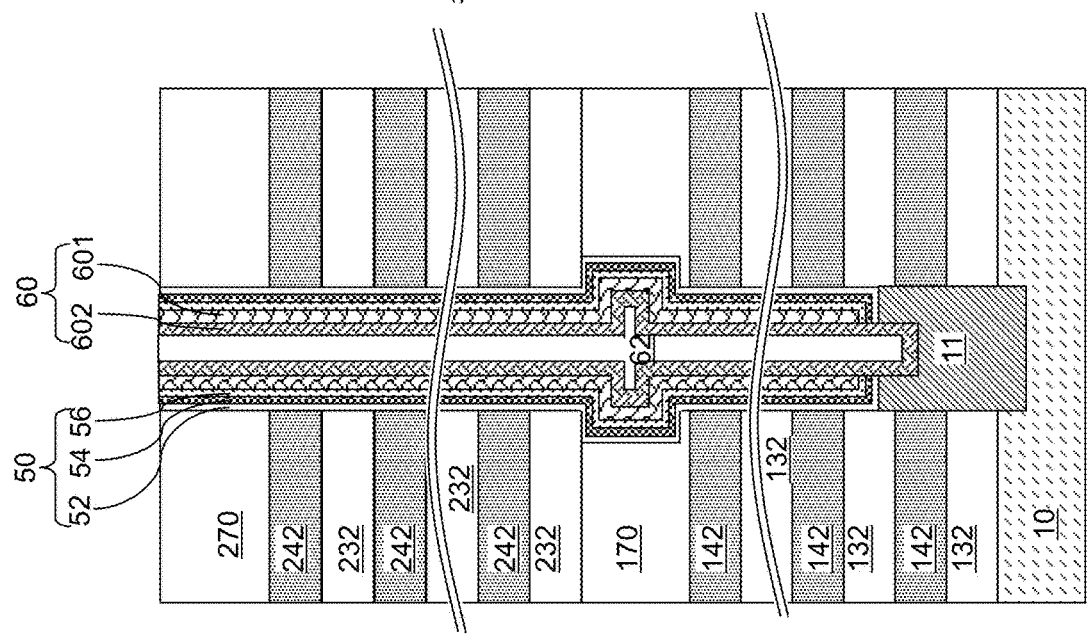

Referring to FIG. 12G, the horizontal portion of the dielectric core layer 62L can be removed, for example, by a recess etch from above the top surface of the second insulating cap layer 270. Each remaining portion of the dielectric core layer 62L constitutes a dielectric core 62. Further, the horizontal portion of the second semiconductor channel layer 602 located above the top surface of the second insulating cap layer 270 can be removed by a planarization process, which can employ a recess etch or chemical mechanical planarization (CMP). Each remaining portion of the second semiconductor channel layer 602 can be located entirety within a memory opening 49 or entirely within a support opening (119, 219).

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 12H, the top surface of each dielectric core 62 can be further recessed within each memory opening, for example, by a recess etch to a depth that is located between the top surface of the second insulating cap layer 270 and the bottom surface of the second insulating cap layer 270. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the second insulating cap layer 270, for example, by chemical mechanical planarization (CMP) or a recess etch to form the drain regions 63.

Each combination of a memory film 50 and a vertical semiconductor channel 60 (which is a vertical semiconductor channel) within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within a memory opening 49 constitutes a memory opening fill structure 58. Each combination of a pedestal channel portion 11 (if present), a memory film 50, a vertical semiconductor channel 60, a dielectric core 62, and a drain region 63 within each support opening (119, 219) fills the respective support openings (119, 219), and constitutes a support pillar structure 20.

The first tier structure (132, 142, 170, 165), the second tier structure (232, 242, 270, 265), the inter-tier dielectric layer 180, the memory opening fill structures 58, and the support pillar structures 20 collectively constitute a memory-level assembly. The memory-level assembly is formed over the planar semiconductor material layer 10 such that the planar semiconductor material layer 10 includes horizontal semiconductor channels electrically connected to vertical semiconductor channels 60 within the memory stack structures 55.

Referring to FIGS. 13A and 13B, a first contact level dielectric layer 280 can be formed over the memory-level assembly. The first contact level dielectric layer 280 is formed at a contact level through which various contact via structures are subsequently formed to the drain regions 63 and the various electrically conductive layers that replaces the sacrificial material layers (142, 242) in subsequent processing steps.

Backside contact trenches 79 are subsequently formed through the first contact level dielectric layer 280 and the memory-level assembly. For example, a photoresist layer can be applied and lithographically patterned over the first contact level dielectric layer 280 to form elongated openings that extend along a first horizontal direction hd1. An anisotropic etch is performed to transfer the pattern in the patterned photoresist layer through the first contact level dielectric layer 280 and the memory-level assembly to a top surface of the planar semiconductor material layer 10. The photoresist layer can be subsequently removed, for example, by ashing.

The backside contact trenches 79 extend along the first horizontal direction hd1, and thus, are elongated along the first horizontal direction hd1. The backside contact trenches 79 can be laterally spaced among one another along a second horizontal direction hd2, which can be perpendicular to the first horizontal direction hd1. The backside contact trenches 79 can extend through the memory array region 100 and the word line contact via region 200. The fist subset of the backside contact trenches 79 laterally divides the memory-level assembly.

Referring to FIG. 14, an etchant that selectively etches the materials of the first and second sacrificial material layers (142, 242) with respect to the materials of the first and second insulating layers (132, 232), the first and second insulating cap layers (170, 270), and the material of the outermost layer of the memory films 50 can be introduced into the backside contact trenches 79, for example, employing an isotropic etch process. First backside recesses are formed in volumes from which the first sacrificial material layers 142 are removed. Second backside recesses are formed in volumes from which the second sacrificial material layers 242 are removed. In one embodiment, the first and second sacrificial material layers (142, 242) can include silicon nitride, and the materials of the first and second insulating layers (132, 232), can be silicon oxide. In another embodiment, the first and second sacrificial material layers (142, 242) can include a semiconductor material such as germanium or a silicon-germanium alloy, and the materials of the first and second insulating layers (132, 232) can be selected from silicon oxide and silicon nitride.

The isotropic etch process can be a wet etch process employing a wet etch solution, or can be a gas phase (dry) etch process in which the etchant is introduced in a vapor phase into the backside contact trench 79. For example, if the first and second sacrificial material layers (142, 242) include silicon nitride, the etch process can be a wet etch process in which the exemplary structure is immersed within a wet etch tank including phosphoric acid, which etches silicon nitride selective to silicon oxide, silicon, and various other materials employed in the art. In case the sacrificial material layers (142, 242) comprise a semiconductor material, a wet etch process (which may employ a wet etchant such as a KOH solution) or a dry etch process (which may include gas phase HCl) may be employed.

Each of the first and second backside recesses can be a laterally extending cavity having a lateral dimension that is greater than the vertical extent of the cavity. In other words, the lateral dimension of each of the first and second backside recesses can be greater than the height of the respective backside recess. A plurality of first backside recesses can be formed in the volumes from which the material of the first sacrificial material layers 142 is removed. A plurality of second backside recesses can be formed in the volumes from which the material of the second sacrificial material layers 242 is removed. Each of the first and second backside recesses can extend substantially parallel to the top surface of the substrate 9. A backside recess can be vertically bounded by a top surface of an underlying insulating layer (132 or 232) and a bottom surface of an overlying insulating layer (132 or 232). In one embodiment, each of the first and second backside recesses can have a uniform height throughout.

In one embodiment, a sidewall surface of each pedestal channel portion 11 can be physically exposed at each bottommost first backside recess after removal of the first and second sacrificial material layers (142, 242). Further, a top surface of the planar semiconductor material layer 10 can be physically exposed at the bottom of each backside contact trench 79. An annular dielectric spacer (not shown) can be formed around each pedestal channel portion 11 by oxidation of a physically exposed peripheral portion of the pedestal channel portions 11. Further, a semiconductor oxide potion (not shown) can be formed from each physically exposed surface portion of the planar semiconductor material layer 10 concurrently with formation of the annular dielectric spacers.

A backside blocking dielectric layer (not shown) can be optionally deposited in the backside recesses and the backside contact trenches 79 and over the first contact level dielectric layer 280. The backside blocking dielectric layer can be deposited on the physically exposed portions of the outer surfaces of the memory stack structures 55. The backside blocking dielectric layer includes a dielectric material such as a dielectric metal oxide, silicon oxide, or a combination thereof. If employed, the backside blocking dielectric layer can be formed by a conformal deposition process such as atomic layer deposition or chemical vapor deposition. The thickness of the backside blocking dielectric layer can be in a range from 1 nm to 60 nm, although lesser and greater thicknesses can also be employed.

At least one conductive material can be deposited in the plurality of backside recesses, on the sidewalls of the backside contact trench 79, and over the first contact level dielectric layer 280. The at least one conductive material can include at least one metallic material, i.e., an electrically conductive material that includes at least one metallic element.

A plurality of first electrically conductive layers 146 can be formed in the plurality of first backside recesses, a plurality of second electrically conductive layers 246 can be formed in the plurality of second backside recesses, and a continuous metallic material layer (not shown) can be formed on the sidewalls of each backside contact trench 79 and over the first contact level dielectric layer 280. Thus, the first and second sacrificial material layers (142, 242) can be replaced with the first and second conductive material layers (146, 246), respectively. Specifically, each first sacrificial material layer 142 can be replaced with an optional portion of the backside blocking dielectric layer and a first electrically conductive layer 146, and each second sacrificial material layer 242 can be replaced with an optional portion of the backside blocking dielectric layer and a second electrically conductive layer 246. A backside cavity is present in the portion of each backside contact trench 79 that is not filled with the continuous metallic material layer.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the backside recesses include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the backside recesses can be a combination of titanium nitride layer and a tungsten fill material. In one embodiment, the metallic material can be deposited by chemical vapor deposition or atomic layer deposition.

Residual conductive material can be removed from inside the backside contact trenches 79. Specifically, the deposited metallic material of the continuous metallic material layer can be etched back from the sidewalls of each backside contact trench 79 and from above the first contact level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Each electrically conductive layer (146, 246) can be a conductive line structure.

A subset of the second electrically conductive layers 246 located at the levels of the drain-select-level shallow trench isolation structures 72 constitutes drain select gate electrodes. A subset of the first electrically conductive layers 146 located at each level of the annular dielectric spacers (not shown) constitutes source select gate electrodes. A subset of the electrically conductive layer (146, 246) located between the drain select gate electrodes and the source select gate electrodes can function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) can comprise word lines for the memory elements. The semiconductor devices in the underlying peripheral device region 700 can comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246). Each of the at least one an alternating stack (132, 146, 232, 246) includes alternating layers of respective insulating layers (132 or 232) and respective electrically conductive layers (146 or 246). The at least one alternating stack (132, 146, 232, 246) comprises staircase regions that include terraces in which each underlying electrically conductive layer (146, 246) extends farther along the first horizontal direction hd1 than any overlying electrically conductive layer (146, 246) in the memory-level assembly.

Dopants of a second conductivity type, which is the opposite of the first conductivity type of the planar semiconductor material layer 10, can be implanted into a surface portion of the planar semiconductor material layer 10 to form a source region 61 underneath the bottom surface of each backside contact trench 79. An insulating spacer 74 including a dielectric material can be formed at the periphery of each backside contact trench 79, for example, by deposition of a conformal insulating material (such as silicon oxide) and a subsequent anisotropic etch. The first contact level dielectric layer 280 may be thinned due to a collateral etch during the anisotropic etch that removes the vertical portions of horizontal portions of the deposited conformal insulating material.

A conformal insulating material layer can be deposited in the backside contact trenches 79, and can be anisotropically etched to form insulating spacers 74. The insulating spacers 74 include an insulating material such as silicon oxide, silicon nitride, and/or a dielectric metal oxide. A cavity laterally extending along the first horizontal direction hd1 is present within each insulating spacer 74.

A backside contact via structure can be formed in the remaining volume of each backside contact trench 79, for example, by deposition of at least one conductive material and removal of excess portions of the deposited at least one conductive material from above a horizontal plane including the top surface of the first contact level dielectric layer 280 by a planarization process such as chemical mechanical planarization or a recess etch. The backside contact via structures are electrically insulated in all lateral directions, and is laterally elongated along the first horizontal direction hd1. As such, the backside contact via structures are herein referred to as laterally-elongated contact via structures 76. As used herein, a structure is "laterally elongated" if the maximum lateral dimension of the structure along a first horizontal direction is greater than the maximum lateral dimension of the structure along a second horizontal direction that is perpendicular to the first horizontal direction at least by a factor of 5.

Optionally, each laterally-elongated contact via structure 76 may include multiple backside contact via portions such as a lower backside contact via portion and an upper backside contact via portion. In an illustrative example, the lower backside contact via portion can include a doped semiconductor material (such as doped polysilicon), and can be formed by depositing the doped semiconductor material layer to fill the backside contact trenches 79 and removing the deposited doped semiconductor material from upper portions of the backside contact trenches 79. The upper backside contact via portion can include at least one metallic material (such as a combination of a TiN liner and a W fill material), and can be formed by depositing the at least one metallic material above the lower backside contact via portions, and removing an excess portion of the at least one metallic material from above the horizontal plane including the top surface of the first contact level dielectric layer 280. The first contact level dielectric layer 280 can be thinned and removed during a latter part of the planarization process, which may employ chemical mechanical planarization (CMP), a recess etch, or a combination thereof. Each laterally-elongated contact via structure 76 can be formed through the memory-level assembly and on a respective source region 61. The top surface of each laterally-elongated contact via structure 76 can located above a horizontal plane including the top surfaces of the memory stack structures 55.

A second contact level dielectric layer 282 can be optionally formed over the first contact level dielectric layer 280. The second contact level dielectric layer 282 includes a dielectric material such as silicon oxide or silicon nitride. The thickness of the second contact level dielectric layer 282 can be in a range from 30 nm to 300 nm, although lesser and greater thicknesses can also be employed.

Drain contact via structures 88 contacting the drain regions 63 can extend through the contact level dielectric layers (280, 282) and the second insulating cap layer 270 in the memory array region 100. A source connection via structure 91 can extend through the contact level dielectric layers (280, 282) to provide electrical connection to the laterally-elongated contact via structures 76.

Referring to FIGS. 15A and 15B, various contact via structures can be formed through the contact level dielectric layers (280, 282) and the retro-stepped dielectric material portions (165, 265). For example, word line contact via structures 86 can be formed in the word line contact region 200. A subset of the word line contact via structures 86 contacting the second electrically conductive layers 246 extends through the second-tier retro-stepped dielectric material portion 265 in the word line contact region 200, and does not extend through the first-tier retro-stepped dielectric material portion 165. Another subset of the word line contact via structures 86 contacting the first electrically conductive layers 146 extends through the second-tier retro-stepped dielectric material portion 265 and through the first-tier retro-stepped dielectric material portion 165 in the word line contact region 200.

Further, through-memory-level via cavities can be formed through the memory-level assembly outside the areas of the memory array region 100 and the word line contact region 200. In this case, the through-memory-level via cavities can be formed through the contact level dielectric layers (280, 282) and the retro-stepped dielectric material portions (165, 265), and into the at least one lower level dielectric layer 760. A top surface of a respective one of the lower level metal interconnect structures 780 can be physically exposed at the bottom of each through-memory-level via cavities. The through-memory-level openings can be formed, for example, by applying a photoresist layer (not shown) over the first contact level dielectric layer 280, lithographically patterning the photoresist layer to form openings, and transferring the pattern in the photoresist layer through the contact level dielectric layers (280, 282) and the retro-stepped dielectric material portions (165, 265), and into the at least one lower level dielectric layer 760 by an anisotropic etch. The photoresist layer can be removed, for example, by ashing. At least one conductive material can be deposited in the through-memory-level via cavities to form through-memory-level via structures 488. The through-memory-level via structures 488 can provide vertical electrical connection through the memory level structures.

Referring to FIG. 16, a line level dielectric layer 284 can be formed over the contact level dielectric layers (280, 282). Various line level metal interconnect structures (96, 98) can be formed in the line level dielectric layer 284. The line level metal interconnect structures (96, 98) can include upper level metal interconnect structures 96 that are electrically coupled to (e.g., formed on or in physical contact with) respective pairs of a word line contact via structure 86 and a through-memory-level via structure 488, and bit lines 98 that extend along the second horizontal direction hd2 and perpendicular to the first horizontal direction hd1. Additional line level metal interconnect structures that are not expressly illustrated can include source connection line structures that contact the source connection via structures 91 to provide electrically conductive paths for biasing the source regions 61 through the laterally-elongated contact via structures 76, and drain side select gate electrode contact via structures are located in the word line contact regions 200. The through-memory-level via structures 488 can be conductive structures that provide electrically conductive paths between the device contact via structure 782 and metal lines (such as the upper level metal interconnect structures 96) that are located above a horizontal plane including a top surface of the three-dimensional memory array.

FIGS. 17A and 17B illustrate a region including a respective device contact via structure 782 including a second exemplary barrier stack 1760 in which the silicon layer 1734 is replaced with a boron layer 1736. The structures of FIGS. 17A and 17B can be derived from the first exemplary structure of FIG. 2C by replacing the first exemplary barrier stack 1730 with a respective second exemplary barrier stack 1760 at the processing steps of FIG. 3A or FIG. 4A. FIG. 17A illustrates a device contact via structure 782 employing a first configuration of the second exemplary barrier stack 1760 including two boron layers 1736 according to an embodiment of the present disclosure. FIG. 17B illustrates a device contact via structure 782 employing a second configuration of the second exemplary barrier stack 1760 including five boron layers 1736 according to an embodiment of the present disclosure. Any number of boron layers 1736 (e.g., one or more layers) may be used.

Referring to FIG. 17A, a device contact via structure 782 can be formed within each contact via cavity 1709 of FIG. 2C by deposition of metallic materials in the contact via cavities 1709. The barrier stack 1760 includes at least two metal nitride layers 1732 comprising a conductive nitride of at least one transition metal element and at least one non-metal element layer including boron, e.g., at least one boron layer 1736. Each of the at least non-metal element layer can be formed between a pair of metal nitride layers 1732. In one embodiment, each of the at least one non-metal element layers can have a thickness in a range from 0.1 nm to 2.0 nm, and the barrier stack 1760 can have a total thickness in a range from 3.0 nm to 25 nm.

Each barrier stack 1760, as deposited and after incorporation into a respective device contact via structure 782, includes at least one boron layer 1736, which in one embodiment can consisting essentially of boron right after deposition. The boron layer 1736 can be nitrided by exposure to a nitrogen ambient at an elevated temperature and/or by nitrogen diffusion during deposition of the overlying metal nitride layer 1732. Alternatively, nitrogen is provided to the boron layer 1736 during subsequent annealing and/or high temperature deposition steps, as in the first embodiment.

Each of the at least two metal nitride layers 1732 includes a conductive metal nitride material, and can consist essentially of the conductive metal nitride material described with respect to the first embodiment above. Each of the at least one boron layer 1736 can be deposited by a conformal deposition process such as atomic layer deposition or chemical vapor deposition. The thickness of each boron layer 1736 can be in a range from 0.1 nm to 2.0 nm. Thus, each boron layer 1736 may be less than, equal to, or more than, the thickness of one monolayer of boron. The thickness of the boron layer 1736 is calculated as the product of the thickness of one monolayer of boron and the ratio of the total number of boron atoms to the number of boron atoms needed to form one monolayer of boron.

In one embodiment, each boron layer 1736 can be deposited by an atomic layer deposition process in which the exemplary structure is placed in an atomic layer deposition process chamber, and a of boron-containing reactant gas (such as $B_2H_6$ or $BCl_3$) is flowed into the process chamber at a low pressure (such as from 0.1 mTorr to 100 mTorr) to induce adsorption of boron atoms on the physically exposed surfaces of an underlying metal nitride layer 1732. This process can be self-limiting under suitable process conditions, and a monolayer of boron can be formed on the top surface of the underlying metal nitride layer 1732 to form a boron layer 1736. The next metal nitride layer 1732 can be deposited on the boron layer 1736. Additional of boron layer(s) 1736 and additional metal nitride layer(s) 1732 can be deposited as needed. The barrier stack 1760 can have a total thickness in a range from 3.0 nm to 25 nm.

Subsequently, a conductive fill material is deposited in unfilled volumes of the contact via cavities 1709. The conductive fill material can include an elemental metal such as tungsten, cobalt, tantalum, titanium, copper, or aluminum, or an intermetallic alloy of at least two elemental metals. The conductive fill material can be deposited by a conformal deposition process such as chemical vapor deposition or atomic layer deposition, or by electroplating or electroless plating that allows superfill without formation of seams. The duration of the deposition process for depositing the conductive fill material can be selected such that the entire volume of each contact via cavity 1709 is filled within a combination of the barrier stack 1760 and the conductive fill material.

Subsequently, device contact via structures 782 can be formed by removing excess portions of the conductive fill material and the barrier stack 1760 from above the horizontal plane including the top surface of the planarization dielectric layer 764. A planarization process can be employed to remove the excess portions of the barrier stack 1760 and the deposited conductive fill material. The planarization process can employ chemical mechanical planarization (CMP) and/or a recess etch. Each contact via cavity 1709 is filled with a remaining portion of the barrier stack 1760 and a remaining portion of the conductive fill material (which is herein referred to as a conductive fill material portion 1740). Each adjoining pair of a barrier stack 1760 and a conductive fill material portion 1740 constitutes a device contact via structure 782.

The configuration of the second exemplary barrier stack 1760 of FIG. 17A includes three metal nitride layers 1732 and two boron layers 1736. FIG. 17B illustrates another configuration for the second exemplary barrier stack 1760 that includes six metal nitride layers 1732 and five of boron layers 1736. Generally, n number of boron layers 1736 and (n+1) number of metal nitride layers 1732 can be employed to form the barrier stack 1760. The range of the number n can be from (and including) 1 to (and including) 10. In some embodiment, the range of the number n can be from (and including) 1 to (and including) 4.

Subsequently, various processing steps can be performed to form additional components of the at least one lower level dielectric layer 760 and the lower level metal interconnect structures 78, and additional components of the underlying peripheral device region 700 of the exemplary structure illustrated in FIG. 1. For example, the processing steps of FIGS. 5-16 can be performed.

After the activation anneal and/or high temperature deposition process, each of the at least one nitrogen-containing material layer (i.e., each boron-nitrogen material layer 1739) is located between, and contacts, a respective pair of doped metal nitride layers 1743 among the at least two doped metal nitride layers 1743 or a respective pair of undoped metal nitride layers 1742 if the metal nitride layers are not doped by diffusion. Each barrier stack 1760 includes a horizontal portion located between the metal-semiconductor alloy portion 744 and the conductive fill material portion 1740, and a vertical portion that laterally surrounds the conductive fill material portion 1740 (in a cylindrical configuration) and is laterally surrounded by at least one dielectric material layer (such as the planarization dielectric layer 764).

In one embodiment, each of the at least one nitrogen-containing material layer (i.e., each boron-nitrogen material layer 1739) can have a thickness in a range from 0.1 nm to 2.0 nm, and the barrier stack 1760 can have a total thickness in a range from 3.0 nm to 25 nm. In one embodiment, each of the at least one nitrogen-containing material layer (i.e., each boron-nitrogen material layer 1739) may be a continuous material layer having a thickness of at least 0.4 nm. In one embodiment, at least one of the at least one nitrogen-containing material layer (i.e., each boron-nitrogen material layer 1739) may have a thickness that is less than the thickness of a monolayer of boron (e.g., 0.2 nm or less). The thickness of each boron-nitrogen material layer 1739 is calculated as the product of the thickness of one monolayer of the boron-nitrogen material and the ratio of the total number of boron atoms and nitrogen atoms within the respective boron-nitrogen material layer to the number of boron atoms and nitrogen atoms within one monolayer of the boron-nitrogen material. Thus, the thickness of each boron-nitrogen material layer 1739 is independent of the area of the respective boron-nitrogen material layer 1739. In one embodiment, an atomic ratio of boron to nitrogen atoms in each nitrogen-containing material layer (i.e., each boron-nitrogen material layer 1739) can be greater than 1.0. Alternatively, the boron-nitrogen material layer 1739 may be a stoichiometric boron nitride layer.

In one embodiment, the doped metal nitride layers 1743 can include a conductive nitride of the at least one transition metal element (such as titanium, tantalum, and tungsten). The metal-semiconductor alloy portion 744 includes an alloy of the semiconductor material of the doped semiconductor material portion 742 and a transition metal element that may be the same as, or may be different from, the at least one transition metal element of the doped metal nitride layers 1743. The atomic concentration of boron in the doped metal nitride layers 1743 may be in a range from 0.1% to 25%, such as from 1% to 10%, although lesser and greater atomic concentrations can also be employed. Alternatively, one or more of the metal nitride layers may be an undoped metal nitride layer 1732.

The number of doped metal nitride layers 1743 can be the same as the number of metal nitride layers 1732 prior to the activation anneal. FIG. 18A illustrates a region including a device contact via structure 782 employing the first configuration of the second exemplary barrier stack 1760 after a high temperature anneal process (such as the activation anneal process). FIG. 18B illustrates a region including a device contact via structure 782 employing the second configuration of the second exemplary barrier stack 1760 after a high temperature anneal process (such as the activation anneal process). In the second configuration, the barrier stack 1760 includes at least three doped metal nitride layers 1743 and at least two nitrogen-containing material layers (i.e., the boron-nitrogen material layer 1739). Each of the at least two nitrogen-containing material layer is located between, and contacts, a respective pair of doped metal nitride layers 1743 among the at least three doped metal nitride layers 1743.

FIG. 19 illustrates secondary ion mass spectroscopy (SIMS) boron profiles of a sample including a boron-nitrogen layer containing barrier stack 1760 and a two samples including a comparative exemplary metallic barrier layer that consists of a single titanium nitride layer having the same thickness (i.e., 20 nm) before and after an anneal process. All samples included a doped semiconductor material portion 742 including boron as a primary dopant, and a metal-semiconductor alloy portion 744 including titanium silicide. All samples included a tungsten portion as the conductive fill material portion 1740. The first and second curves 410 and 420, respectively, correspond to the before anneal and after anneal profiles, respectively, of atomic concentration of boron (within the depth resolution limit of the SIMS instrument) in the sample including the comparative exemplary metallic barrier layer (i.e., a 20 nm thick titanium nitride). A third curve 430 corresponds to the profile of atomic concentration of boron (within the depth resolution limit of the SIMS instrument) in the sample including of the a boron-nitrogen layer containing barrier stack 1760.

As shown by the first curve 410 and the second curve 420, the concentration of boron in the titanium silicide region 744 at the interface with the doped semiconductor material portion 742 decreases after the anneal of the comparative sample. However, as shown by the third curve 430, the concentration of boron in the titanium silicide region 744 at the interface with the doped semiconductor material portion 742 after the anneal in the embodiment sample is about the same as the concentration in the comparative sample before the anneal shown by curve 410. Thus, the embodiment sample exhibits improved boron retention at the silicide/active region interface after the anneal compared to the comparative sample. As shown by curve 430, the barrier stack 1750 comprises a region having a greater concentration of boron atoms than any region within the doped semiconductor material portion 742 after the thermal treatment.

The various configurations of the exemplary structure of the present disclosure can include a semiconductor structure comprising: a doped semiconductor material portion 742 located in a substrate semiconductor layer 9 of a substrate 8; a metal-semiconductor alloy portion 744 contacting the doped semiconductor material portion 742; a device contact via structure 782 in direct contact with the metal-semiconductor alloy portion 744 and comprising a barrier stack (1730 or 1760) and a conductive fill material portion 1740, wherein the barrier stack (1730 or 1760) includes at least two doped metal nitride layers (1733 or 1743) and at least one nitrogen-containing material layer (1738 or 1739), wherein each of the at least one nitrogen-containing material layer (1738 or 1739) comprises nitrogen and an element selected from silicon and boron and each of the at least two doped metal nitride layers (1738 or 1739) comprises a conductive nitride of at least one transition metal element and is doped with the element selected from silicon and boron; and at least one dielectric material layer 760 overlying the substrate semiconductor layer and laterally surrounding the device contact via structure 782.

In one embodiment, each of the at least one nitrogen-containing material layer (1738 or 1739) is located between, and contacts, a respective pair of doped metal nitride layers (1733 or 1743) among the at least two doped metal nitride layers (1733 or 1743). In one embodiment, the barrier stack (1730 or 1760) includes a horizontal portion located between the metal-semiconductor alloy portion 744 and the conductive fill material portion 1740, and a vertical portion that laterally surrounds the conductive fill material portion 1740 and is laterally surrounded by the at least one dielectric material layer 760.

In one embodiment, each of the at least one nitrogen-containing material layer (1738 or 1739) has a thickness in a range from 0.1 nm to 2.0 nm; and the barrier stack (1730 or 1760) has a total thickness in a range from 3.0 nm to 25 nm. In one embodiment, each of the at least one nitrogen-containing material layer (1738 or 1739) is a continuous material layer having a thickness of at least 0.4 nm. In one embodiment, an atomic ratio of the element selected from silicon and boron to nitrogen atoms in the at least one nitrogen-containing material layer (1738 or 1739) is greater than 1.0.

In one embodiment, the at least one transition metal element comprises at least one element selected from titanium, tantalum, and tungsten, and the metal-semiconductor alloy portion 744 comprises an alloy of a semiconductor material of the doped semiconductor material portion 742 and another transition metal element that is the same as or different from the at least one transition metal element. For example, the metal-semiconductor alloy portion 744 may comprise a transition metal silicide.

In one embodiment, the barrier stack (1730 or 1760) includes at least three doped metal nitride layers (1733 or 1743) and at least two nitrogen-containing material layer (1738 or 1739)s, wherein each of the at least two nitrogen-containing material layer (1738 or 1739) is located between, and contacts, a respective pair of doped metal nitride layers (1733 or 1743) among the at least three doped metal nitride layers (1733 or 1743).

In one embodiment, the element selected from silicon and boron is silicon; and an atomic ratio of the silicon atoms to the nitrogen atoms is greater than 1.0 in each of the at least one nitrogen-containing material layer 1738.

In one embodiment, the element selected from silicon and boron is boron; and an atomic ratio of the boron atoms to the nitrogen atoms is greater than 1.0 in each of the at least one nitrogen-containing material layer 1739.

In one embodiment, the doped semiconductor material portion 742 comprises boron as a primary dopant; and the barrier stack 1760 comprises a region having a greater concentration of boron atoms than any region within the doped semiconductor material portion 742.

In one embodiment, the semiconductor structure can include a lower level metal interconnect structure 780 embedded within the at least one dielectric material layer 760; and a three-dimensional memory array overlying the lower level metal interconnect structure 780 and including an alternating stack of insulating layers (132, 232) and word lines (146, 246), and memory stack structures 55 comprising a vertical semiconductor channel and a memory film vertically extending through the alternating stack. A set of conductive structures (488, 780) including the device conductive via structure 782 provides an electrically conductive path between the doped semiconductor material portion 742 and a metal line 96 located above a horizontal plane including a top surface of the three-dimensional memory array. The device contact via structure comprises a source or drain electrode of a peripheral transistor located below the three-dimensional memory array and the doped semiconductor material portion 742 comprises the source or drain region of the peripheral transistor.

The various structures of the present disclosure can provide lower contact resistance even after a high temperature anneal that is used to activate dopants in the memory stack structures 55 and other devices in the three-dimensional memory array. The various structures of the present disclosure can maintain a high dopant concentration in the doped semiconductor material portions 742 in the substrate semiconductor layer 9 by suppressing outdiffusion of p-type dopants or n-type dopants, or by providing boron as additional p-type dopants to partially, completely, or more than completely compensate the loss of p-type dopants from the doped semiconductor material portions 742 in the substrate semiconductor layer 9.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a semiconductor structure, comprising:
    forming a doped semiconductor material portion;
    forming a metal-semiconductor alloy portion on the doped semiconductor material portion;
    forming a first dielectric material layer over the metal-semiconductor alloy portion;
    forming a via cavity through the first dielectric material layer, wherein a top surface of the metal-semiconductor alloy portion is physically exposed;
    forming a barrier stack in the via cavity, wherein the barrier stack includes at least two metal nitride layers and at least one silicon or boron layer formed between a pair of the at least two metal nitride layers;
    depositing a conductive fill material in a remaining volume of the via cavity; and
    performing a thermal treatment to induce diffusion of materials in the barrier stack to convert the silicon or boron layer to a silicon-nitrogen or a boron-nitrogen layer.

2. The method of claim 1, further comprising converting the at least two metal nitride layers to silicon or boron doped metal nitride layers.

3. The method of claim 1, wherein:
    the doped semiconductor material portion is formed by implanting boron into a substrate semiconductor layer;
    the barrier stack comprises a region having a greater concentration of boron atoms than any region within the doped semiconductor material portion after the thermal treatment; and
    the region having the greater concentration of boron is spaced from an interface between the metal-semiconductor alloy portion and the barrier stack.

4. The method of claim 1, wherein the silicon or boron layer is a silicon layer.

5. The method of claim 1, wherein the silicon or boron layer is a boron layer.

6. The method of claim 1, wherein:
    the silicon or boron layer has a thickness in a range from 0.1 nm to 2.0 nm; and
    the barrier stack has a total thickness in a range from 3.0 nm to 25 nm.

7. The method of claim 1, further comprising:
    forming a device contact via structure by removing portions of the conductive fill material and the barrier stack from above a horizontal plane including a top surface of the first dielectric material layer;
    forming a second dielectric material layer over the first dielectric material layer;
    forming a lower level metal interconnect structure embedded within the second dielectric material layer, wherein the lower level metal interconnect structure is connected to the device contact via structure;
    wherein the device contact via structure comprises a source or drain electrode of a peripheral transistor located below a three-dimensional memory array, and the doped semiconductor material portion comprises a source or drain region of the peripheral transistor.

* * * * *